United States Patent
Noda

(10) Patent No.: US 12,336,316 B2
(45) Date of Patent: Jun. 17, 2025

(54) IMAGING DEVICE

(71) Applicant: Panasonic Intellectual Property Management Co., Ltd., Osaka (JP)

(72) Inventor: Taiji Noda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 593 days.

(21) Appl. No.: 17/811,319

(22) Filed: Jul. 8, 2022

(65) Prior Publication Data

US 2022/0344394 A1    Oct. 27, 2022

Related U.S. Application Data

(63) Continuation of application No. PCT/JP2020/040481, filed on Oct. 28, 2020.

(30) Foreign Application Priority Data

Jan. 30, 2020  (JP) ................................ 2020-013415
Sep. 24, 2020  (JP) ................................ 2020-160031

(51) Int. Cl.
 *H10D 84/83*  (2025.01)
 *H10F 39/00*  (2025.01)

(52) U.S. Cl.
 CPC ..... *H10F 39/80373* (2025.01); *H10F 39/809* (2025.01)

(58) Field of Classification Search
 None
 See application file for complete search history.

(56) References Cited

U.S. PATENT DOCUMENTS

2009/0225209 A1*  9/2009  Arakawa ............ H10F 39/8057
                                                     438/73
2009/0278209 A1   11/2009  Noda
(Continued)

FOREIGN PATENT DOCUMENTS

JP   2009-272423   11/2009
JP   2010-056515    3/2010
(Continued)

OTHER PUBLICATIONS

International Search Report of PCT application No. PCT/JP2020/040481 dated Feb. 2, 2021.

*Primary Examiner* — Bilkis Jahan
(74) *Attorney, Agent, or Firm* — Rimon P.C.

(57) ABSTRACT

An imaging device includes a pixel region including an amplifying transistor that includes a first gate and that outputs a signal voltage corresponding to an amount of signal charge, a first peripheral region including at least one first peripheral transistor including a second gate, the first peripheral region being located outside the pixel region, and a semiconductor substrate provided with the amplifying transistor and the at least one first peripheral transistor. A gate length of the second gate is shorter than a gate length of the first gate. When at least one type of impurity that contributes to suppression of transient enhanced diffusion of a conductive impurity is defined as a first specific species, the at least one first peripheral transistor includes a first specific layer located in the semiconductor substrate, the first specific layer containing a conductive impurity and the first specific species.

20 Claims, 24 Drawing Sheets

(56) References Cited

U.S. PATENT DOCUMENTS

| | | | | |
|---|---|---|---|---|
| 2010/0026866 A1* | 2/2010 | Matsumoto | ........... | H10F 39/011 |
| | | | | 348/308 |
| 2011/0127408 A1* | 6/2011 | Yanagita | ............... | H10F 39/807 |
| | | | | 257/292 |
| 2013/0076934 A1* | 3/2013 | Maeda | ................... | H10F 39/802 |
| | | | | 348/222.1 |
| 2013/0181268 A1 | 7/2013 | Hirota | | |
| 2015/0076484 A1 | 3/2015 | Moriyama et al. | | |
| 2015/0090998 A1* | 4/2015 | Hirase | ................... | H10F 39/182 |
| | | | | 257/40 |
| 2015/0123180 A1* | 5/2015 | Sato | ...................... | H01L 21/266 |
| | | | | 257/292 |
| 2015/0189211 A1* | 7/2015 | Kokumai | ................ | H10F 39/18 |
| | | | | 348/301 |
| 2015/0364522 A1 | 12/2015 | Itahashi et al. | | |
| 2019/0027524 A1* | 1/2019 | Sato | .................... | H10F 39/8037 |
| 2019/0238767 A1 | 8/2019 | Satou et al. | | |

FOREIGN PATENT DOCUMENTS

| | | |
|---|---|---|
| JP | 2013-020998 | 1/2013 |
| JP | 2013-149741 | 8/2013 |
| JP | 2015-126385 A | 7/2015 |
| JP | 2016-001709 | 1/2016 |
| JP | 2019-024075 | 2/2019 |
| WO | 2014/002390 | 1/2014 |
| WO | 2019/009023 | 1/2019 |

* cited by examiner

IMAGING DEVICE

BACKGROUND

1. Technical Field

The present disclosure relates to an imaging device.

2. Description of the Related Art

Examples of image sensors include CCD (charge-coupled device) image sensors and CMOS (complementary metal-oxide semiconductor) image sensors.

An image sensor according to one example has a photodiode provided in a semiconductor substrate.

An image sensor according to another example has a photoelectric conversion layer provided above a semiconductor substrate. An imaging device having such a structure is sometimes called "stacked imaging device".

A stacked imaging device according to one specific example produces signal charge through photoelectric conversion. The signal charge thus produced is accumulated in a charge accumulation node. A signal corresponding to the amount of charge accumulated in the charge accumulation node is read out via a CCD or CMOS circuit formed in a semiconductor substrate.

Japanese Unexamined Patent Application Publication No. 2019-24075 discloses an imaging device. The imaging device of Japanese Unexamined Patent Application Publication No. 2019-24075 includes a pixel region and a peripheral region located outside the pixel region.

SUMMARY

In one general aspect, the techniques disclosed here feature an imaging device including a pixel region including an amplifying transistor that includes a first gate and that outputs a signal voltage corresponding to an amount of signal charge, a first peripheral region including at least one first peripheral transistor including a second gate, the first peripheral region being located outside the pixel region, and a semiconductor substrate provided with the amplifying transistor and the at least one first peripheral transistor. A gate length of the second gate of the at least one first peripheral transistor is shorter than a gate length of the first gate of the amplifying transistor. When at least one type of impurity that contributes to suppression of transient enhanced diffusion of a conductive impurity is defined as a first specific species, the at least one first peripheral transistor includes a first specific layer located in the semiconductor substrate, the first specific layer containing a conductive impurity and the first specific species.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
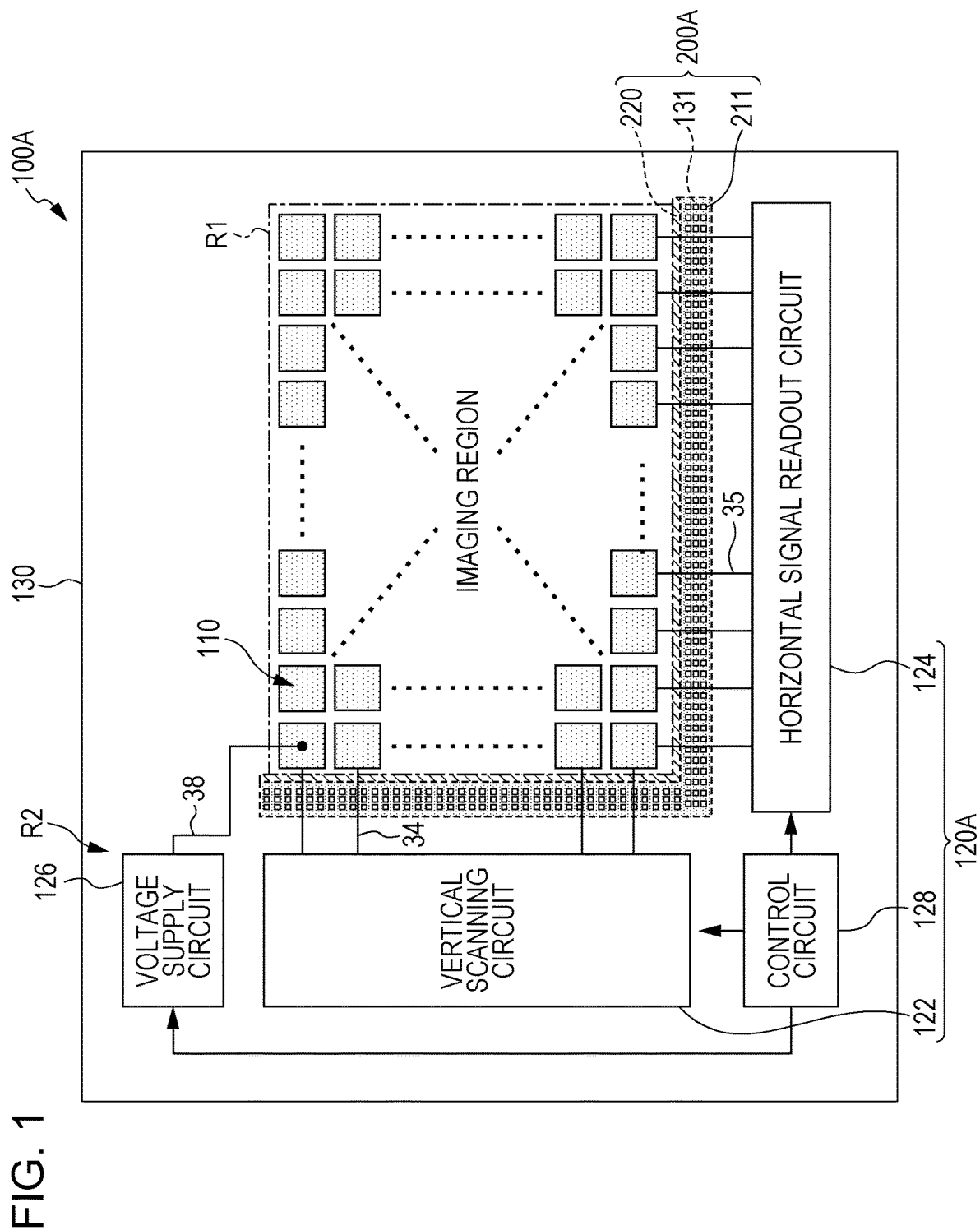
FIG. 1 is a diagram schematically showing an exemplary configuration of an imaging device.

Japanese Unexamined Patent Application Publication No. 2019-24075 fails to go into improving the performance of an imaging device in consideration of the presence of a transistor in a peripheral region.

The techniques disclosed here are suitable to improving the performance of an imaging device in consideration of the presence of a first peripheral transistor in a first peripheral region.

Brief Overview of Aspects of the Present Disclosure

An imaging device according to a first aspect of the present disclosure includes a pixel region including an amplifying transistor that includes a first gate and that outputs a signal voltage corresponding to an amount of signal charge, a first peripheral region including at least one first peripheral transistor including a second gate, the first peripheral region being located outside the pixel region, and a semiconductor substrate provided with the amplifying transistor and the at least one first peripheral transistor. A gate length of the second gate of the at least one first peripheral transistor is shorter than a gate length of the first gate of the amplifying transistor. When at least one type of impurity that contributes to suppression of transient enhanced diffusion of a conductive impurity is defined as a first specific species, the at least one first peripheral transistor includes a first specific layer located in the semiconductor substrate, the first specific layer containing a conductive impurity and the first specific species.

The technique according to the first aspect is suitable to improving the performance of the imaging device in consideration of the presence of the first peripheral transistor in the first peripheral region.

A second aspect of the present disclosure may be directed, for example, to the imaging device according to the first aspect, wherein the amplifying transistor includes a first gate insulator film located between the semiconductor substrate and the first gate, the at least one first peripheral transistor includes a second gate insulator film located between the semiconductor substrate and the second gate, and the second gate insulator film is thinner than the first gate insulator film.

A third aspect of the present disclosure may be directed, for example, to the imaging device according to the first or second aspect, wherein the first specific species contains at least one selected from the group consisting of carbon, nitrogen, and fluorine.

The specific species of the third aspect may inhibit transient enhanced diffusion of the conductive impurity.

A fourth aspect of the present disclosure may be directed, for example, to the imaging device according to any one of the first to third aspects, wherein the first specific species contains at least one selected from the group consisting of germanium, silicon, and argon.

The specific species of the fourth aspect may include a trace of pre-amorphization that may enhance the diffusion-suppressing effect on the conductive impurity by an impurity exemplified by carbon.

A fifth aspect of the present disclosure may be directed, for example, to the imaging device according to any one of the first to fourth aspects, wherein the at least one first peripheral transistor includes a first source, a first drain, and a first extension diffusion layer, the first extension diffusion layer is adjacent to the first source or the first drain and shallower than the first source and the first drain, and the first extension diffusion layer includes the first specific layer.

The configuration of the fifth aspect is an example of a configuration of the imaging device.

A sixth aspect of the present disclosure may be directed, for example, to the imaging device according to any one of the first to fifth aspects, wherein the at least one first peripheral transistor includes a first source, a first drain, and a first pocket diffusion layer that is adjacent to the first source or the first drain, and the first pocket diffusion layer includes the first specific layer.

The configuration of the sixth aspect is an example of a configuration of the imaging device.

A seventh aspect of the present disclosure may be directed, for example, to the imaging device according to any one of the first to sixth aspects, wherein the pixel region includes a charge accumulation region in which charge generated by photoelectric conversion is accumulated, and a ratio of a concentration of the first specific species in the first specific layer to a concentration of the first specific species in the charge accumulation region is higher than or equal to $1 \times 10^5$.

Only a high-performance imaging device can have the feature of the seventh aspect.

An eighth aspect of the present disclosure may be directed, for example, to the imaging device according to any one of the first to seventh aspects, wherein a ratio of a concentration of the first specific species in the first specific layer to a concentration of the first specific species under the first gate of the amplifying transistor is higher than or equal to $1 \times 10^5$.

Only a high-performance imaging device can have the feature of the eighth aspect.

A ninth aspect of the present disclosure may be directed, for example, to the imaging device according to any one of the first to eighth aspects, wherein the at least one first peripheral transistor includes an end-of-range defect, at least part of the first specific layer is located above the end-of-range defect and overlaps the end-of-range defect in plan view.

The EOR (end-of-range) defect of the ninth aspect may be a trace of pre-amorphization that may enhance the diffusion-suppressing effect on the conductive impurity by an impurity exemplified by carbon.

A tenth aspect of the present disclosure may be directed, for example, to the imaging device according to any one of the first to ninth aspects, wherein the at least one first peripheral transistor includes a segregated portion in which the first specific species is segregated in a direction parallel with a depth of the semiconductor substrate, and at least part of the first specific layer is located above the segregated portion and overlaps the segregated portion in plan view.

The segregated portion of the tenth aspect may be a trace of pre-amorphization that may enhance the diffusion-suppressing effect on the conductive impurity by an impurity exemplified by carbon.

An eleventh aspect of the present disclosure may be directed, for example, to the imaging device according to the tenth aspect, wherein the pixel region includes a charge accumulation region in which charge generated by photoelectric conversion is accumulated, and the segregated portion is shallower than the charge accumulation region.

The configuration of the eleventh aspect is an example of a configuration of the imaging device.

A twelfth aspect of the present disclosure may be directed, for example, to the imaging device according to any one of the first to eleventh aspects, wherein the at least one first peripheral transistor comprises two first peripheral transistors, the first peripheral region includes a shallow trench isolation structure, the shallow trench isolation structure provides device isolation of the two first peripheral transistors from each other, the shallow trench isolation structure has a trench, and a range of distribution of the first specific species in the first specific layer of at least one of the two first peripheral transistors is shallower than a bottom of the trench.

The configuration of the twelfth aspect is an example of a configuration of the imaging device.

A thirteenth aspect of the present disclosure may be directed, for example, to the imaging device according to any one of the first to twelfth aspects, further including:

an analog processing circuit;
a digital processing circuit; and
a second peripheral region located between the pixel region and the first peripheral region in plan view, wherein the second peripheral region includes a second peripheral transistor including a third gate, the second peripheral transistor being included in the analog processing circuit, the at least one first peripheral transistor is included in the digital processing circuit, and a gate length of the third gate of the second peripheral transistor is longer than the gate length of the second gate of the at least one first peripheral transistor and shorter than the gate length of the first gate of the amplifying transistor.

The configuration of the thirteenth aspect is an example of a configuration of the imaging device.

A fourteenth aspect of the present disclosure may be directed, for example, to the imaging device according to the thirteenth aspect, wherein the at least one first peripheral transistor includes a first source, a first drain, and a first extension diffusion layer, the first extension diffusion layer is adjacent to the first source or the first drain and shallower than the first source and the first drain, the second peripheral transistor includes a second source, a second drain, and a second extension diffusion layer, the second extension diffusion layer is adjacent to the second source or the second drain and shallower than the second source and the second drain, a concentration of a conductive impurity in the second extension diffusion layer is lower than a concentration of a conductive impurity in the first extension diffusion layer, and the second extension diffusion layer is deeper than the first extension diffusion layer.

The configuration of the fourteenth aspect is an example of a configuration of the second peripheral transistor.

A fifteenth aspect of the present disclosure may be directed, for example, to the imaging device according to the thirteenth aspect, wherein the second peripheral transistor includes a second specific layer located in the semiconductor substrate, the second specific layer containing a conductive impurity, and a concentration of the first specific species in the first specific layer is higher than a concentration of the first specific species in the second specific layer.

The configuration of the fifteenth aspect is an example of a configuration of the imaging device.

A sixteenth aspect of the present disclosure may be directed, for example, to the imaging device according to the thirteenth or fourteenth aspect, wherein the second peripheral transistor includes a second specific layer located in the semiconductor substrate, the second specific layer containing a conductive impurity, and a concentration of carbon in the second specific layer is higher than a concentration of carbon under the first gate of the amplifying transistor.

The configuration of the sixteenth aspect is an example of a configuration of the imaging device.

A seventeenth aspect of the present disclosure may be directed, for example, to the imaging device according to any one of the thirteenth to fifteenth aspects, wherein the second peripheral transistor includes a third gate insulator film located between the semiconductor substrate and the third gate, and the third gate insulator film is thicker than the second gate insulator film and thinner than the first gate insulator film.

The configuration of the seventeenth aspect is an example of a configuration of the imaging device.

An eighteenth aspect of the present disclosure may be directed, for example, to the imaging device according to any one of the thirteenth to sixteenth aspects, wherein an operating voltage of the at least one first peripheral transistor is lower than an operating voltage of the second peripheral transistor, and a threshold voltage of the at least one first peripheral transistor is lower than a threshold voltage of the second peripheral transistor.

A nineteenth aspect of the present disclosure may be directed, for example, to the imaging device according to the thirteenth aspect, wherein the second peripheral transistor includes a second specific layer located in the semiconductor substrate, the second specific layer containing a conductive impurity, the second specific layer contains a second specific species that is at least one type of impurity that contributes suppression of transient enhanced diffusion of the conductive impurity, and the second specific species is different from the first specific species.

A twentieth aspect of the present disclosure may be directed, for example, to the imaging device according to the first aspect, wherein the at least one first peripheral transistor includes a second specific layer located in the semiconductor substrate, the second specific layer contains a second specific species that is at least one type of impurity that contributes suppression of transient enhanced diffusion of the conductive impurity, the second specific species is different from the first specific species, and a peak depth of the first specific species contained in the first specific layer is different from a peak depth of the second specific species contained in the second specific layer.

The at least one first peripheral transistor may include a first source and a first drain. At least one selected from the group consisting of the first source and the first drain may include the first specific layer.

The semiconductor substrate may include a pixel substrate portion. The pixel region may include a photoelectric layer stacked over the pixel substrate portion.

The pixel region may include a photodiode.

A pixel transistor and the at least one first peripheral transistor may be provided in a single semiconductor substrate.

The imaging device disclosed here may include a plurality of the first peripheral transistors. The plurality of first peripheral transistors may include a first direction transistor and a second direction transistor. The first direction transistor may be located in a first direction from the pixel region in plan view. The second direction transistor may be located in a second direction from the pixel region in plan view.

A gate length of the first peripheral transistor may be shorter than a gate length of the second peripheral transistor.

A gate length of the pixel transistor may be longer that the gate length of the second peripheral transistor.

The second peripheral transistor may include a second source, a second drain, and a second extension diffusion layer. The second extension diffusion layer may be adjacent to the second source or the second drain and shallower than the second source and the second drain. The second extension diffusion layer may include the second specific layer.

The second peripheral transistor may include a second source, a second drain, and a second pocket diffusion layer that is adjacent to the second source or the second drain. The second pocket diffusion layer may include the second specific layer.

The second peripheral transistor may include a second source and a second drain. At least one selected from the group consisting of the second source and the second drain may include the second specific layer.

The second peripheral transistor may include a second source, a second drain, and a second extension diffusion layer. The second extension diffusion layer may be adjacent to the second source or the second drain and shallower than the second source and the second drain. The second extension diffusion layer may contain nitrogen.

The second peripheral transistor may be an N-channel transistor. This configuration may bring about improvement in reliability of the imaging device.

The first peripheral transistor may be a load transistor, and the pixel region may be connected to the load transistor via a vertical signal line.

The second gate of the first peripheral transistor may be a high-κ metal gate.

The techniques of the first to seventeenth aspects may be combined as appropriate, provided no contradictory arises.

The following describes embodiments of the present disclosure in detail with reference to the drawings. It should be noted that the embodiments to be described below each illustrate a comprehensive and specific example. The numerical values, shapes, materials, constituent elements, placement and topology of constituent elements, steps, orders of steps, or other features that are shown in the following embodiments are just a few examples and are not intended to limit the present disclosure. The various aspects described herein may be combined with each other, provided no contradiction arises. Further, those of the constituent elements in the following embodiments which are not recited in an independent claim reciting the most superordinate concept are described as optional constituent elements.

In the following description, constituent elements having substantially the same functions are denoted by common reference signs, and a description of such constituent elements may be omitted. Further, for the avoidance of an overly complex drawing, an illustration of some elements may be omitted. Regarding various elements of an imaging device, dimensions, outward appearances, or other features depicted in the drawings may be different from the dimensions and outward appearances of an actual imaging device.

That is, the accompanying drawings are only schematic views for understanding of the present disclosure and do not necessarily rigorously reflect the scale or other features of an actual imaging device.

The term "plan view" herein means a view as seen from a direction perpendicular to a semiconductor substrate, a first substrate portion, a second substrate portion, or a pixel substrate portion. The first substrate portion, the second substrate portion, and the pixel substrate portion will be described later. Terms such as "above", "below", "top", and "bottom" herein are used to designate the mutual arrangement of members, and are not used to limit the attitude of the imaging device during use.

The concept "extension diffusion layer" herein encompasses a so-called LDD (lightly-doped drain) diffusion layer.

Embodiment of Imaging Device

FIG. 1 schematically shows an exemplary configuration of an imaging device according to an embodiment of the present disclosure. An imaging device 100A shown in FIG. 1 has a plurality of pixels 110 arrayed, for example, in a plurality of rows and columns. In the configuration illustrated in FIG. 1, the pixels 110 are arrayed in m rows and n columns and form a pixel region R1 having a substantially rectangular shape. Note here that m and n each independently represent an integer greater than or equal to 1.

As will be mentioned later, in the embodiment of the present disclosure, each of these pixels 110 has a photoelectric conversion structure supported by a semiconductor substrate 130 and a readout circuit formed in the semiconductor substrate 130 and electrically connected to the photoelectric conversion structure. That is, the following describes the embodiment of the present disclosure by taking a so-called "stacked" imaging device as an example. As will be described in detail later with reference to the drawings, each of the plurality of pixels 110 includes an impurity region, provided in the semiconductor substrate 130, that functions as part of a charge accumulation region that temporarily retains signal charge generated by the photoelectric conversion structure. Note, however, that instead of such a photoelectric conversion structure being provided, a photodiode may be provided as a photoelectric converter in the semiconductor substrate.

The imaging device 100A further has a peripheral circuit 120A that drives the plurality of pixels 110. In the example shown in FIG. 1, the peripheral circuit 120A includes a vertical scanning circuit 122, a horizontal signal readout circuit 124, a voltage supply circuit 126, and a control circuit 128. In the embodiment of the present disclosure, some or all of these circuits are formed in the semiconductor substrate 130 as is the case with the readout circuit of each pixel. As schematically shown in FIG. 1, the peripheral circuit 120A is located in a first peripheral region R2 of the semiconductor substrate 130 located outside a pixel region R1 including the plurality of pixels 110.

The imaging device 100A further has a blocking region 200A provided between the pixel region R1 and the first peripheral region R2. As schematically shown in FIG. 1, the blocking region 200A includes an impurity region 131 formed in the semiconductor substrate 130 and a plurality of contact plugs 211 provided over the impurity region 131. The impurity region 131 is typically a p-type diffusion region.

By being provided over the impurity region 131, the plurality of contact plugs 211 are electrically connected to the impurity region 131 of the semiconductor substrate 130. As will be mentioned later, by being connected to a power source (not illustrated in FIG. 1), the plurality of contact plugs 211 are configured such that a predetermined voltage can be supplied to the impurity region 131. That is, during operation of the imaging device 100A, the impurity region 131 is in a state in which a predetermined voltage is applied to the impurity region 131 via the contact plugs 211.

Further, the blocking region 200A has a device isolation 220. The device isolation 220 is a structure formed in the semiconductor substrate 130, for example, by a STI (shallow trench isolation) process. The device isolation 220 has a portion of the semiconductor substrate 130 located at least between those of the plurality of pixels 110 which are located on the outermost periphery of the pixel region R1 and a digital circuit, such as the vertical scanning circuit 122, that operates on a digital clock. In this example, the device isolation 220 is located between pixels located on the outermost periphery of the pixel region R1 and the vertical scanning circuit 122 and between pixels 110 located on the outermost periphery of the pixel region R1 and the horizontal signal readout circuit 124. As will be mentioned later, the device isolation 220 may be provided in the semiconductor substrate 130 in such a way as to surround the pixel region R1 in top view. The device isolation 220 is equivalent to the shallow trench isolation structure in the present disclosure.

In a configuration in which a peripheral circuit including a circuit that operates on a digital clock is formed in a semiconductor substrate provided with an impurity region that temporarily retains signal charge that is obtained by photoelectric conversion, the circuit that operates on a digital clock may become a noise source that generates noise every time an input pulse rises and falls. More specifically, the potential of a signal line through which a digital clock is supplied to a digital circuit typified by a CMOS logic circuit fluctuates according to the digital clock. The fluctuations in potential of the signal line due to the digital clock may become a factor for causing fluctuations in substrate potential and, as a result, generating excess charge in a well inside the semiconductor substrate. If the excess charge attributed to the fluctuations in substrate potential flows into an impurity region in a pixel that retains signal charge, there will be a decline in S/N ratio, causing a deterioration in a resulting image.

On the other hand, in the imaging device 100A shown in FIG. 1, the blocking region 200A, which includes the impurity region 131 configured to be connectable to a power source such as a ground by being provided with the plurality of contact plugs 211, is disposed between the pixel region R1, which includes the plurality of pixels 110, and a digital circuit. During operation of the imaging device 100A, the potential of the impurity region 131 of the blocking region 200A can be fixed by connecting a predetermined voltage source to the plurality of contact plugs 211. For example, the potential of the impurity region 131 of the blocking region 200A may be grounded via the plurality of contact plugs 211. At this point in time, the blocking region 200A functions as a low-impedance path through which excess charge generated inside the semiconductor substrate 130 is discharged. That is, electrostatic coupling between an impurity region in a pixel that retains signal charge and the peripheral circuit 120A can be suppressed. This makes it possible to advantageously reduce dark current whose noise source is a signal line through which a digital clock is supplied. Note, however, that the blocking region 200A is not essential.

Details of the circuits constituting the peripheral circuit 120A are given here. The vertical scanning circuit 122 has connections with a plurality of address signal lines 34. These address signal lines 34 are provided separately in correspondence with each of the rows of pixels 110. Each address signal line 34 is connected to one or more pixels belonging to the corresponding row. The vertical scanning circuit 122 controls the timing of readout of signals from the pixels 110 to the after-mentioned vertical signal lines 35 by applying row selecting signals to the address signal lines 34. The vertical scanning circuit 122 is also called "row scanning circuit". The address signal lines 34 are not the only signal lines that are connected to the vertical scanning circuit 122. Plural types of signal line may be connected to the vertical scanning circuit 122 for each row of pixels 110.

As schematically shown in FIG. 1, the imaging device 100A also has a plurality of vertical signal lines 35. The vertical signal lines 35 are provided separately for each of the columns of pixels 110. Each vertical signal line 35 is connected to one or more pixels belonging to the corresponding column. These vertical signal lines 35 are connected to the horizontal signal readout circuit 124. The horizontal signal readout circuit 124 sequentially outputs signals read out from the pixels 110 to output lines (not illustrated in FIG. 1). The horizontal signal readout circuit 124 is also called "column scanning circuit".

The control circuit 128 exercises overall control of the imaging device 100A by receiving command data, clocks, or other signals that are supplied, for example, from outside the imaging device 100A. The control circuit 128 typically has a timing generator and supplies driving signals to the vertical scanning circuit 122, the horizontal signal readout circuit 124, the after-mentioned voltage supply circuit 126, or other circuits. In FIG. 1, arrows extending from the control circuit 128 schematically express the flow of outputs signals from the control circuit 128. The control circuit 128 may be implemented, for example, by a microcontroller including one or more processors. The functions of the control circuit 128 may be implemented by a combination of a general-purpose circuit and software, or may be implemented by hardware specialized in such processing.

In the embodiment of the present disclosure, the peripheral circuit 120A includes the voltage supply circuit 126, which is electrically connected to each pixel 110 in the pixel region R1. The voltage supply circuit 126 supplies a predetermined voltage to a pixel 110 via a voltage line 38. The voltage supply circuit 126 is not limited to a particular power-supply circuit. The voltage supply circuit 126 may be a circuit that converts a voltage supplied from a power source such as a battery into a predetermined voltage, or may be a circuit that generates a predetermined voltage. The voltage supply circuit 126 may be part of the aforementioned vertical scanning circuit 122. As schematically shown in FIG. 1, these circuits constituting the peripheral circuit 120A are disposed in the first peripheral region R2 outside the pixel region R1.

It should be noted that the number and placement of the pixels 110 are not limited to the illustrated example. For example, the number of pixels 110 that are included in the imaging device 100 may be 1. Although, in this example, the center of each pixel 110 is located at a lattice point of a tetragonal lattice, the plurality of pixels 110 may be placed so that the center of each pixel 110 is located at a lattice point of a triangular lattice, a hexagonal lattice, or other lattices. For example, the pixels 110 may be arrayed one-dimensionally, and in this case, the imaging device 100A may be utilized as a line sensor.

Figure 2:
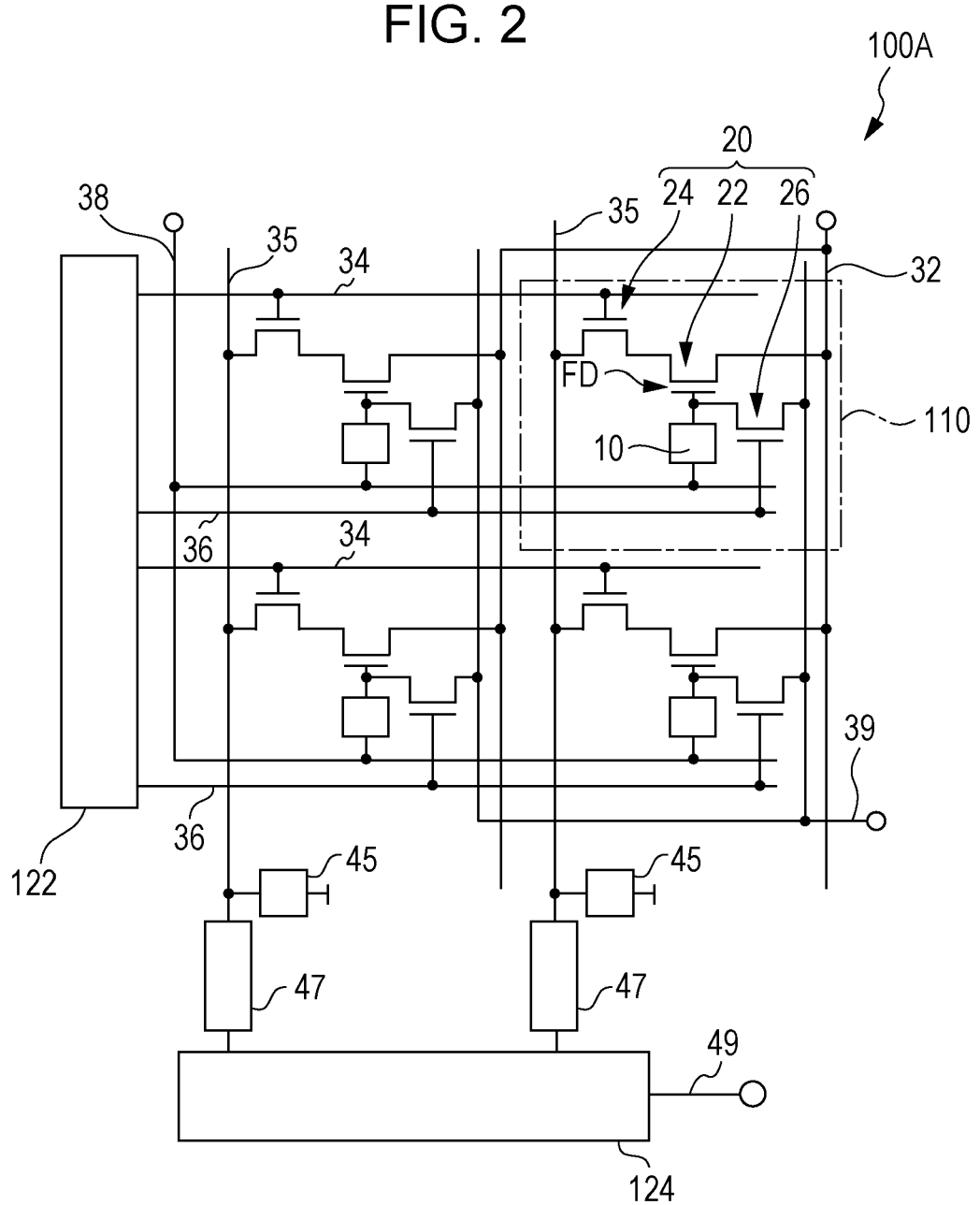
FIG. 2 is a diagram schematically showing an exemplary circuit configuration of the imaging device.

FIG. 2 is a diagram schematically showing an exemplary circuit configuration of the imaging device 100A shown in FIG. 1. For the avoidance of an overly complex drawing, FIG. 2 illustrates only four of the plurality of pixels 110 arrayed in two rows and two columns. Each of these pixels 110 includes a photoelectric conversion structure 10 supported by the semiconductor substrate 130 and a readout circuit 20 electrically connected to the photoelectric conversion structure 10. As will be described in detail with reference to the drawings, the photoelectric conversion structure 10 includes a photoelectric conversion layer disposed above the semiconductor substrate 130.

By having a connection with the voltage line 38, which is connected to the voltage supply circuit 126, the photoelectric conversion structure 10 of each pixel 110 is configured such that a predetermined voltage can be applied via the voltage line 38 during operation of the imaging device 100A. For example, in a case where of positive and negative charge generated by photoelectric conversion, the positive charge is utilized as signal charge, a positive voltage of, for example, approximately 10 V may be applied to the voltage line 38 during operation of the imaging device 100A. The following illustrates a case where a positive hole is utilized as signal charge.

In the configuration illustrated in FIG. 2, the readout circuit 20 includes an amplifying transistor 22, an address transistor 24, and a reset transistor 26. The amplifying transistor 22, the address transistor 24, and the reset transistor 26 are typically field-effect transistors formed in the semiconductor substrate 130. Unless otherwise noted, the following describes an example involving the use of N-channel MOSFETs (metal-oxide semiconductor field-effect transistors) as the transistors.

As schematically shown in FIG. 2, the amplifying transistor 22 has its gate electrically connected to the photoelectric conversion structure 10. A positive hole can for example be accumulated as signal charge in a charge accumulation node FD by applying a predetermined voltage to the photoelectric conversion structure 10 of each pixel 110 from the voltage supply circuit 126 via the voltage line 38 during operation. Note here that the charge accumulation node FD is a node at which the gate of the amplifying transistor 22 is connected to the photoelectric conversion structure 10. The charge accumulation node FD has a function of temporarily retaining charge generated by the photoelectric conversion structure 10. The charge accumulation node FD includes as part thereof an impurity region formed in the semiconductor substrate 130. Reference sign Z of FIG. 3, which will be described later, denotes the impurity region included in the charge accumulation node FD.

As shown in FIG. 2, the amplifying transistor 22 of each pixel 110 has its drain connected to a power-supply wire 32. The power-supply wire 32 supplies a power-supply voltage VDD of, for example, approximately 3.3 V to the amplifying transistor 22 during operation of the imaging device 100A.

On the other hand, the amplifying transistor 22 has its source connected to a vertical signal line 35 via the address transistor 24. By having its drain supplied with the power-supply voltage VDD, the amplifying transistor 22 outputs a signal voltage corresponding to the amount of signal charge accumulated in the charge accumulation node FD.

The address transistor 24, which is connected between the amplifying transistor 22 and the vertical signal line 35, has its gate connected to an address signal line 34. The vertical scanning circuit 122 controls the turning on and turning off of the address transistor 24 by applying a row-selecting signal to the address signal line 34. That is, by controlling a row-selecting signal, the vertical scanning circuit 122 allows an output from the amplifying transistor 22 of a selected pixel 110 to be read out to the corresponding vertical signal line 35. The placement of the address transistor 24 is not limited to the example shown in FIG. 2, and the address transistor 24 may be disposed between the drain of the amplifying transistor 22 and the power-supply wire 32.

Each of the vertical signal lines 35 is connected to a load circuit 45 and a column signal processing circuit 47. The load circuit 45 forms a source-follower circuit with the amplifying transistor 22. The column signal processing circuit 47 executes noise suppression signal processing typified by correlated double sampling, analog-digital conversion, or other processing. The column signal processing circuit 47 is also called "row signal accumulation circuit". The horizontal signal readout circuit 124 sequentially reads out signals from a plurality of the column signal processing circuit 47 to a horizontal common signal line 49. The column signal processing circuit 47 may be part of the horizontal signal readout circuit 124. The load circuit 45 and the column signal processing circuit 47 may be part of the aforementioned peripheral circuit 120A.

In this example, the readout circuit 20 includes the reset transistor 26 in addition to the amplifying transistor 22 and the address transistor 24. A first one of a drain and a source of the reset transistor 26 is part of the charge accumulation node FD, and a second one of the drain and the source is connected to a reset voltage line 39. The first one of the drain and the source of the reset transistor 26 corresponds to a charge accumulation region Z of FIG. 3 and, specifically, to an impurity region 60$n$. By having a connection with a reset voltage supply circuit (not illustrated in FIG. 2), the reset voltage line 39 is made able to supply a predetermined reset voltage Vref to the reset transistor 26 of each pixel 110 during operation of the imaging device 100A. As the reset voltage Vref, a voltage of 0 V or nearly 0 V is selected, for example. As is the case with the aforementioned voltage supply circuit 126, the reset voltage supply circuit needs only be able to apply the reset voltage Vref to the reset voltage line 39, and is not limited in specific configuration to a particular power-supply circuit. The reset voltage supply circuit may be part of the vertical scanning circuit 122. The voltage supply circuit 126 and the reset voltage supply circuit may be independent separate circuits, or may be in the form of a single voltage supply circuit disposed in the imaging device 100A. The reset voltage supply circuit too may be part of the aforementioned peripheral circuit 120A.

The reset transistor 26 has its gate connected to a reset signal line 36. As is the case with the address signal lines 34, these reset signal lines 36 are provided separately for each of the rows of pixels 110 and, in this example, are connected to the vertical scanning circuit 122. As mentioned above, by applying row-selecting signals to the address signal lines 34, the vertical scanning circuit 122 can select, on a row-by-row basis, pixels 110 to which signals are to be read out.

Similarly, by applying reset signals to the gates of the reset transistors 26 via the reset signal lines 36, the vertical scanning circuit 122 can turn on a selected row of reset transistors 26. The turning on of the reset transistors 26 causes the potentials of the charge accumulation nodes FD to be reset.

Pixels and Blocking Region

Figure 3:
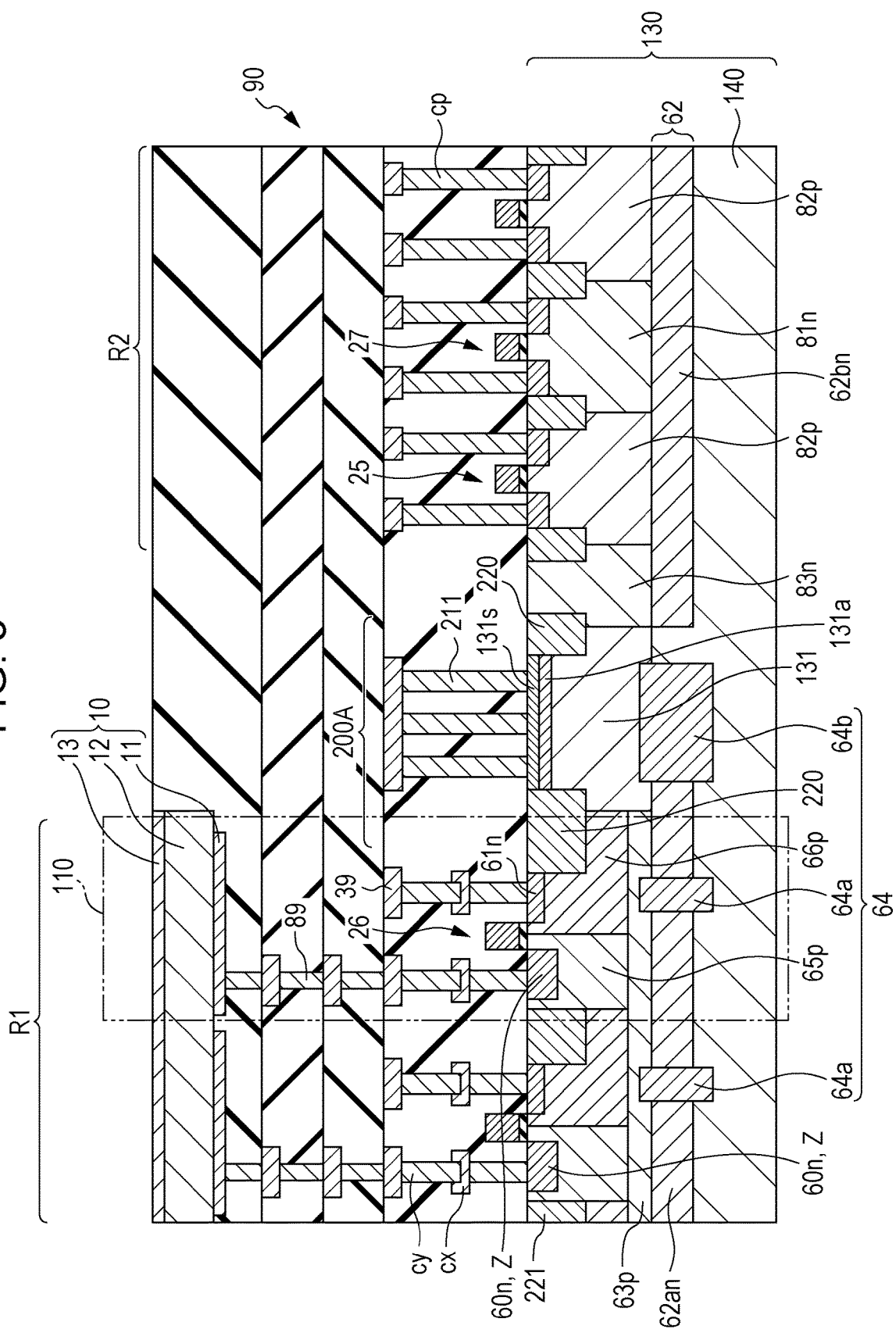
FIG. 3 is a schematic cross-sectional view showing a pixel region, a peripheral region, and a blocking region located between the pixel region and the peripheral region.

FIG. 3 schematically shows a cross-section including the pixel region R1, the first peripheral region R2, and the blocking region 200A. This is a cross-section of two representative ones of the plurality of pixels 110 located near the blocking region 200A.

First, attention is focused on the pixel region R1. The pixel region R1 is provided with a photoelectric conversion layer 12. The photoelectric conversion layer 12 is supported by the semiconductor substrate 130. Over the photoelectric conversion layer 12, a counter electrode 13 having translucency is disposed. As shown in FIG. 3, the photoelectric conversion layer 12 and the counter electrode 13 are each typically successively provided above the semiconductor substrate 130 across the plurality of pixels 110.

The pixels 110 each include a photoelectric conversion structure 10 serving as a unit structure that constitutes the pixel region R1 and having part of the photoelectric conversion layer 12, part of the counter electrode 13, and a pixel electrode 11. The pixel electrode 11 of the photoelectric conversion structure 10 is located between the photoelectric conversion layer 12 and the semiconductor substrate 130, and is formed from metal such as aluminum or copper, a metal nitride, polysilicon given electrical conductivity by being doped with an impurity, or other substances. As schematically shown in FIG. 3, the pixel electrode 11 of each pixel 110 is electrically separated from the pixel electrode 11 of another adjacent pixel by spatial separation of one pixel from another.

The photoelectric conversion layer 12 of the photoelectric conversion structure 10 is formed from an organic material or an inorganic material such as amorphous silicon.

The photoelectric conversion layer 12 generates positive and negative charge through photoelectric conversion upon receiving incident light via the counter electrode 13. That is, the photoelectric conversion structure 10 has a function of converting light into charge. The photoelectric conversion layer 12 may include a layer composed of an organic material and a layer composed of an inorganic material.

The counter electrode 13 of the photoelectric conversion structure 10 is an electrode formed from a transparent conducting material such as ITO. The term "translucency" herein means allowing passage of at least a portion of light of a wavelength that the photoelectric conversion layer 12 can absorb, and it is not essential to allow passage of light across a range of wavelengths of visible light. Although not illustrated in FIG. 3, the counter electrode 13 has a connection with the aforementioned voltage line 38. Of positive and negative charge generated by photoelectric conversion, the positive charge can be selectively collected by the pixel electrode 11 by, during operation of the imaging device 100A, controlling the potential of the voltage line 38 so that the potential of the counter electrode 13 is for example higher than the potential of the pixel electrode 11.

Forming the counter electrode 13 in the shape of a single layer extending across the plurality of pixels 110 makes it possible to apply a predetermined potential to the counter electrode 13 of the plurality of pixels 110 en bloc via the voltage line 38.

Each of the plurality of pixels 110 further includes part of the semiconductor substrate 130. As schematically shown in FIG. 3, the semiconductor substrate 130 has a plurality of the impurity regions $60n$ as first impurity regions near a surface thereof. The impurity region $60n$ functions as a first one of the drain and the source of the reset transistor 26, which is included in the aforementioned readout circuit 20. Further, the semiconductor substrate 130 also has an impurity region $61n$ serving as a second one of the drain and the source of the reset transistor 26. As schematically shown in FIG. 3, the impurity region $61n$ is connected to the aforementioned reset voltage line 39 via a polysilicon plug. In this example, the impurity region $60n$ and the impurity region $61n$ have an n-type conductivity type. These impurity regions $60n$ and $61n$ are typically n-type diffusion regions.

As can be understood from the foregoing, in the semiconductor substrate 130, a plurality of the readout circuits 20 are formed in correspondence with the plurality of pixels 110. The readout circuit 20 of each pixel is electrically separated from the readout circuit 20 of another pixel by a device isolation 221 provided in the semiconductor substrate 130.

As shown in FIG. 3, an interlayer insulating layer 90 covering the semiconductor substrate 130 is located between the photoelectric conversion structure 10 and the semiconductor substrate 130. The interlayer insulating layer 90 generally includes a plurality of insulating layers and a plurality of wiring layers. The plurality of wiring layers disposed in the interlayer insulating layer 90 may include a wiring layer having the address signal lines 34, the reset signal lines 36, or other wires as part thereof, a wiring layer having the vertical signal line 35, the power-supply wire 32, the reset voltage line 39, or other wires as part thereof, or other wiring layers. The numbers of insulating layers and wiring layers in the interlayer insulating layer 90 are not limited to this example but may be arbitrarily set.

The interlayer insulating layer 90 has provided therein a conducting structure 89 electrically connecting the pixel electrode 11 of the photoelectric structure 10 to the readout circuit 20, which is formed in the semiconductor substrate 130. As schematically shown in FIG. 3, the conductive structure 89 includes a wire and a via that are disposed in the interlayer insulating layer 90. The wire and the via are typically formed from metal such as copper or tungsten or a metal compound such as a metal nitride or a metal oxide. The conductive structure 89 also includes a contact plug cx connected to the aforementioned impurity region $60n$. The contact plug cx, which is connected to the impurity region $60n$, is typically a polysilicon plug, and is doped with an impurity such as phosphorus for superior electrical conductivity. Although not illustrated in FIG. 3, the conductive structure 89 also has an electrical connection with the gate electrode of the amplifying transistor 22. A plug cy is connected to the contact plug cx. Examples of metal that the plug cy may contain include tungsten and copper.

Attention is focused on the semiconductor substrate 130. The semiconductor substrate 130 includes a supporting substrate 140 and one or more semiconductor layer formed over the supporting substrate 140. In the example shown in FIG. 3, the semiconductor substrate 130 has an n-type impurity layer 62 provided over the supporting substrate 140. The following takes a p-type silicon substrate as an example of the supporting substrate 140. The supporting substrate 140 may have a lower electric resistivity than the impurity layer 62. The semiconductor substrate 130 may be an SOI (silicon-on-insulator) substrate, a substrate having a semiconductor layer provided on a surface thereof by epitaxial growth or other processes, or other substrates.

Attention is focused on the pixel region R1 first in the configuration illustrated in FIG. 3. The semiconductor substrate 130 has an n-type semiconductor layer 62an over the supporting substrate 140 and a p-type semiconductor layer 63p over the n-type semiconductor layer 62an. The n-type semiconductor layer 62an, which is located between the supporting substrate 140 and the p-type semiconductor layer 63p, is part of the aforementioned impurity layer 62. During operation of the imaging device 100A, the potential of the impurity layer 62 is controlled via a well contact (not illustrated in FIG. 3). Since the impurity layer 62 includes the n-type semiconductor layer 62an, which is located in the pixel region R1, as part thereof and is provided inside the semiconductor substrate 130, the flow of a small number of carriers from the supporting substrate 140 or the peripheral circuit into a charge accumulation region that accumulates signal charge can be reduced.

In the configuration illustrated in FIG. 3, the semiconductor substrate 130 further has a p-type semiconductor layer 66p located over the p-type semiconductor layer 63p and a p-type impurity region 65p formed in the p-type semiconductor layer 66p. In this example, the aforementioned impurity region 60n, which has a connection with the conductive structure 89, is provided in the p-type impurity region 65p. A junction capacitor that is formed by a p-n junction between the impurity region 60n and the p-type impurity region 65p, which serves as a p well, functions as a capacitor that stores at least a portion of signal charge that is collected by the pixel electrode 11. That is, the impurity region 60n constitutes a charge accumulation region that temporarily retains signal charge. On the other hand, the impurity region 61n is provided in the p-type semiconductor layer 66p. In this example, the p-type impurity region 65p is lower in impurity concentration than the p-type semiconductor layer 66p.

Further, the semiconductor substrate 130 has a plurality of p-type regions 64 provided in the semiconductor substrate 130 in such a way as to pass completely through the impurity layer 62. The p-type regions 64 has a comparatively high impurity concentration. Providing the p-type regions 64 inside the semiconductor substrate 130 makes it possible to electrically connect two regions of the same conductivity type separated from each other by the impurity layer 62.

In this example, the plurality of p-type regions 64 include a plurality of p-type regions 64a located in the pixel region R1 when seen from a direction normal to the semiconductor substrate 130 and one or more p-type regions 64b located below the plurality of contact plugs 211 of the blocking region 200A. The p-type regions 64a are formed between the p-type semiconductor layer 63p and the supporting substrate 140 in such a way as to pass completely through the n-type semiconductor layer 62an, and have a function of electrically connecting the p-type semiconductor layer 63p to the supporting substrate 140. On the other hand, the p-type region 64b is electrically connected to the impurity region 131 of the blocking region 200A by having one end reaching the impurity region 131, and electrically connects the impurity region 131 to the supporting substrate 140.

Accordingly, in this example, an electrical path leading from the impurity region 131 of the blocking region 200A to the p-type semiconductor layer 63p via the p-type region 64b, the supporting substrate 140, and the p-type regions 64a is formed in the semiconductor substrate 130. As mentioned above, the plurality of contact plugs 211 are connected to the impurity region 131 of the blocking region 200A, and these contact plugs 211 are configured to be connectable to a power source (not illustrated) such as a ground. For example, the potential of the impurity region 131 of the blocking region 200A can be grounded via the plurality of contact plugs 211. Connecting an appropriate power source to the plurality of contact plugs 211 of the blocking region 200A makes it possible to control the potentials of the p-type impurity region 65p and the p-type semiconductor layer 66p via the p-type semiconductor layer 63p by utilizing an electrical path including the impurity region 131, the p-type region 64b, the supporting substrate 140, and the p-type regions 64a.

In the example shown in FIG. 3, an impurity region 131a made relatively high in impurity concentration is formed in a portion of the impurity region 131 located near the surface of the semiconductor substrate 130. The contact plugs 211 are typically formed from metal. Providing the impurity region 131a, which is relatively high in impurity concentration in the impurity region 131, and connecting the plurality of contact plugs 211 to the impurity region 131a brings about an effect of reducing contact resistance between the plurality of contact plugs 211 and the impurity region 131.

Furthermore, in this example, a silicide layer 131s is formed between the plurality of contact plugs 211 and the impurity region 131. Providing the silicide layer 131s in a portion of the impurity region 131a near the surface of the semiconductor substrate 130 and connecting the plurality of contact plugs 211 to the silicide layer 131s makes it possible to further reduce the contact resistance.

Next, attention is focused on the first peripheral region R2 of the semiconductor substrate 130. As mentioned above, a circuit for driving the plurality of pixels 110 and a circuit for processing signals read out from the plurality of pixels 110 are formed in the first peripheral region R2. The first peripheral region R2 includes, for example, a plurality of transistors 25 and a first peripheral transistor 27 that constitute a logic circuit such as a multiplexer. As schematically shown in FIG. 3, in this example, an n-type semiconductor layer 62bn, which is another part of the impurity layer 62, is formed over the supporting substrate 140, and an n-type impurity region 81n and a p-type impurity region 82p are formed as wells over the n-type semiconductor layer 62bn. Each of the transistors 25 has its drain and source located in the p-type impurity region 82p, and the first peripheral transistor 27 has its drain and source located in the n-type impurity region 81n. The presence of part of the supporting substrate 140 causes the n-type semiconductor layer 62bn to be separated from the n-type semiconductor layer 62an for the entire perimeter of the pixel region R1. The n-type semiconductor layer 62bn is supplied with a predetermined voltage by being connected to a power source (not illustrated). In the following, the n-type impurity region 81n is sometimes referred to as "N-type well".

The depth of the n-type semiconductor layer 62an of the pixel region R1 and the depth of the n-type semiconductor layer 62bn of the first peripheral region R2 may be equal to or different from each other.

In the configuration illustrated in FIG. 3, contact plugs cp are connected to the drain, source, and gate electrodes of peripheral transistors such as the transistors 25 and 27.

In the example shown in FIG. 3, the blocking region 200A further includes an n-type impurity region 83n located near a boundary with the first peripheral region R2. The n-type impurity region 83n is located over the n-type semiconductor layer 62bn of the impurity region 62, and has an electrical connection with the n-type semiconductor layer 62bn. The n-type impurity region 83n may be provided with a plug. Connecting an appropriate power source to the plug connected to the n-type impurity region 83n makes it possible to control the potentials of the n-type impurity region 83n and the n-type semiconductor layer 62bn.

Each of the impurity layers and regions located above the supporting substrate 140 is formed by ion implantation of an impurity into a semiconductor layer obtained by epitaxial growth over the supporting substrate 140. The p-type regions 64a, which is located in the pixel region R1, of the p-type region 64 may be formed in places that do not overlap the device isolation in the pixels in plan view.

In the present embodiment, the blocking region 200A is formed between the pixel region R1 and the first peripheral region R2. As mentioned above, the blocking region 200A includes the device isolation 220, which is located between the pixel region R1 and the first peripheral region R2, and the impurity region 131, over which the plurality of contact plugs 211 are disposed. Since the blocking region 200A includes at least the impurity region 131, a so-called gettering effect can be exerted by utilizing a dopant contained in the impurity region 131. For example, it is known that diffusion of a metal impurity into a region in a semiconductor substrate supporting a photoelectric layer in which pixels are disposed causes degradation in image quality. By causing the dopant contained in the impurity region 131 to function as a gettering center, the diffusion of a metal impurity into the charge accumulation region is inhibited, so that degradation in image quality due to the diffusion of the metal impurity may be avoided.

Examples of p-type impurities, i.e. dopants, for silicon substrates include boron, and examples of n-type dopants include phosphorus, arsenic, and antimony. Of these substances, the p-type dopants are known to be able to exert a gettering effect on most metals and, accordingly, are suitable as dopants for the impurity region 131. In a typical embodiment of the present disclosure, the p type is selected as the conductivity type of the impurity region 131 of the blocking region 200A. For example, disposing the blocking region 200A, which has its impurity region 131 doped with a p-type impurity, between the pixel region R1 and the first peripheral region R2 makes it possible to effectively inhibit the diffusion of a metal impurity into the pixel region R1. That is, the diffusion of a metal impurity into the charge accumulation regions of the pixels 110 is inhibited, so that a deterioration in image quality due to the diffusion of the metal impurity can be reduced.

Figure 4:
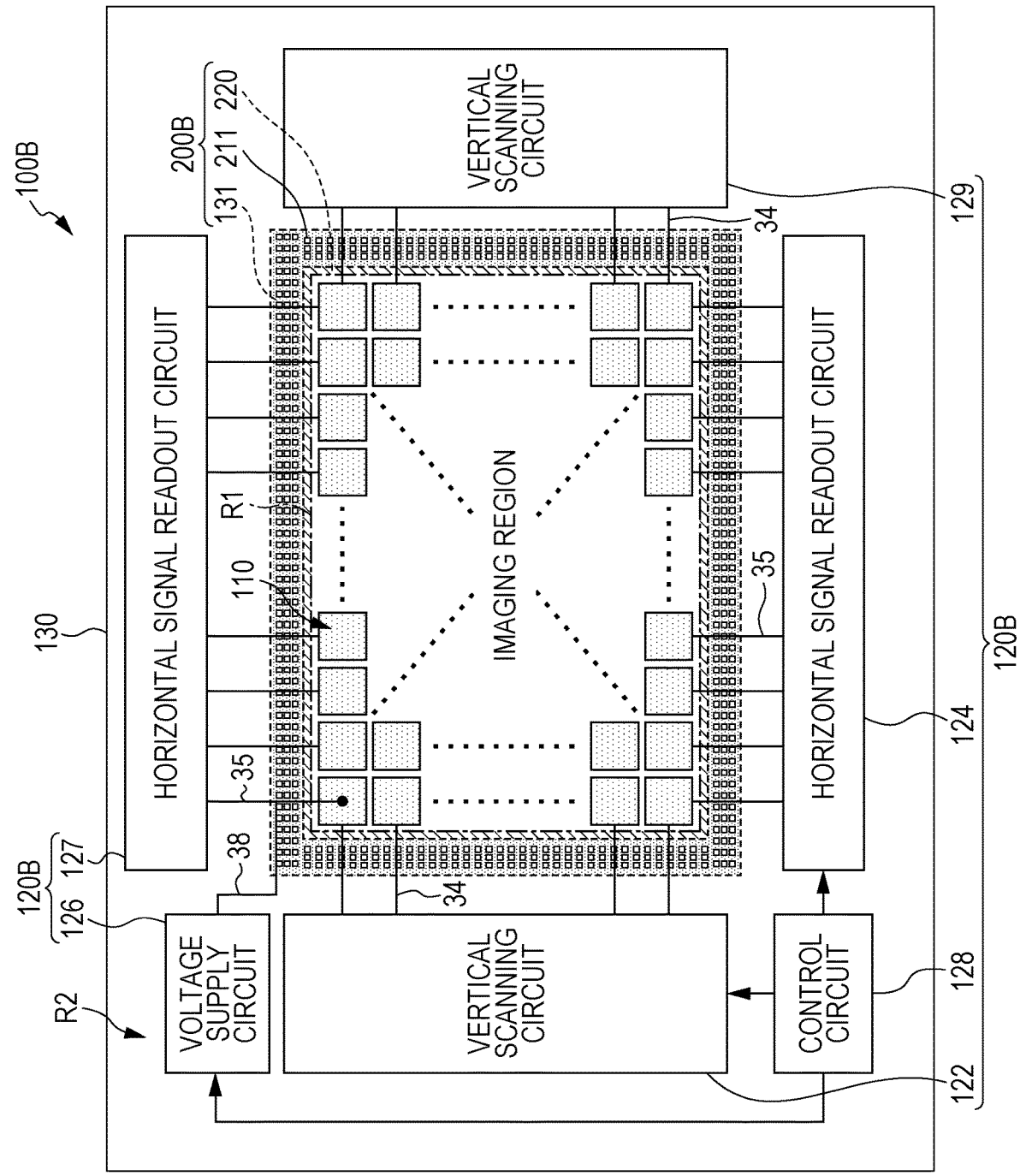
FIG. 4 is a schematic plan view showing another example of the shape of a blocking region.

FIG. 4 shows another example of the shape of a blocking region. An imaging device 100B shown in FIG. 4 differs from the imaging device 100A shown in FIG. 1 in that instead of the blocking region 200A, the imaging device 100B has a blocking region 200B surrounding the pixel region R1 in the shape of a rectangle. As compared with the aforementioned blocking region 200A, the impurity region 131 of the blocking region 200B surrounds the pixel region R1 in seamless manners in a circular pattern in plan view. As schematically shown in FIG. 4, in this example too, the plurality of contact plugs 211 are connected to the impurity region 131. In this example, the device isolation 220 of the blocking region 200B too surrounds the pixel region R1 in seamless manners in a circular pattern inside the impurity region 131. In such a configuration, it may be said that a boundary between the pixel region R1 and the first peripheral region R2 is defined by the device isolation 220.

In this example, a peripheral circuit 120B provided in the first peripheral region R2 includes a second vertical scanning circuit 129 and a second horizontal signal readout circuit 127 in addition to the vertical scanning circuit 122, the horizontal signal readout circuit 124, the voltage supply circuit 126, and the control circuit 128. The vertical scanning circuit 129 is disposed to face the vertical scanning circuit 122 across the pixel region R1. As illustrated, to the vertical scanning circuit 129 too, address signal lines 34 provided separately in correspondence with each of the rows of pixels 110 are connected. Similarly, the horizontal signal readout circuit 127 is disposed to face the horizontal signal readout circuit 124 across the pixel region R1, and to the horizontal signal readout circuit 127, vertical signal lines 35 provided separately in correspondence with each of the columns of pixels 110 are connected.

For example, the vertical scanning circuit 122 is responsible for a row-selecting operation on pixels in the left half of the pixel; region R1, and the vertical scanning circuit 129 is responsible for a row-selecting operation on pixels in the right half of the pixel region R1. Further, the horizontal signal readout circuit 124 is responsible for processing of signals read out from pixels in the lower half of the pixel region R1, and the horizontal signal readout circuit 127 is responsible for processing of signals read out from pixels in the upper half of the pixel region R1. By thus partitioning the pixel region R1 and executing a readout of signals through a plurality of vertical scanning circuits and horizontal signal readout circuits, the speeding up of operations, such as the shortening of frame rates, can be achieved.

In the configuration illustrated in FIG. 4, the vertical scanning circuits 122 and 129 and the horizontal signal readout circuits 124 and 127 are disposed along the four sides of the rectangular shape of the pixel region R1. In other words, in this example, the blocking region 200B is interposed between the vertical scanning circuit 122 and a set of pixels 110, between the vertical scanning circuit 129 and a set of pixels 110, between the horizontal signal readout circuit 124 and a set of pixels 110, and between the horizontal signal readout circuit 127 and a set of pixels 110.

Forming the blocking region 200B in the semiconductor substrate 130 in a shape that surrounds the pixel region R1, which includes an array of pixels 110, in plan view makes it possible to effectively inhibit migration of charge between charge accumulation regions of the pixels and the circuits formed in the first peripheral region R2. It is not essential in the embodiment of the present disclosure that in a case where as in the case of the example shown in FIG. 4, a group of circuits constituting a peripheral circuit is disposed, for example, to surround a rectangular pixel region R1, a blocking region surround the pixel region R1 in seamless manners in a circular pattern in plan view. For example, a blocking region may include a plurality of portions each including a device isolation 220 and an impurity region 131, and the plurality of portions may be disposed as a whole to surround the pixel region R1. Such a configuration too is expected to bring about effects which are similar to those which are brought about in a case where a blocking region is provided in such a way as to surround the pixel region R1 in seamless manners in a circular pattern in plan view. Further, the blocking region 200B is not indispensable.

Transistor of First Peripheral Region R2

As noted above, the first peripheral region R2 includes the first peripheral transistor 27. The following describes a configuration example of the first peripheral transistor 27 according to the embodiment with reference to FIGS. 5 to 12B.

Figure 5:
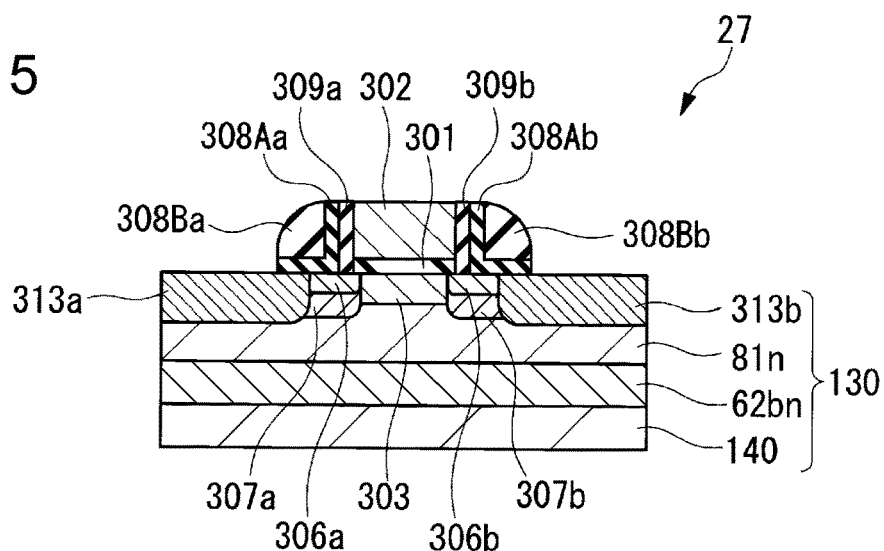
FIG. 5 is a cross-sectional view showing a transistor according to a first configuration example.

FIG. 5 shows a cross-sectional configuration of a first peripheral transistor 27 according to a first configuration example. This first peripheral transistor 27 is specifically a MIS transistor, more specifically a MOSFET.

As shown in FIG. 5, for example, a gate insulator film 301 composed of silicon oxide ($SiO_2$) is interposed between a principal surface of a semiconductor substrate 130 composed of P-type silicon (Si) and a gate electrode 302 composed of polysilicon or gate metal and formed over the principal surface. The semiconductor substrate 130 has formed in an upper part thereof an N-channel diffusion layer 303 in which, for example, arsenic (As) is diffused and the impurity region 81n, which is an N-type well in which, for example, arsenic (As) and phosphorus (P) are diffused and that is greater in junction depth than the N-type channel diffusion layer 303. In the semiconductor substrate 130, the supporting substrate 140, the n-type semiconductor layer 62bn, and the impurity region 81n, which is an N-type well, are stacked in this order.

In regions in the N-type channel diffusion layer 303 in a direction parallel with a gate length, i.e. regions in which a source and a drain are formed, first extension diffusion layers 306a and 306b and first pocket diffusion layers 307a and 307b under the first extension diffusion layers 306a and 306b are formed, respectively. The first extension diffusion layers 306a and 306b are P-type extension high-concentration diffusion layers, obtained by diffusion of, for example, boron (B), which is a P-type impurity, that have comparatively shallow junctions. The first pocket diffusion layers 307a and 307b are N-type pocket diffusion layers obtained by diffusion of, for example, arsenic (As), which is an N-type impurity.

The first extension diffusion layers 306a and 306b, which are P-type extension high-concentration diffusion layers, contain carbon (C).

In the present configuration example, carbon is used to inhibit the diffusion of boron, and for this reason, the first extension diffusion layers 306a and 306b are shallow in impurity profile and keep steep and high activation concentrations. This causes a low-resistance extension diffusion layer with a shallow junction depth to be formed, making it possible to achieve a fine device having high driving force.

Incidentally, in the process of manufacturing an imaging device, heat treatment may be executed for the purpose of heating the pixel region R1. This heat treatment may cause the first peripheral region R2 to be heated too. However, the aforementioned diffusion-suppressing effect derived from carbon inhibits the redistribution of the impurity in the first peripheral transistor 27 of the first peripheral region R2 even in a case where the first peripheral region R2 is heated by such heat treatment, making it possible to maintain the shallow junction.

Further, the inclusion of carbon in the first extension diffusion layers 306a and 306b also brings about an effect of reducing the occurrence of residual defects in the first extension diffusion layers 306a and 306b. Examples of residual defects include EOR (end-of-range) defects. The term "EOR defect" here refers to a defect layer that is formed in a region directly below an amorphous/crystal (a/c) interface before thermal processing in a case where the semiconductor substrate 130, which is composed of silicon, is subjected to thermal processing in an amorphized state.

Further, carbon implantation is executed in order to inhibit boron-induced transient enhanced diffusion (hereinafter abbreviated as "TED"). Carbon forms, for example, carbon-lattice silicon complexes or clusters with enhanced point defects, which induce TED, and thereby reduces enhanced point defects. Further, in consideration of the fact that enhanced point defects may grow to generate secondary defects such as dislocation loops, it can be said that carbon reduces crystal defects. By thus using, in the extension formation regions of the semiconductor substrate 130, crystal layers with reduced generation of residual defect layers such as secondary defects, even the occurrence of junction leaks due to residual defect layers can be reduced.

Further, in regions in the semiconductor substrate 130 outside the first extension diffusion layers 306a and 306b, P-type source-drain diffusion layers 313a and 313b are formed. The P-type source-drain diffusion layers 313a and 313b are connected to the first extension diffusion layers 306a and 306b, and are greater in junction depth than the first extension diffusion layers 306a and 306b. In the present configuration example, the P-type source-drain diffusion layers 313a and 313b contain carbon (C). Note, however, that one or both of the P-type source-drain diffusion layers 313a and 313b may not contain carbon (C). The term "source-drain diffusion layer" refers to a diffusion layer that functions as a source or a drain.

On both side surfaces of the gate electrode 302, offset spacers 309a and 309b having insulation properties are formed. The offset spacers 309a and 309b contain carbon. Furthermore, first side walls 308Aa and 308Ab with L-shaped cross-sections are formed over the semiconductor substrate 130. The first side walls 308Aa and 308Ab extend from over outer side surfaces of the offset spacers 309a and 309b to upper portions of inner ends of the P-type source-drain diffusion layers 313a and 313b, respectively. Further, second side walls 308Ba and 308Bb having insulation properties are formed on outer sides of the first side walls 308Aa and 308Ab, respectively.

In the first configuration example, arsenic ions are used as the impurity of the N-type channel diffusion layer 303. Alternatively, ions of an element that are larger in mass than arsenic ions and that exhibit an N type or both arsenic ions and ions of an element that are larger in mass than the arsenic ions and that exhibit an N type may be used.

Further, carbon is not the only impurity that contributes to suppression of TED. Instead of or in combination with carbon, at least one selected from the group consisting of nitrogen, fluorine, germanium, silicon, and argon may be used. Nitrogen, fluorine, germanium, silicon, argon, or other impurities may contribute to suppression of TED. Specifically, as is the case with carbon, impurities such as nitrogen and fluorine form, for example, impurity-lattice silicon or impurity-vacancy complexes or clusters with enhanced point defects, which induce TED, and thereby reduce enhanced point defects. Specifically, enhanced point defects are reduced by the formation of, for example, carbon-lattice silicon, nitrogen-lattice silicon, fluorine-lattice silicon, and fluorine-vacancy complexes. Germanium, silicon, argon, or other impurities contribute to suppression of TED through the pre-amorphization effect. Besides, at least one selected from among non-conducting elements in the group consisting of elements in groups 14, 17, and 18 may be used as an impurity that contributes to suppression of TED.

Further, although, in the first configuration example, the transistor is a P-channel MIS transistor, the transistor may alternatively be an N-channel MIS transistor. In the case of an N-channel MIS transistor, phosphorus (P) ions, arsenic (As) ions, or ions of a Group 5B element that are larger in mass than arsenic ions, such as antimony (Sb) ions or bismuth (Bi) ions, can be used as N-type impurity ions that constitute extension diffusion layers. Further, in the case of an N-channel MIS transistor, for example, boron (B) ions, ions of a Group III element that are larger in mass than boron ions, such as indium (In) ions, or a combination thereof can be used as P-type pocket diffusion layers. This makes it possible to reduce variations in threshold voltage attributed to pocket profiles, as carbon inhibits TED of the P-type pocket diffusion layers. As the N-type impurity ions that constitute extension diffusion layers, one type of the aforementioned impurities or a combination of two or more types of the aforementioned impurities may be used. The same applies to the elements that are used in the P-type pocket diffusion layers.

First Modification of First Configuration Example

Figure 6:
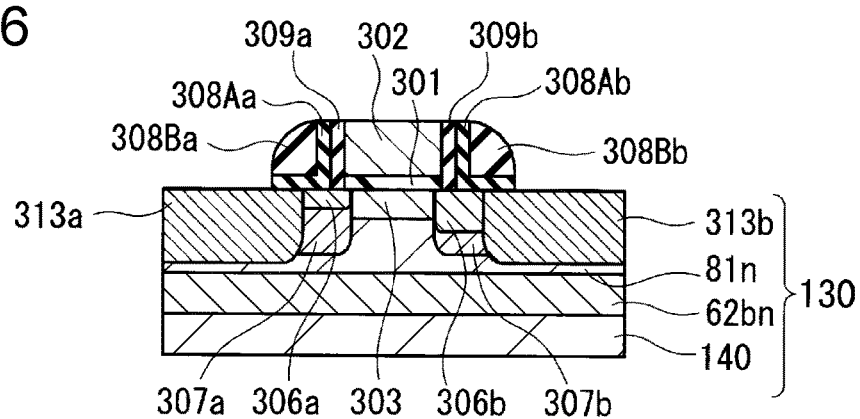
FIG. 6 is a cross-sectional view showing a transistor according to a first modification of the first configuration example.

FIG. 6 shows a cross-sectional configuration of a transistor according to a first modification of the first configuration example. In the transistor according to the first modification, as shown in FIG. 6, the impurity profiles of the first extension diffusion layers 306a and 306b, which are P-type extension high-concentration diffusion layers, are bilaterally asymmetric with respect to the gate electrode 302. Making a source region shallower and steeper in extension profile than a drain region as shown in FIG. 6 effect an increase in carrier concentration gradient between the source region and a channel region, bringing about improvement in driving force in the MIS transistor. Further, since the drain region is deeper in extension profile than the source region, less hot carriers are generated than in a symmetrical, shallow, and steep profile structure. It should be noted that a transistor having the configuration of FIG. 6 may be fabricated, for example, with reference to Japanese Patent No. 5235486.

In the example shown in FIG. 6, the first extension diffusion layer 306a is shallower than the first extension diffusion layer 306b. Note, however, that a configuration in which the first extension diffusion layer 306b is shallower than the first extension diffusion layer 306a may be adopted.

Second Modification of First Configuration Example

Figure 7:
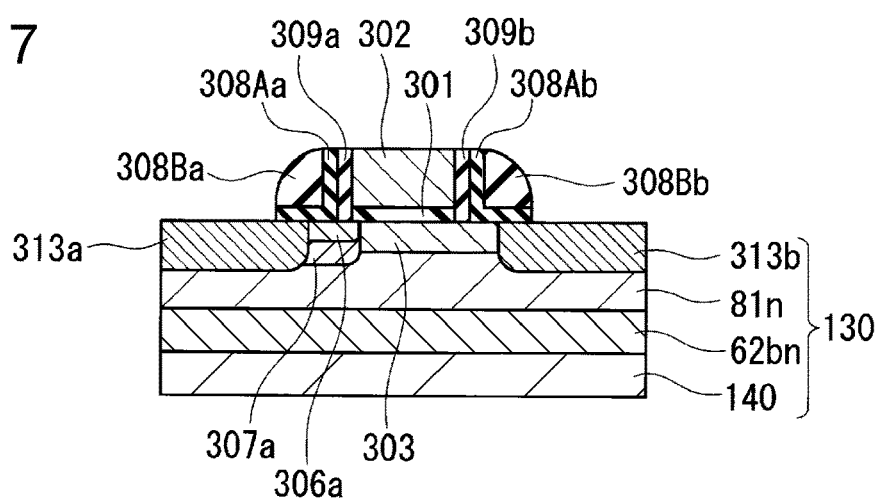
FIG. 7 is a cross-sectional view showing a transistor according to a second modification of the first configuration example.

FIG. 7 shows a cross-sectional configuration of a transistor according to a second modification of the first configuration example. As shown in FIG. 7, the transistor according to the second modification has a P-type extension high-concentration diffusion layer beside only either the P-type source-drain diffusion layer 313a or 313b.

In the example shown in FIG. 7, the transistor according to the second modification has the first extension diffusion layer 306a as a P-type extension high-concentration diffusion layer that is adjacent to the P-type source-drain diffusion layer 313a and, meanwhile, does not have a first extension diffusion layer that is adjacent to the P-type source-drain diffusion layer 313b. Note, however, that a configuration in which the transistor does not have a first extension diffusion layer that is adjacent to the P-type source-drain diffusion layer 313a and, meanwhile, has the first extension diffusion layer 306b adjacent to the P-type source-drain diffusion layer 313b may be adopted.

Further, as shown in FIG. 7, the transistor according to the second modification has an N-type pocket diffusion layer beside only either the P-type source-drain diffusion layer 313a or 313b. Specifically, the transistor according to the second modification has the first N-pocket diffusion layer 307a adjacent to the P-type source-drain diffusion layer 313a and, meanwhile, does not have a first pocket diffusion layer that is adjacent to the P-type source-drain diffusion layer 313b. Note, however, that a configuration in which the transistor does not have a first pocket diffusion layer that is adjacent to the P-type source-drain diffusion layer 313a and, meanwhile, has the first pocket diffusion layer 307b adjacent to the P-type source-drain diffusion layer 313b may be adopted.

Third Modification of First Configuration Example

Figure 8:
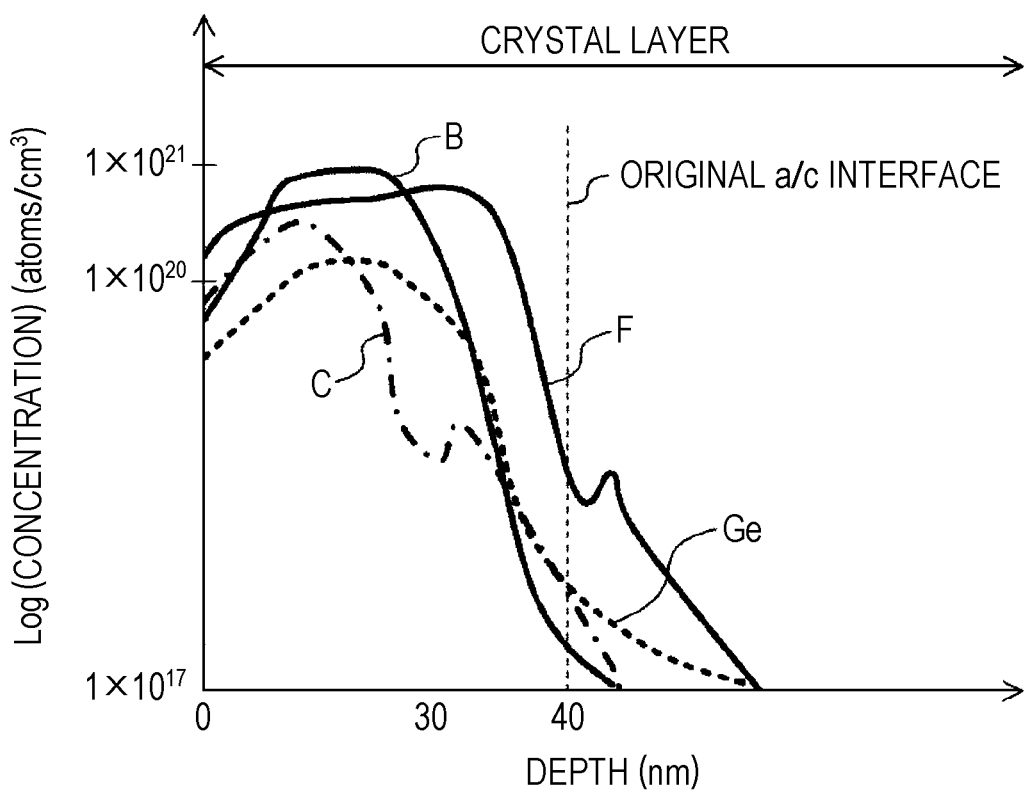
FIG. 8 is a diagram showing in-depth impurity profiles in P-type source-drain diffusion layers according to a third modification of the first configuration example.

In a third modification of the first configuration example, the P-type source-drain diffusion layers 313a and 313b contain fluorine (F) and carbon (C). Fluorine may bring about partial amorphization of the semiconductor substrate 130. Further, fluorine may inhibit transient enhanced diffusion (TED) of impurities. FIG. 8 shows examples of concentration distributions of impurities in the P-type source-drain diffusion layers 313a and 313b in a direction parallel with the depth of the semiconductor substrate 130. The vertical axis represents the concentrations of fluorine (F), carbon (C), boron (B), and germanium (Ge) on a log scale. The concentration distributions of FIG. 8 relate to a case where fluorine is implanted for amorphization and suppression of the diffusion of the impurities and diffused during annealing. In the examples shown in FIG. 8, the concentration distribution of fluorine has segregation near the original position of the a/c interface.

According to the third modification, the diffusion of the impurities is inhibited after the aforementioned annealing. Further, even if the first peripheral region R2 is heated during thermal processing for the pixel region R1, redistributions of the impurities may fall within narrow ranges.

The following describes a method for manufacturing a transistor shown in FIG. 5 with reference to the drawings. It should be noted that the following omits to describe a method for fabricating the n-type semiconductor layer 62bn. The n-type semiconductor layer 62bn can be fabricated by a publicly-known method.

FIGS. 9A to 9E, FIGS. 10A to 10D, and FIGS. 11A to 11C show cross-sectional configurations in the order of steps of a method for manufacturing a MIS transistor according to the first configuration example.

Figure 9A:
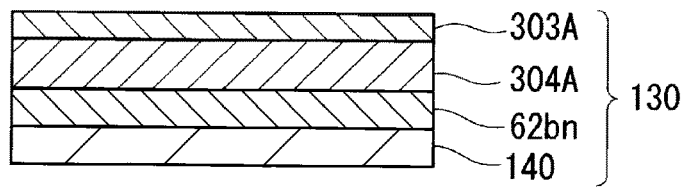
FIGS. 9A to 9E are cross-sectional views showing a method for manufacturing a transistor according to the first configuration example.

First, as shown in FIG. 9A, an N-type well impurity-implanted layer 304A is formed by implanting N-type impurity ions, e.g. phosphorus (P) ions, twice into a channel formation region of a semiconductor substrate 130 composed of P-type silicon. The first round of ion implantation involves an implantation energy of 260 keV and an implantation dose amount of $4\times10^{12}/cm^2$, and the second round of ion implantation involves an implantation energy of 540 keV and an implantation dose amount of $1\times10^{13}/cm^2$. After that, an N-type channel impurity-implanted layer 303A is formed on top of the N-type well impurity-implanted layer 304A by implanting arsenic (As) ions into the semiconductor substrate 130 with an implantation energy of approximately 90 keV and in an implantation dose amount of approximately $5\times10^{12}/cm^2$. At this point in time, the ion implantation may be preceded by deposition of a silicon oxide film on a surface of the semiconductor substrate 130. It should be noted that the N-type well impurity-implanted layer 304A and the N-type channel impurity-implanted layer 303A may be formed in any order.

Figure 9B:
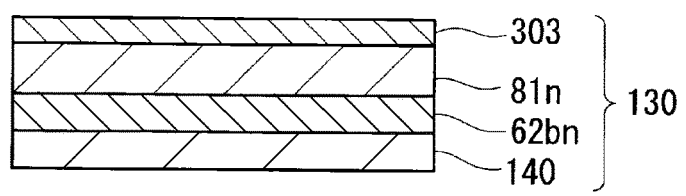

Next, as shown in FIG. 9B, the semiconductor substrate 130 thus ion-implanted is subjected to first rapid thermal processing (RTA) that raises the temperature to approximately to 850° C. to 1050° C. at a temperature rise rate higher than or equal to approximately 100° C./sec. e.g. approximately 200° C./sec, and keeps the peak temperature for a maximum of approximately ten seconds or does not keep the peak temperature. This first rapid thermal processing causes the N-type channel diffusion layer 303 and the impurity region 81n, which is an N-type well, to be formed in the upper part of the semiconductor substrate 130. It should be noted that the rapid thermal processing that does not keep the peak temperature refers to thermal processing in which the thermal processing temperature drops at the same time as it reaches the peak temperature.

Figure 9C:
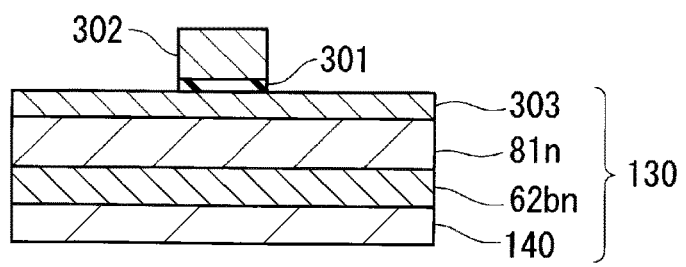

Next, as shown in FIG. 9C, a gate insulator film 301 composed of silicon oxide with a film thickness of approximately 1.5 nm is selectively formed on top of the semiconductor substrate 130, and a gate electrode 302 composed of polysilicon with a film thickness of approximately 100 nm is selectively formed on top of the gate insulator film 301. Although the gate insulator film 301 is composed of silico oxide here, the gate insulator film 301 may be a high-κ insulator film composed of silicon oxynitride (SiON), hafnium oxide ($HfO_x$), hafnium-silicon-oxynitride (HfSiON), or other substances. Further, instead of being composed of polysilicon, the gate electrode 302 may be composed of a metal gate, a film stack of polysilicon and a metal gate, silicide-topped polysilicon, or fully silicided poly silicon.

Figure 9D:
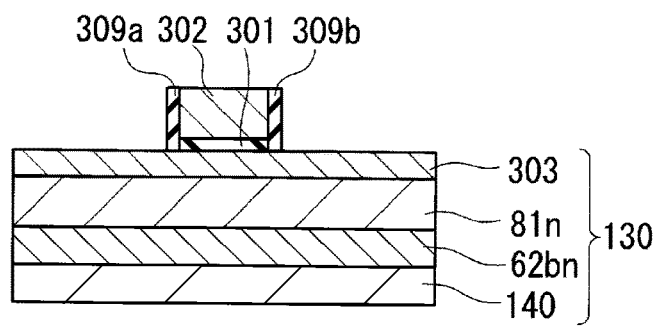

Next, as shown in FIG. 9D, an insulator film composed of silicon oxide with a film thickness of approximately 8 nm is deposited, and then the offset spacers 309a and 309b are formed by anisotropic etching on both side surfaces of the gate electrode 302 and the gate insulator film 301 with a finish thickness of approximately 4 nm. Although the offset spacers 309a and 309b are composed of silicon oxide here, the offset spacers 309a and 309b may be high-κ insulator films composed of silicon nitride (SiN), $HfO_2$, or other substances.

Figure 9E:
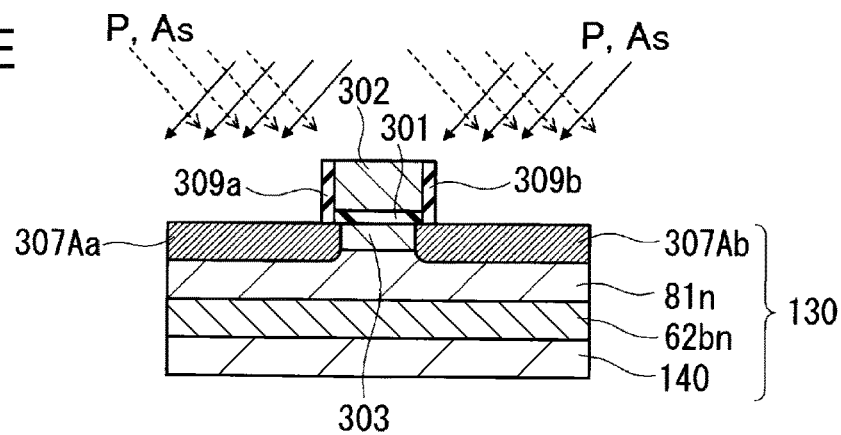

Next, as shown in FIG. 9E, an N-type impurity, e.g. phosphorus (P) ions, is implanted into the semiconductor substrate 130 with an implantation energy of approximately 40 keV and in an implantation dose amount of approximately $2 \times 10^{13}/cm^2$ with the offset spacer 309a and 309b and the gate electrode 302 as masks. Then, N-type pocket impurity-implanted layers 307Aa and 307Ab are formed by angularly implanting an N-type impurity, e.g. arsenic (As) ions, with an implantation energy of approximately 80 keV and in an implantation dose amount of approximately $1 \times 10^{13}/cm^2$. Note here that the P ions and the As ions may be implanted in any order.

In this example, both the P ions and the As ions are implanted into the N-type pocket impurity layers 307Aa and 307Ab. Note, however, that only either the P ions or the As ions may be implanted into the N-type pocket impurity layers 307Aa and 307Ab.

Figure 10A:
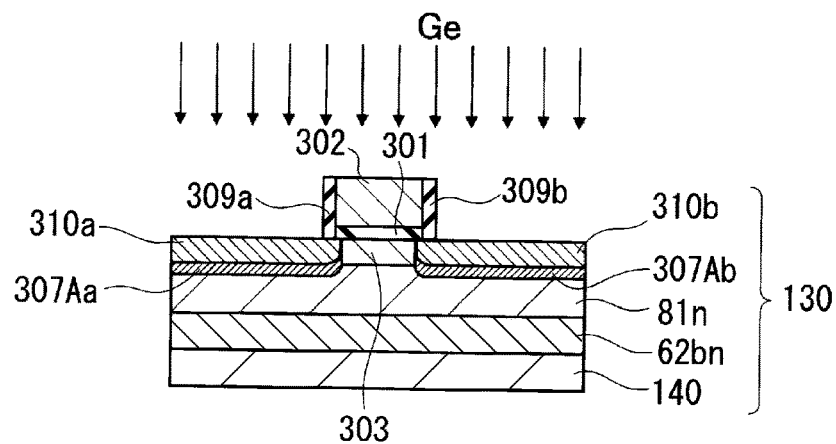
FIGS. 10A to 10D are cross-sectional views showing the method for manufacturing a transistor according to the first configuration example.

Next, as shown in FIG. 10A, amorphous layers 310a and 310b are selectively formed in the semiconductor substrate 130 by implanting germanium (Ge) ions into the semiconductor substrate 130 with an implantation energy of approximately 10 keV and in an implantation dose amount of approximately $5 \times 10^{14}/cm^2$ with the offset spacer 309a and 309b and the gate electrode 302 as masks. Although the amorphous layers 310a and 310b are formed of germanium here, they may be formed of silicon (Si), argon (Ar), krypton (Kr), xenon (Xe), carbon (C), or other substances.

Figure 10B:
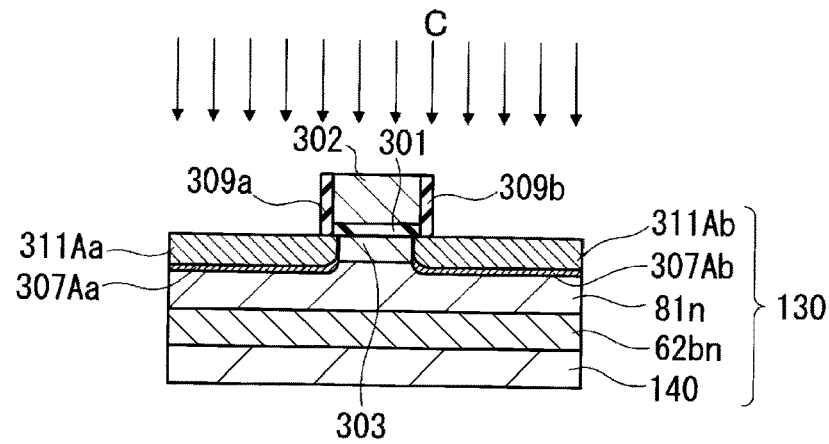

Next, as shown in FIG. 10B, with the amorphous layers 310a and 310b formed, carbon-implanted layers 311Aa and 311Ab are formed by implanting carbon (C) ions into the semiconductor substrate 130 with an implantation energy of approximately 5 keV and in an implantation dose amount of approximately $1 \times 10^{15}/cm^2$ with the offset spacer 309a and 309b and the gate electrode 302 as masks. The carbon ions need only be implanted, for example, with the implantation energy falling within a range of 1 keV to 10 keV and with the implantation dose amount falling within a range of $1 \times 10^{14}/cm^2$ to $3 \times 10^{15}/cm^2$. At this point in time, molecular ions of carbon-containing molecules such as $C_5H_5$ or $C_7H_7$ may be used instead of the carbon ions. Further, nitrogen ions, fluorine ions, or other ions may be used instead of the carbon ions, which are impurity ions for use in the prevention of diffusion. Further, in a case where carbon or carbon-containing molecular ions are used instead of germanium in the formation of the amorphous layers 310a and 310b, the step of forming the amorphous layers 310a and 310b and the step of forming the carbon-implanted layers 311Aa and 311Ab may be executed simultaneously. Further, the semiconductor substrate 130 may be amorphized during pocket implantation by using ions with a comparatively large mass number, such as antimony (Sb), in N-type pocket impurity implantation.

Figure 10C:
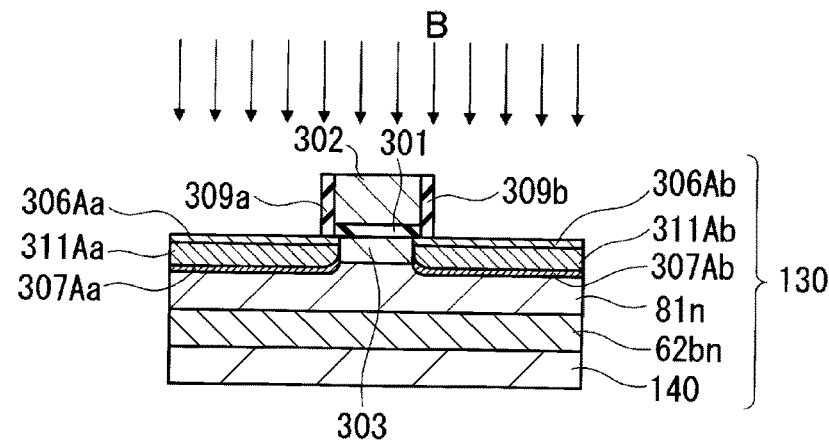

Next, as shown in FIG. 10C, first P-type impurity-implanted layers 306Aa and 306Ab are formed on top of the carbon-implanted layers 311Aa and 311Ab by implanting a P-type impurity, e.g. boron (B) ions, into the semiconductor substrate 130 with an implantation energy of approximately 0.5 keV and in an implantation dose amount of approximately $5 \times 10^{14}/cm^2$ with the offset spacer 309a and 309b and the gate electrode 302 as masks. Instead of boron, boron difluoride ($BF_2$), boron clusters such as $B_{18}H_x$ or $B_{10}H_x$, or indium (In) may be used.

Figure 12A:
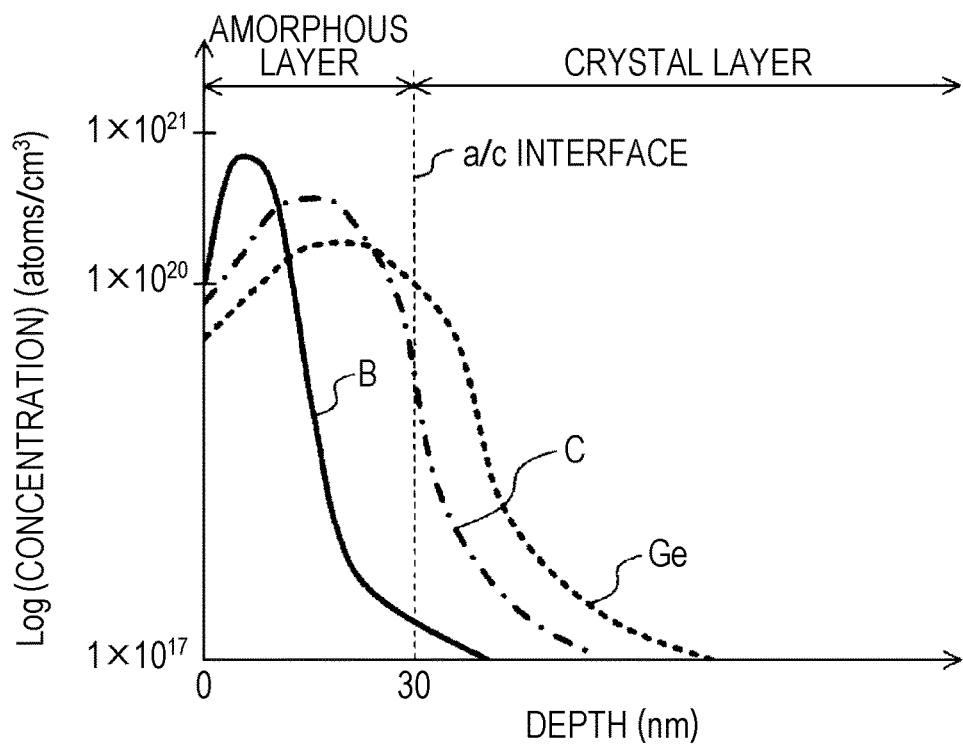
FIGS. 12A and 12B are graphs showing in-depth impurity profiles in extension formation regions according to the first configuration example.

Note here that FIG. 12A shows, on a log scale, concentration distributions (impurity profiles) of impurities (boron (B), carbon (C), and germanium (Ge)) immediately after boron ion implantation in a direction parallel with the depth of the semiconductor substrate 130. As shown in FIG. 12A, the amorphous layers 310a and 310b are approximately 30 nm deep under the condition of implantation of germanium according to the present manufacturing method example.

Figure 10D:
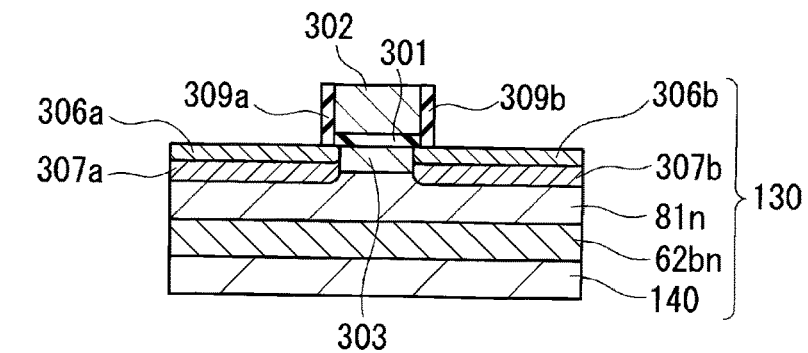

Next, the semiconductor substrate 130 is subjected to second rapid thermal processing that heats the substrate to a temperature of 1200° C. to 1350° C., for example, by laser annealing and keeps the substrate near the peak temperature for approximately 1 ms. As shown in FIG. 10D, this second rapid thermal processing causes the first extension diffusion layers 306a and 306b and the first pocket diffusion layers 307a and 307b to be formed in regions in the semiconductor substrate 130 lateral to the gate electrode 302, respectively. The first extension diffusion layers 306a and 306b are formed by diffusion of boron ions and have comparatively shallow junction planes, and the first pocket diffusion layers 307a and 307b are N-type pocket diffusion layers formed by diffusion of phosphorus ions and arsenic ions contained in the N-type pocket impurity-implanted layers 307Aa and 307Ab. Although laser annealing is used in the second rapid thermal processing, which is on the millisecond time scale, here, a so-called millisecond annealing (MSA) method such as flash lamp annealing may be used. Furthermore, the second rapid thermal processing may involve the use of annealing that heats the semiconductor substrate 130 to a temperature of approximately 850° C. to 1050° C. at a temperature rise rate of approximately 200° C./sec and keeps the peak temperature for a maximum of approximately ten seconds or does not keep the peak temperature, e.g. low-temperature spike-RTA.

Figure 12B:
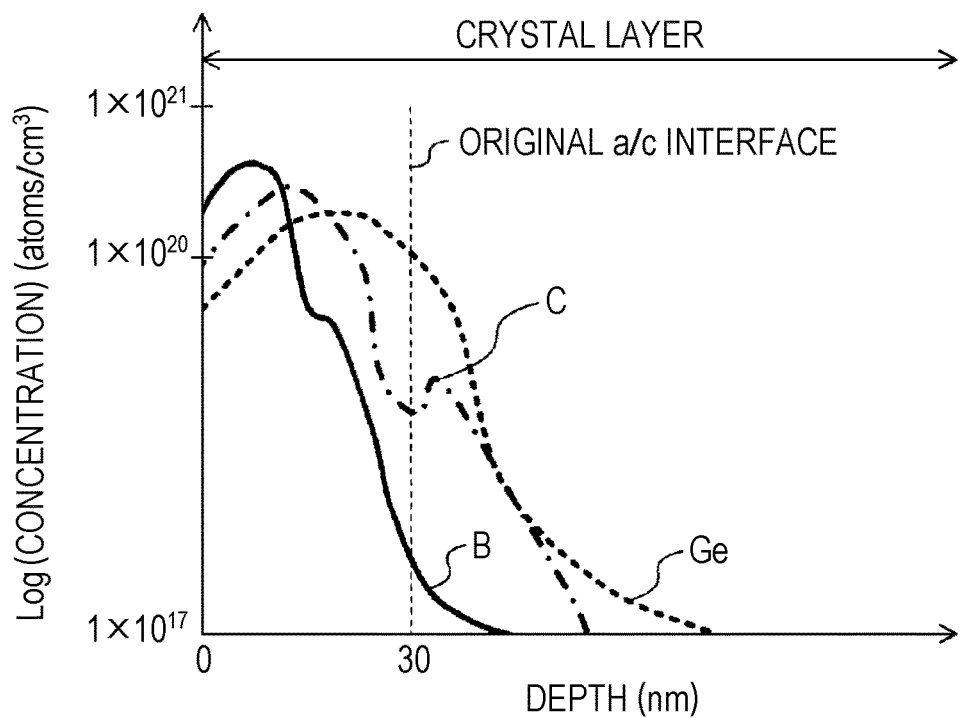

FIG. 12B shows, on a log scale, concentrations distributions of impurities (B, C, and Ge) in the first extension diffusion layers 306a and 306b, which are P-type extension high-concentration diffusion layers formed by the second rapid thermal processing, in a direction parallel with the depth of the semiconductor substrate 130. After the second rapid thermal processing has been executed, the amorphous layers 310a and 310b, formed during germanium ion implantation, recover to crystal layers. Boron is diffused to have a peak at a slightly greater depth than it does immediately after ion implantation. Carbon has a first peak composed of a carbon cluster near a concentration peak position during ion implantation, and also has a segregated second peak near the original amorphous/crystal (a/c) interface. Germanium has almost the same concentration distribution as it does immediately after ion implantation.

The concept "pre-amorphization" is explained here. Let it be assumed that amorphization of a certain region in a semiconductor substrate and implantation into that region of an impurity having a polarity, i.e. a conductivity type, (e.g. implantation of B ions or other ions) are executed. In this case, it is conceivable that the amorphization and the impurity implantation may be executed in this order. In this case, the amorphization may be referred to as "pre-amorphization". Ion implantation after amorphizing a substrate suppress channeling during the ion implantation, so that a shallow implantation distribution may be formed. Specifically, an implantation distribution whose so-called tailing is small may be formed. Then, executing annealing later effects solid-phase epitaxial regrowth by which an amorphous layer recovers to a crystal layer, bringing about a high activation rate of an impurity and a shallow junction depth. In the present manufacturing method example, it can be said that pre-amorphization preceding B ion implantation for forming the first extension diffusion layers 306a and 306b is done.

Figure 11A:
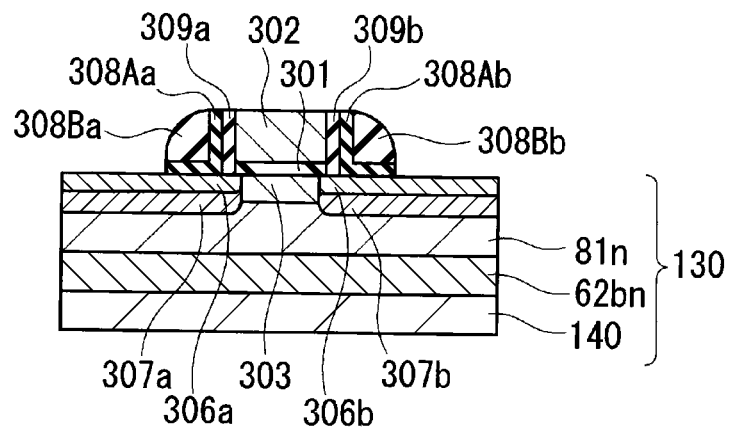
FIGS. 11A to 11C are cross-sectional views showing the method for manufacturing a transistor according to the first configuration example.

Next, a first insulator film composed of silicon oxide with a film thickness of approximately 10 nm and a second insulator film composed of silicon nitride with a film thickness of approximately 40 nm are sequentially deposited all over the surface of the semiconductor substrate 130 including the offset spacers 309a and 309b and the gate electrode 302, for example, by a chemical vapor deposition (CVD) method. After that, the first and second insulator films thus deposited are subjected to anisotropic etching, whereby as shown in FIG. 11A, the first side walls 308Aa and 308Ab are formed from the first insulator film and the second side walls 308Ba and 308Bb are formed from the second insulator film over side surfaces of the gate electrode 302 in a direction parallel with a gate length. Note here that the second side walls 308Ba and 308Bb may be composed of silicon oxide instead of silicon nitride or, furthermore, may be formed by a film stack composed of silicon oxide and silicon nitride.

Figure 11B:
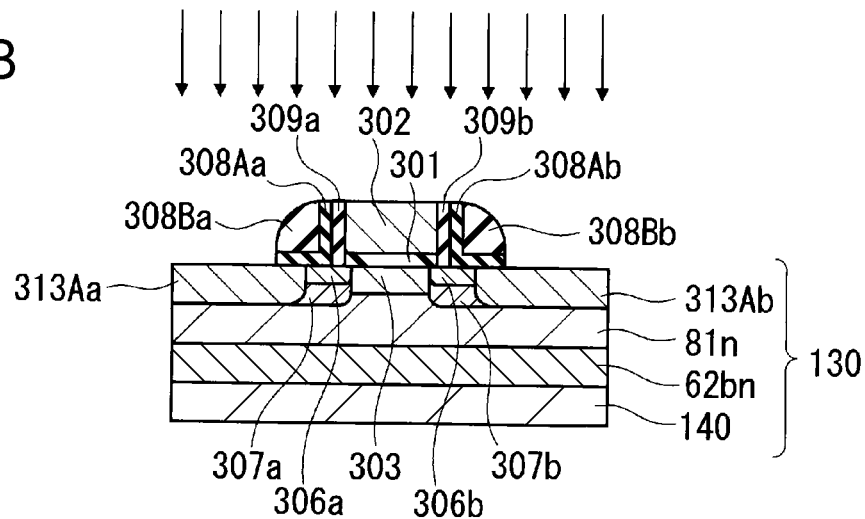

Next, as shown in FIG. 11B, second P-type impurity-implanted layers 313Aa and 313Ab are formed by implanting a P-type impurity, i.e. boron ions, into the semiconductor substrate 130 with an implantation energy of approximately 3 keV and in an implantation dose amount of approximately $3 \times 10^{15}$/cm' with the gate electrode 302, the offset spacers 309a and 309b, the first side walls 308Aa and 308Ab, and the second side walls 308Ba and 308Bb as masks.

Figure 11C:
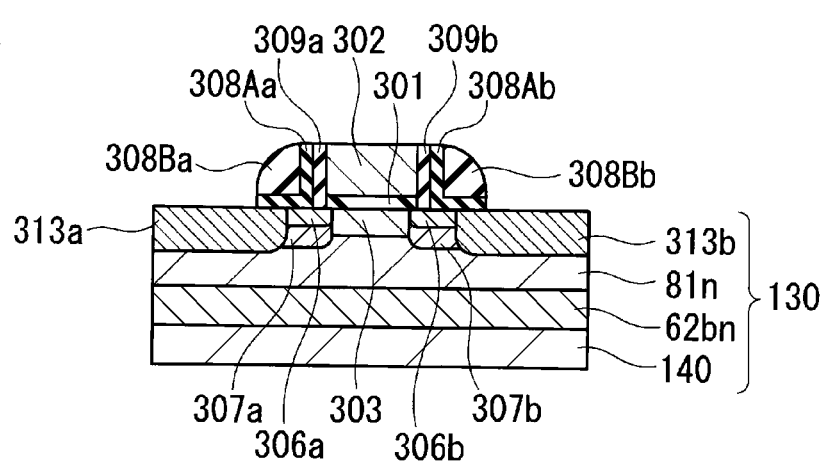

Next, as shown in FIG. 11C, the semiconductor substrate 130 is subjected to third rapid thermal processing that heats the substrate to a temperature of 1200° C. to 1350° C., for example, by laser annealing and keeps the substrate near the peak temperature for approximately 1 ms. This third rapid thermal processing causes the P-type source-drain diffusion layers 313a and 313b to be formed in regions in the semiconductor substrate 130 lateral to the first side walls 308Aa and 308Ab and the second side walls 308Ba and 308Bb. The P-type source-drain diffusion layers 313a and 313b are P-type high-concentration impurity diffused layers, formed by diffusion of boron ions and connected to the first extension diffusion layers 306a and 306b, that have deeper junction planes than the first extension diffusion layers 306a and 306b. Although laser annealing is used in the millisecond rapid thermal processing here, a so-called millisecond annealing (MSA) method such as flash lamp annealing may be used. Further, the third rapid thermal processing may involve the use of annealing that raises the temperature to approximately 850° C. to 1050° C. at a temperature rise rate of approximately 200° C./sec to 250° C./sec and keeps the peak temperature for a maximum of approximately ten seconds or does not keep the peak temperature, e.g. spike-RTA.

The second rapid thermal processing, which is shown in FIG. 10D, may be omitted. In that case, the third rapid thermal processing also serves as the second rapid thermal processing.

Thus, according to the present manufacturing method example, before ion implantation for use in the formation of extension diffusion layers is executed with low energy in the step of forming the first P-type impurity-implanted layers 306Aa and 306Ab as shown in FIG. 10C, the semiconductor substrate 130 is amorphized by germanium in the step shown in FIG. 10A and then carbon is implanted as an impurity for use in the prevention of diffusion in the step shown in FIG. 10B. Carbon has an effect of inhibiting transient enhanced diffusion (TED) of impurity atoms. Carbon is effective in the formation of the respective shallow diffusion layers of a p-type field-effect transistor (pFET) and an n-type field-effect transistor (nFET), as carbon greatly inhibits the diffusion of boron and phosphorus.

Since carbon is co-implanted into the regions of formation of the first extension diffusion layers 306a and 306b, carbon plays a role of eliminating enhanced point defects in the semiconductor substrate 130. This reduces enhanced point defects introduced by ion implantation and inhibits TED of atoms of impurities such as boron and phosphorus, making it possible to keep the junction depth of each diffusion layer shallow.

For the reason noted above, implanting carbon in such a way as to satisfy the aforementioned condition makes it possible to surely form low-resistance first extension diffusion layers 306a and 306b with shallow junctions, reduced junction leaks, and suppressed increases in value of resistance due to dose loss.

As noted above, heat treatment for heating the pixel region R1 is executed, and the first peripheral region R2 may be heated too by that heat treatment. However, even in a case where such heat treatment is executed, a diffusion-suppressing effect based on carbon implantation and an associated effect are brought about.

In one specific example, an interlayer film is deposited in both the pixel region R1 and the first peripheral region R2 after the activation thermal processing of FIG. 11C. The interlayer film is for example an NSG (non-doped silicate glass) film. Next, an opening is formed in the interlayer film in the pixel region R1. After the formation of the opening, implantation of, for example, a impurity region that constitutes the charge accumulation region Z may be executed in the pixel region R1. Next, open plug portions are embedded in the pixel region R1 by depositing polysilicon so that the opening is filled. The polysilicon may be doped with phosphorus. Next, the pixel region R1, including the plug portions, is subjected to heat treatment. This heat treatment is executed, for example, for approximately ten minutes at 850° C. This heat treatment causes the first peripheral region R2 to be heated too. However, in the first peripheral region R2, the diffusion-suppressing effect based on carbon implantation inhibits the redistribution of the impurity, making it possible to maintain the shallow junction.

Even with attention focused only on the manufacture of the first peripheral transistor 27 of the first peripheral region R2, the diffusion-suppressing effect based on carbon implantation is effective. Furthermore, as noted above, even in a case where an additional step of heat treatment for heating the pixel region R1 is executed, the diffusion-suppressing effect based on carbon implantation may be exerted.

It should be noted that only phosphorus (P) may be used in the first pocket diffusion layers 307a and 307b, which are N-type pocket diffusion layers. Using phosphorus is more effective in preventing the diffusion of carbon ions than using arsenic (As).

A transistor according to the present disclosure and a method for manufacturing the same can achieve reductions in junction depth and resistance of an extension diffusion layer along with miniaturization, and are effective in a MIS transistor having high driving force and a method for manufacturing the same.

Transistors of Pixel Region R1 and First Peripheral Region R2

The following further describes the transistors of the pixel region R1 and the first peripheral region R2 with reference to FIGS. 13 to 24. It should be noted that FIGS. 13 to 24 omit to illustrate the blocking regions 200A and 200B.

In the following, the previously-used terms are sometimes replaced by different terms. For example, one of the P-type source-drain diffusion layers 313a and 313b is sometimes referred to as "source", and the other as "drain".

In the following, the P-type source-drain diffusion layer 313a, which serves as the source of the first peripheral transistor 27, is sometimes referred to as "first source". The P-type source-drain diffusion layer 313b, which serves as the drain of the first peripheral transistor 27, is sometimes referred to as "first drain".

Figure 18:
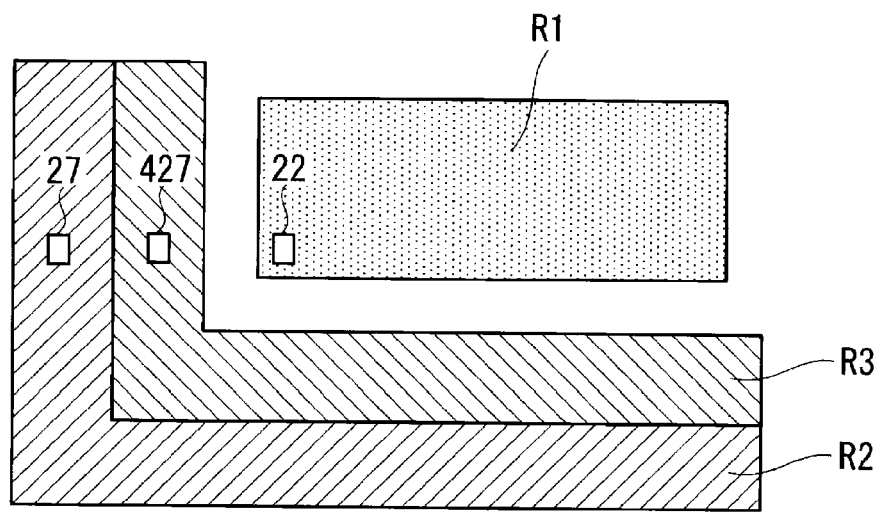
FIG. 18 is a schematic plan view showing a transistor of a pixel region and transistors of peripheral regions.
Figure 19:
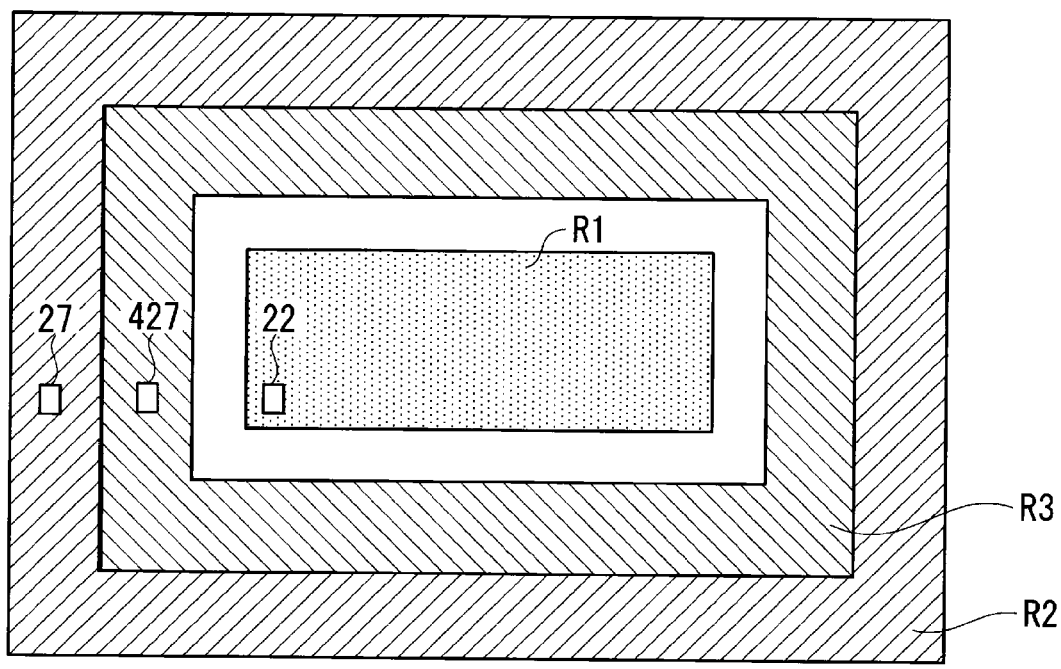
FIG. 19 is a schematic plan view showing a transistor of a pixel region and transistors of peripheral regions.

As shown in FIGS. 18 and 19, the imaging device may include a second peripheral region R3 located between the pixel region R1 and the first peripheral region R2 in plan view.

One semiconductor substrate 130 may spread over both the pixel region R1 and the first peripheral region R2, or the pixel region R1 may be constituted using one semiconductor substrate and the first peripheral region R2 may be constituted using another semiconductor substrate. One semiconductor substrate 130 may spread astride three regions, namely the pixel region R1, the first peripheral region R2, and the second peripheral region R3, or the pixel region R1 may be constituted using one semiconductor substrate, the first peripheral region R2 may be constituted using another semiconductor substrate, and the second peripheral region R3 may be constituted using still another semiconductor substrate. One semiconductor substrate 130 may spread astride the pixel region R1 and the first peripheral region R2, and the second peripheral region R3 may be constituted using another semiconductor substrate. Further, the pixel region R1 may be constituted using one semiconductor substrate, and one semiconductor substrate 130 may spread astride the first peripheral region R2 and the second peripheral region R3. Thus, the imaging device may have at least one semiconductor substrate.

In the following, the terms "pixel substrate portion", "first substrate portion", and "second substrate portion" are sometimes used. The term "pixel substrate portion" refers to a portion of at least one semiconductor substrate 130 that belongs to the pixel region R1. The term "first substrate portion" refers to a portion of at least one semiconductor substrate 130 that belongs to the first peripheral region R2. The term "second substrate portion" refers to a portion of at least one semiconductor substrate 130 that belongs to the second peripheral region R3.

The pixel substrate portion may be referred to specifically as "pixel semiconductor substrate portion". The first substrate portion may be referred to specifically as "first semiconductor substrate portion". The second substrate portion may be referred to specifically as "second semiconductor substrate portion".

The term "pixel transistor" is described. A pixel transistor is a transistor that the pixel region R1 has. For example, an amplifying transistor 22, an address transistor 24, and a reset transistor 26 may fall under the category of pixel transistors. FIGS. 13 to 32 illustrate an amplifying transistor 22 as a pixel transistor. Further, the following describes a case where a pixel transistor is an amplifying transistor 22. Note, however, that unless otherwise noted, the term "amplifying transistor 22" can be read as "pixel transistor, "address transistor 24", or "reset transistor 26" in the following description. Elements, such as a source and a drain, that a transistor has and elements, such as wires, associated with a transistor may be read as appropriate.

Figure 13:
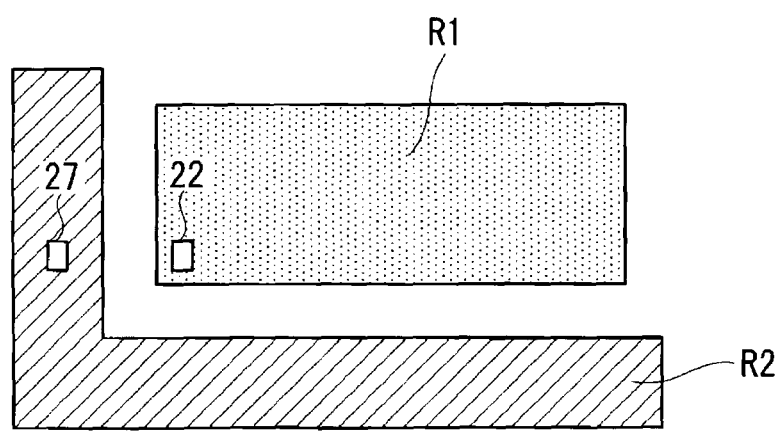
FIG. 13 is a schematic plan view showing a transistor of a pixel region and a transistor of a peripheral region.
Figure 14:
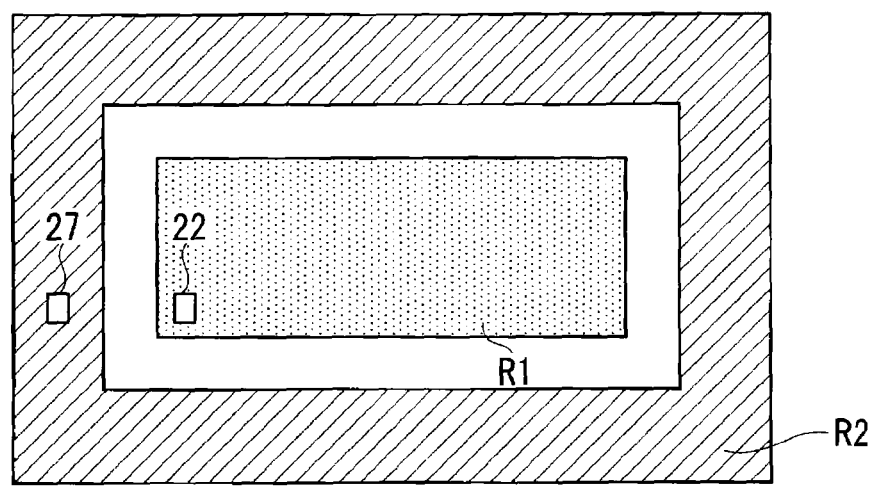
FIG. 14 is a schematic plan view showing a transistor of a pixel region and a transistor of a peripheral region.

FIG. 13 schematically shows an amplifying transistor 22 in the pixel region R1 and a first peripheral transistor 27 in the first peripheral region R2 in a case where the configuration of FIG. 1 is adopted. FIG. 14 schematically shows an amplifying transistor 22 in the pixel region R1 and a first peripheral transistor 27 in the first peripheral region R2 in a case where the configuration of FIG. 4 is adopted.

In each of the examples shown in FIGS. 13 and 14, the first peripheral region R2 is located outside the pixel region R1. Specifically, the first peripheral region R2 is located outside the pixel region R1 in plan view.

Figure 15:
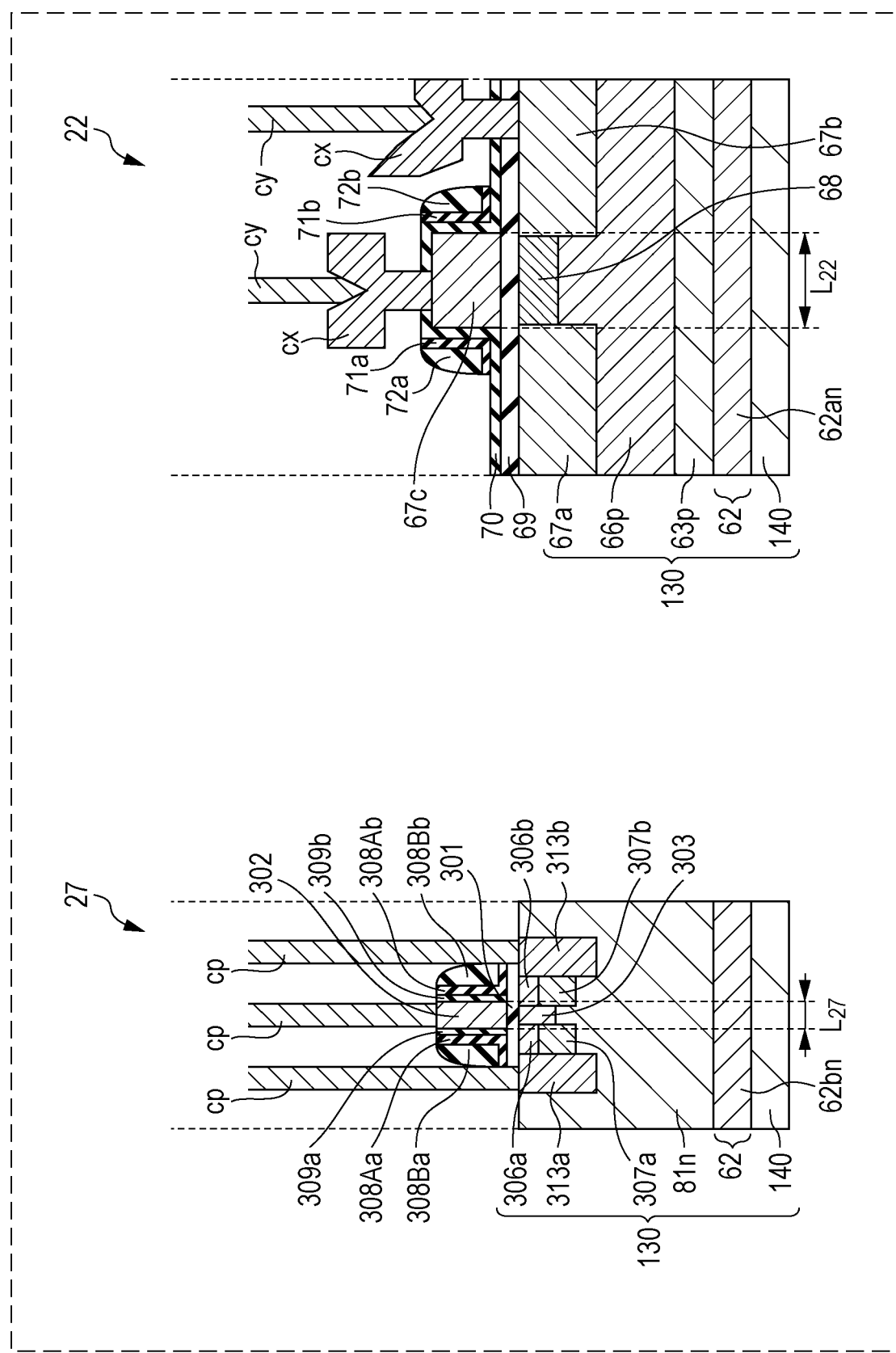
FIG. 15 illustrates schematic cross-sectional views showing a transistor of a pixel region and a transistor of a peripheral region.

FIG. 15 shows configurations that the amplifying transistor 22 in the pixel region R1 and the first peripheral transistor 27 in the first peripheral region R2 may have in each of the examples shown in FIGS. 13 and 14. In the example shown in FIG. 15, the amplifying transistor 22 is an N-channel MOSFET, and the first peripheral transistor 27 is a P-channel MOSFET. Note, however, that as mentioned above, these transistors are not limited to particular conductivity types. In this respect, the same applies to the after-mentioned transistors 427, 727, and 827.

In the example shown in FIG. 15, the first peripheral transistor 27 is similar to that described with reference to FIG. 5. Note, however, that in the example shown in FIG. 15, another transistor may be employed instead of the first peripheral transistor 27. For example, a transistor described with reference to FIG. 6, 7, or 8 may be employed.

In the example shown in FIG. 15, a contact plug cp is connected to the P-type source-drain diffusion layer 313a, which serves as the source of the first peripheral transistor 27. A contact plug cp is connected to the P-type source-drain diffusion layer 313b, which serves as the drain of the first peripheral transistor 27. A contact plug cp is connected to the gate electrode 302 of the first peripheral transistor 27.

In one example, the contact plugs cp are metal plugs. Examples of metal that the contact plugs cp may contain include tungsten and copper.

In the example shown in FIG. 15, the amplifying transistor 22 has a source 67a, a drain 67b, and a gate electrode 67c. The source 67a is an n-type impurity region. The drain 67b is an n-type impurity region. The gate electrode 67c is made, for example, of a polysilicon material.

A channel diffusion layer 68 is formed between the source 67a and the drain 67b. The channel diffusion layer 68 is an n-type impurity region.

A gate insulator film 69 is formed between the gate electrode 67c and the pixel substrate portion. Specifically, the gate insulator film 69 is an oxide film. In one example, the gate insulator film 69 contains silicon oxide, and in one specific example, the gate insulator film 69 contains silicon dioxide.

An offset spacer 70 is formed over the gate electrode 67c and the gate insulator film 69. In one example, the offset spacer 70 contains silicon oxide, and in one specific example, the offset spacer 70 contains silicon dioxide.

A first side wall 71a is formed on a portion of the offset spacer 70 beside the source 67a. In the example shown in FIG. 15, the first side wall 71a has an L-shaped cross-section. A second side wall 72a is formed on an outer side of the first side wall 71a.

A first side wall 71b is formed on a portion of the offset spacer 70 beside the drain 67b. In the example shown in FIG. 15, the first side wall 71b has an L-shaped cross-section. A second side wall 72b is formed on an outer side of the first side wall 71b.

In one example, the first side wall 71a contains silicon oxide, and in one specific example, the first side wall 71a contains silicon dioxide. In this respect, the same applies to the first side wall 71b. In one example, the second side wall 72a has a stacked structure including a plurality of insulating layers, and in one specific example, the second side wall 72a includes a silicon dioxide layer and a silicon nitride layer. In this respect, the same applies to the second side wall 72b.

The offset spacer 70 has a through-hole formed over the gate electrode 67c. A contact plug cx is connected to the gate electrode 67c via the through-hole. The gate insulator film 69 and the offset spacer 70 have through-holes formed over the drain 67b. A contact plug cx is connected to the drain 67b via the through-holes.

The contact plugs cx are for example polysilicon plugs. The contact plugs cx may be doped with an impurity such as phosphorus for higher electric conductivity.

It should be noted that an embodiment in which a contact plug cx is connected to the source 67a may be adopted. Specifically, the gate insulator film 69 and the offset spacer 70 have through-holes formed over the source 67a, and a contact plug cx is connected to the source 67a via the through-holes.

The contact plug cx connected to the gate electrode 67c is connected to a plug cy. The contact plug cx connected to the drain 67b is connected to a plug cy. In a case where a contact plug cx connected to the source 67a is present, the contact plug cx may be connected to a plug cy.

In one example, the plugs cy are metal plugs. Examples of metal that the contact plugs cy may contain include tungsten and copper.

As can be understood from the description with reference to FIGS. 1 to 15, an imaging device according to the present embodiment includes a pixel region R1 and a first peripheral region R2. The first peripheral region R2 is located outside the pixel region R1. Specifically, the first peripheral region R2 is located outside the pixel region R1 in plan view. The term "plan view" means a view as seen from a direction perpendicular to a semiconductor substrate 130, a first substrate portion, a second substrate portion, or a pixel substrate portion. The pixel region R1 has an amplifying transistor 22. The first peripheral region R2 has a first peripheral transistor 27. In one example, the first peripheral transistor 27 is a logic transistor. The first peripheral transistor 27 may be a planar transistor, or may be a three-dimensional structural transistor such as a FinFET (fin field-effect transistor).

In the present embodiment, the amplifying transistor 22 outputs a signal voltage corresponding to signal charge obtained by photoelectric conversion. The photoelectric conversion is carried out in a photoelectric conversion layer 12. Specifically, there are provided a path that leads the signal charge from the photoelectric conversion layer 12 to a charge accumulation region Z and a path that leads the signal charge from the charge accumulation region Z to a gate electrode 67c of the amplifying transistor 22. In the example shown in FIG. 3, the charge accumulation region Z corresponds to an impurity region 60n. As mentioned above, the charge accumulation region Z is included in a charge accumulation node FD.

In FIG. 15, reference sign $L_{22}$ denotes the gate length of the amplifying transistor 22. Reference sign $L_{27}$ denotes the gate length of the first peripheral transistor 27. In the present embodiment, the gate length $L_{27}$ of the first peripheral transistor 27 is shorter than the gate length $L_{22}$ of the amplifying transistor 22.

The ratio $L_{27}/L_{22}$ of the gate length $L_{27}$ of the first peripheral transistor 27 to the gate length $L_{22}$ of the amplifying transistor 22 is for example lower than or equal to 0.8, or may be lower than or equal to 0.34. This ratio is for example higher than or equal to 0.01, or may be higher than or equal to 0.05.

The term "gate length" here refers to a dimension of a gate electrode in a direction from a source to a drain or from the drain to the source. The term "gate width" refers to a dimension of a gate electrode in a direction orthogonal to a direction parallel with a gate length in plan view. The direction orthogonal to a direction parallel with a gate length in plan view may also be referred to as "depth direction".

In the present embodiment, the gate insulator film 301 of the first peripheral transistor 27 is thinner than the gate insulator film 69 of the amplifying transistor 22.

The ratio $T_{301}/T_{69}$ of the thickness $T_{301}$ of the gate insulator film 301 of the first peripheral transistor 27 to the thickness $T_{69}$ of the gate insulator film 69 of the amplifying transistor 22 is for example lower than or equal to 0.7, or may be lower than or equal to 0.36. This ratio is for example higher than or equal to 0.1, or may be higher than or equal to 0.2.

In one example, the first peripheral transistor 27 has a first specific layer. The first specific layer is located within the first substrate portion. The first specific layer contains a conductive impurity and a specific species.

The conductive impurity is an impurity having a conductivity type. That is, the conductive impurity is a p-type or n-type impurity.

In the present embodiment, the specific species is at least one type of impurity that contributes to the suppression of the transient enhanced diffusion of the conductive impurity. The specific species may contain at least one selected from the group consisting of carbon, nitrogen, and fluorine. Carbon, nitrogen, and fluorine may inhibit the transient enhanced diffusion of the conductive impurity. That is, the specific species may contain at least one type of impurity that inhibits the transient enhanced diffusion of the conductive impurity. Further, the specific species may contain at least one selected from the group consisting of germanium, silicon, and argon. Germanium, silicon, and argon may be a trace of pre-amorphization that may enhance the diffusion-suppressing effect on the conductive impurity by an impurity exemplified by carbon. That is, the specific species may contain at least one type of impurity that is a trace of pre-amorphization that may enhance the diffusion-suppressing effect on the conductive impurity by an impurity exemplified by carbon. In the aforementioned example, the specific species may also be referred to as "co-implanted species".

As noted above, the first specific layer contains the conductive impurity and the specific species. A technique involving the use of such a first specific layer is suitable to improving the performance of the imaging device in consideration of the presence of the first peripheral transistor 27 in the first peripheral region R2.

In one example, the first peripheral transistor 27 has the P-type source-drain diffusion layer 313a, which serves as the first source, and the P-type source-drain diffusion layer 313b, which serves as the first drain. At least one of the P-type source-drain diffusion layer 313a, which serves as the first source, and the P-type source-drain diffusion layer 313b, which serves as the first drain, includes the first specific layer.

In one example, the first peripheral transistor 27 has a first extension diffusion layer EX1. The first extension diffusion layer EX1 is adjacent to the P-type source-drain diffusion layer 313a, which serves as the first source, or the P-type source-drain diffusion layer 313b, which serves as the first drain. The first extension diffusion layer EX1 is shallower than the P-type source-drain diffusion layer 313a, which serves as the first source, and the P-type source-drain diffusion layer 313b, which serves as the first drain. The first extension diffusion layer EX1 includes the first specific layer. The first extension diffusion layer EX1 is the first extension diffusion layer 306a or the first extension diffusion layer 306b.

The expression "an extension layer and a source are adjacent to each other" specifically means that the extension diffusion layer and the source are connected to each other. The same applies to similar expressions such as the expression "an extension diffusion layer and a drain are adjacent to each other", the expression "a pocket diffusion layer and a source are adjacent to each other", and the expression "a pocket diffusion layer and a drain are adjacent to each other", each of which specifically means that those elements are connected to each other.

The sentence "the first extension diffusion layer EX1 is shallower than the P-type source-drain diffusion layer 313a, which serves as the first source, and the P-type source-drain diffusion layer 313b, which serves as the first drain" means that the deepest portion of the first extension diffusion layer EX1 is at a shallower depth than the deepest portions of the P-type source-drain diffusion layer 313a, which serves as the first source, and the P-type source-drain diffusion layer 313b, which serves as the first drain, in a direction parallel with the depth of the first substrate portion. In this context, the word "shallow" can also be referred to as "shallow in junction depth". Boundaries of an extension diffusion layer, a source, and a drain are junctions. A junction is a place where the concentration of an N-type impurity and the concentration of a P-type impurity are equal to each other.

In the illustrated example, the first peripheral transistor 27 has the first extension diffusion layer 306a and the first extension diffusion layer 306b. The first extension diffusion layer 306a is adjacent to the P-type source-drain diffusion layer 313a, which serves as the first source. The first extension diffusion layer 306a is shallower than the P-type source-drain diffusion layer 313a, which serves as the first source, and the P-type source-drain diffusion layer 313b, which serves as the first drain. The first extension diffusion layer 306b is adjacent to the P-type source-drain diffusion layer 313b, which serves as the first drain. The first extension diffusion layer 306b is shallower than the P-type source-drain diffusion layer 313a, which serves as the first source, and the P-type source-drain diffusion layer 313b, which serves as the first drain. The first extension diffusion layer 306a and the first extension diffusion layer 306b include the first specific layer.

In one example, the first peripheral transistor 27 has a first pocket diffusion layer P1. The first pocket diffusion layer P1 is adjacent to the P-type source-drain diffusion layer 313a, which serves as the first source, or the P-type source-drain diffusion layer 313b, which serves as the first drain. The first pocket diffusion layer P1 includes the first specific layer. The first pocket diffusion layer P1 is the first pocket diffusion layer 307a or the first pocket diffusion layer 307b.

In the illustrated example, the first peripheral transistor 27 has the first pocket diffusion layer 307a and the first pocket diffusion layer 307b. The first pocket diffusion layer 307a is adjacent to the P-type source-drain diffusion layer 313a, which serves as the first source. The first pocket diffusion layer 307b is adjacent to the P-type source-drain diffusion layer 313b, which serves as the first drain. The first pocket diffusion layer 307a and the first pocket diffusion layer 307b include the first specific layer.

Only one selected from among the P-type source-drain diffusion layer 313a, which serves as the first source, the P-type source-drain diffusion layer 313b, which serves as the first drain, the first extension diffusion layer EX1, and the first pocket diffusion layer P1 may include the first specific layer. Specifically, only one selected from among the P-type source-drain diffusion layer 313a, which serves as the first source, the P-type source-drain diffusion layer 313b, which serves as the first drain, the first extension diffusion layer 306a, the first extension diffusion layer 306b, the first pocket diffusion layer 307a, and the first pocket diffusion layer 307b may include the first specific layer.

Two or more selected from among the P-type source-drain diffusion layer 313a, which serves as the first source, the P-type source-drain diffusion layer 313b, which serves as the first drain, the first extension diffusion layer EX1, and the first pocket diffusion layer P1 may include the first specific layer. Specifically, two or more selected from among the P-type source-drain diffusion layer 313a, which serves as the first source, the P-type source-drain diffusion layer 313b, which serves as the first drain, the first extension diffusion layer 306a, the first extension diffusion layer 306b, the first pocket diffusion layer 307a, and the first pocket diffusion layer 307b may include the first specific layer. In a case where these selected two or more include the first specific layer, these may include the same or different types of specific species. For example, the specific species of the P-type source-drain diffusion layer 313a, which serves as the first source, may be carbon, and the specific species of the first extension diffusion layer EX1 may be nitrogen and fluorine. Further, in this case, these may include the same or different conductivity types of conductive impurity. For example, one of the P-type source-drain diffusion layer 313a, which serves as the first source, and the first pocket diffusion layer P1 may contain boron whose conductivity type is a p type, and the other may contain phosphorus whose conductivity type is an n type.

As can be understood from the foregoing description, the imaging device may have one or more first specific layers.

The following describes an example of a situation in which a technique involving the use of a first specific layer may contribute to such improvement in performance as that noted above.

In the process of manufacturing the imaging device, heat treatment may be executed. The heat treatment may reduce detects in the pixel substrate portion in the pixel region R1. Reducing defects may reduce dark current in the imaging device. Meanwhile, in the first peripheral region R2, the necessity to reduce defects is not necessarily great. On the contrary, in the first peripheral region R2, there is a case where it is necessary to reduce deterioration in performance of the first peripheral transistor 27 attributed to the diffusion of the conductive impurity entailed by the heat treatment. The deterioration in performance is for example an undesirable change in threshold voltage of the first peripheral transistor 27.

In particular, in the present embodiment, the first peripheral transistor 27 includes at least one of a first feature and a second feature. The first feature is such a feature that the gate length $L_{27}$ of the first peripheral transistor 27 is shorter than the gate length $L_{22}$ of the amplifying transistor 22. The second feature is such a feature that the gate insulator film 301 of the first peripheral transistor 27 is thinner than the gate insulator film 69 of the amplifying transistor 22. In a case where the first peripheral transistor 27 includes at least one of the first feature and the second feature, the performance of the first peripheral transistor 27 is susceptible to diffusion redistribution of the conductive impurity due to additional thermal processing.

In this respect, as mentioned above, in one example of the present embodiment, the first specific layer contains the conductive impurity and the specific species. The specific species may contribute to the suppression of the diffusion of the conductive impurity. This diffusion-suppressing effect may reduce the deterioration in performance of the first peripheral transistor 27. This makes it possible to, while enjoying the aforementioned advantage called "dark-current reduction", mitigate the aforementioned disadvantage called "deterioration in performance of the first peripheral transistor 27".

Specifically, let thought be given to a first specific example in which the first specific layer is included in the first extension diffusion layer EX1 and the gate length $L_{27}$ of the first peripheral transistor 27 is shorter than the gate length $L_{22}$ of the amplifying transistor 22. In the process of manufacturing the imaging device, heat treatment may be executed. The heat treatment may reduce detects in the pixel substrate portion in the pixel region R1. Reducing defects may reduce dark current in the imaging device. Meanwhile, in a case where $L_{27}<L_{22}$, the heating more easily exert a short channel effect in the first peripheral transistor 27 than in the amplifying transistor 22. The short channel effect may change the threshold voltage of a transistor from a desired value and invite a decrease in performance of the transistor. Thus, the heat treatment may bring about an advantage in that dark current is reduced in the pixel region R1 and, on the other hand, bring about an disadvantage in that the short channel effect becomes obvious in the first peripheral region R2. The term "threshold voltage" here refers to the gate-source voltage of the transistor at which a drain current starts to flow through the transistor.

In this respect, in the first specific example, the first extension diffusion layer EX1 contains the conductive impurity and the specific species. The specific species may contribute to the suppression of the diffusion of the conductive impurity. This diffusion-suppressing effect may suppress the short channel effect in the first peripheral transistor 27. This makes it possible to, while enjoying the aforementioned advantage called "dark-current reduction", mitigate the aforementioned disadvantage called "short channel effect".

As noted above, in the first specific example, the diffusion-suppressing effect derived from the specific species of the first extension diffusion layer EX1 suppresses the short channel effect of the first peripheral transistor 27 attributed to thermal processing. This means that a margin of a thermal budget of thermal processing becomes wider than in the absence of the diffusion-suppressing effect. Therefore, increasing the duration, temperature, or other conditions of thermal processing makes it possible to reduce dark current in the pixel region R1 without making the short channel effect obvious in the first peripheral transistor 27.

Let thought be given to a second specific example in which the first specific layer is included in at least one of the P-type source-drain diffusion layer 313a, which serves as the first source, and the P-type source-drain diffusion layer 313b, which serves as the first drain, and the gate length $L_{27}$ of the first peripheral transistor 27 is shorter than the gate length $L_{22}$ of the amplifying transistor 22. In the second specific example too, as in the case of the first specific example, increasing the duration, temperature, or other conditions of thermal processing makes it possible to reduce dark current in the pixel region R1 without making the short channel effect obvious in the first peripheral transistor 27.

Let thought be given to a third specific example in which the first specific layer is included in the first pocket diffusion layer P1 and the gate length $L_{27}$ of the first peripheral transistor 27 is shorter than the gate length $L_{22}$ of the amplifying transistor 22. In the third specific example, variations in the threshold voltage of the first peripheral transistor 27 may be reduced by the suppression of the diffusion of the conductive impurity of the first pocket diffusion layer P1. For this reason, according to the third specific example, as in the case of the first specific example, increasing the duration, temperature, or other conditions of thermal processing makes it possible to reduce dark current in the pixel region R1 without making the variations in the threshold voltage of the first peripheral transistor 27 obvious.

As mentioned above, the semiconductor substrate 130 may be a substrate having a semiconductor layer provided on a surface thereof by epitaxial growth. The same applies to the pixel substrate portion, the first substrate portion, and the second substrate portion. In a semiconductor substrate derived from epitaxial growth, unintended inclusion of carbon is easily reduced. This may contribute to reduction of dark current in the pixel region R1. This also makes it easy to make a difference in concentration of the specific species, such as carbon, between the pixel region R1 and the first peripheral region R2.

As mentioned above, the semiconductor substrate 130 may be a p-type silicon substrate. Note, however, that the semiconductor substrate 130 may be an n-type silicon substrate. The same applies to the pixel substrate portion, the first substrate portion, and the second substrate portion.

In one example, the pixel region R1 has the pixel substrate portion and the photoelectric conversion layer 12. The photoelectric conversion layer 12 is stacked over the pixel substrate portion. In a typical example, in a case where a pixel region R1 having such a configuration is fabricated, such thermal processing as noted above is executed. For this reason, an imaging device including a pixel region R1 having this configuration may enjoy the effect of reducing dark current while reducing the deterioration in performance of the first peripheral transistor 27. It should be noted that the concept "the photoelectric conversion layer 12 is stacked over the pixel substrate portion" encompasses an embodiment in which an element such as an insulating layer is interposed between the photoelectric conversion layer 12 and the pixel substrate portion. It can also be said that the photoelectric conversion layer 12 is supported by the pixel substrate portion.

In one example, the amplifying transistor 22 and the first peripheral transistor 27 are provided in a single semiconductor substrate 130. In an imaging device having such a configuration, the first peripheral region R2 is easily heated by heat treatment for heating the pixel region R1. An imaging device having such a configuration easily enjoy the effect of reducing dark current while reducing the deterioration in performance of the first peripheral transistor 27. Typically, in an imaging device having such a configuration, the first peripheral region R2 is heated simultaneously during heat treatment for heating the pixel region R1.

The photoelectric conversion layer 12 may be a panchromatic film. Alternatively, the photoelectric conversion layer 12 may be a film, such as an orthochromatic film, that does not have sensitivity to light in a certain range of wavelengths.

The conductive impurity may be a P-type impurity. Examples of P-type conductive impurities include boron and indium. Alternatively, the conductive impurity may be an N-type impurity. Examples of N-type impurities include phosphorus, arsenic, antimony, and bismuth.

The first source, the first drain, the first extension diffusion layer EX1 may have a conductive impurity of a first conductivity type. The same applies to the first extension diffusion layer 306a and the first extension diffusion layer 306b. On the other hand, the first pocket diffusion layer P1 may have a conductive impurity of a second conductivity type. The same applies to the first pocket diffusion layer 307a and the first pocket diffusion layer 307b. The first conductivity type is an n type or a p type. Further, the second conductivity type is the opposite of the first conductivity type. The second conductivity type is a p type or an n type.

In one example, the first peripheral transistor 27 is a logic transistor. The first peripheral transistor 27 can perform a digital operation. In such a first peripheral transistor 27, priority may be placed on speed. In order for a transistor to operate at high speed, it is advantageous for the transistor to be a fine transistor. Further, from the point of view of securing the transistor high driving force too, it is advantageous for the transistor to be a fine transistor. In this respect, in this specific example, the gate length $L_{27}$ of the first peripheral transistor 27 is shorter than the gate length $L_{22}$ of the amplifying transistor 22. Further, the gate insulator film 301 of the first peripheral transistor 27 is thinner than the gate insulator film 69 of the amplifying transistor 22. From the point of view of causing the first peripheral transistor 27 to operate at high speed and with high driving force, it may be advantageous for the gate length $L_{27}$ to be short and for the gate insulator film 301 to be thin. This advantage brought by the gate length $L_{27}$ being short and the gate insulator film 301 being thin may be exerted, for example, in a case where the first peripheral transistor 27 is a planar transistor. Further, the first peripheral transistor 27 of this specific example is located, for example, between a controller and a pixel driver.

In one example, the first specific layer contains germanium. As can be understood from the foregoing description, in the process of manufacturing the first peripheral transistor 27, germanium may pre-amorphize the inside of the first substrate portion. In a pre-amorphized region, the diffusion-suppressing effect on the conductive impurity by an impurity exemplified by carbon is easily enhanced. In this example, germanium may be a trace of pre-amorphization that may enhance the diffusion-suppressing effect on the conductive impurity by an impurity exemplified by carbon.

The first specific layer may contain silicon, argon, krypton, or xenon instead of or in addition to germanium. More generally, the first specific layer may contain at least one element selected from the group consisting of germanium, silicon, argon, krypton, and xenon. These elements may be traces of pre-amorphization that may enhance the diffusion-suppressing effect on the conductive impurity by an impurity exemplified by carbon.

In one example, the first peripheral transistor 27 include an end-of-range (EOR) defect. At least part of the first specific layer is located above the EOR defect and overlaps the EOR detect in plan view. In this context, the phrase "above the EOR defect" means a side, as seen from the EOR defect, of a surface of the first substrate portion over which the gate electrode 302 is provided. As noted above, in a pre-amorphized region in the first substrate portion, the diffusion-suppressing effect on the conductive impurity by an impurity exemplified by carbon is easily enhanced. As can be understood from the foregoing description, in a case where in the process of manufacturing the first peripheral transistor 27, thermal processing is executed with the first substrate portion in an amorphized state, an EOR defect may be formed in a region directly below the amorphous/crystal (a/c) interface before the thermal processing. In this example, the EOR defect may be a trace of pre-amorphization that may enhance the diffusion-suppressing effect on the conductive impurity by an impurity exemplified by carbon. The first specific layer in its entirety may be located above the EOR defect and overlaps the EOR defect in plan view.

In one example, the first peripheral transistor 27 includes a segregated portion in which the specific species is segregated in a direction parallel with the depth of the first substrate portion. At least part of the first specific layer is located above the segregated portion and overlaps the segregated portion in plan view. As noted above, in a pre-amorphized region in the first substrate portion, the diffusion-suppressing effect on the conductive impurity by an impurity exemplified by carbon is easily enhanced. In a case where in the process of manufacturing the first peripheral transistor 27, thermal processing is executed with the first substrate portion in an amorphized state, a segregated portion may be formed in a region directly below the amorphous/crystal (a/c) interface before the thermal processing. In this example, the segregated portion may be a trace of pre-amorphization that may enhance the diffusion-suppressing effect on the conductive impurity by an impurity exemplified by carbon. The first specific layer in its entirety may be located above the segregated portion and overlaps the segregated portion in plan view. In the expression "segregated portion in which the specific species is segregated", the word "segregated" means that the specific species unevenly distributed, and is not intended to limit the process of forming the segregated portion.

The segregated portion is described with reference to a concentration profile serving as a relationship of the concentration of the specific species with a depth in the first substrate portion. In a case where the segregated portion is present, the concentration in the concentration profile takes on a minimal value at a first depth substantially corresponding to the depth of the amorphous/crystal (a/c) interface before thermal processing. The concentration in the concentration profile takes on a maximal value at a second depth that is deeper than the first depth. The segregated portion refers to a portion of the first substrate portion that is deeper than the first depth and in which the concentration of the specific species is higher than the minimal value. In the profile of carbon shown in FIG. 12B, the legend "ORIGINAL a/c INTERFACE" substantially corresponds to the first depth, and an upwardly-sticking portion directly below the legend "ORIGINAL a/c INTERFACE" corresponds to the segregated portion.

In the present embodiment, the pixel region R1 includes a charge accumulation region Z. In the charge accumulation region Z, charge generated by photoelectric conversion is accumulated. The charge accumulation region Z is an impurity region. In the example shown in FIG. 3, the charge accumulation region Z corresponds to the impurity region 60n. Specifically, photoelectric conversion is carried out in the photoelectric conversion structure 10, and the charge thus generated is sent to the charge accumulation region Z via a plug cy and a contact plug cx and accumulated in the charge accumulation region Z.

In one example, the segregated portion is shallower than the charge accumulation region Z. The clause "the segregated portion is shallower than the charge accumulation region Z" means that the deepest portion of the segregated portion is at a shallower depth than the deepest portion of the charge accumulation region Z in a direction parallel with the depth of the pixel substrate portion or the first substrate portion.

In one example, the concentration of carbon in the first specific layer is higher than the concentration of carbon in the charge accumulation region Z. Carbon in the first specific layer may inhibit the diffusion of the conductive impurity. Meanwhile, the presence of carbon in the charge accumulation region Z may cause dark current. Therefore, only a high-performance imaging device can have such a feature that the concentration of carbon in the first specific layer is higher than the concentration of carbon in the charge accumulation region Z. In the expression "the concentration of carbon in the first specific layer is higher than the concentration of carbon in the charge accumulation region Z", the concentration of carbon in the charge accumulation region Z may be zero, or may be higher than zero.

Note here that a boundary of the charge accumulation region Z is a junction. As mentioned above, a junction is a place where the concentration of an N-type impurity and the concentration of a P-type impurity are equal to each other.

According to a first definition, the phrase "concentration of carbon" in the expression "the concentration of carbon in the first specific layer is higher than the concentration of carbon in the charge accumulation region Z" is a maximum value of concentration. According to a second definition, the phrase "concentration of carbon" in this expression is an average concentration. In the aforementioned example, a case where it can be said on the basis of at least one of the first definition and the second definition that "the concentration of carbon in the first specific layer is higher than the concentration of carbon in the charge accumulation region Z" is treated as a case where "the concentration of carbon in the first specific layer is higher than the concentration of carbon in the charge accumulation region Z".

Let thought be given to a case where the specific species is carbon. The ratio C2/C1 of the concentration C2 of carbon in the first specific layer to the concentration C1 of carbon in the charge accumulation region Z is for example higher than or equal to $1\times10^5$. This ratio is for example lower than or equal to $1\times10^{11}$.

Let thought be given to a case where the specific species is carbon and the first specific layer is included in the first extension diffusion layer EX1. The concentration of the conductive impurity in the first extension diffusion layer EX1 is for example higher than or equal to $1\times10^{17}$ atoms/$cm^3$. The concentration of carbon in the first extension diffusion layer EX1 is for example higher than or equal to $1\times10^{17}$ atoms/$cm^3$. The concentration of the conductive impurity in the first extension diffusion layer EX1 is for example lower than or equal to $1\times10^{22}$ atoms/$cm^3$. The concentration of carbon in the first extension diffusion layer EX1 is for example lower than or equal to $1\times10^{22}$ atoms/$cm^3$. These descriptions may be applied to both the first extension diffusion layers 306a and 306b.

In one example, the concentration of carbon in the charge accumulation region Z is substantially zero. The clause "the concentration of carbon in the charge accumulation region Z is substantially zero" here means, for example, that the concentration of carbon in the charge accumulation region Z is lower than $5\times10^{16}$ atoms/$cm^3$. Intentionally-given carbon does not need to be present in the charge accumulation region Z. The concentration of carbon in the charge accumulation region Z may be 0 atoms/$cm^3$.

In one example, the concentration of carbon in the first specific layer is higher than the concentration of carbon under the gate of the amplifying transistor 22. This configuration is advantageous from the point of view of reducing dark current. The phrase "under the gate of the amplifying transistor 22" here refers to that portion of a surface of the pixel substrate portion facing the gate 67c which overlaps the gate 67c of the amplifying transistor 22 in plan view. In the expression "the concentration of carbon in the first specific layer is higher than the concentration of carbon under the gate of the amplifying transistor 22" the concentration of carbon under the gate of the amplifying transistor 22 may be zero, or may be higher than zero.

According to a first definition, the phrase "concentration of carbon" in the expression "the concentration of carbon in the first specific layer is higher than the concentration of carbon under the gate of the amplifying transistor 22" is a maximum value of concentration. According to a second definition, the phrase "concentration of carbon" in this expression is an average concentration. In the aforementioned example, a case where it can be said on the basis of at least one of the first definition and the second definition that "the concentration of carbon in the first specific layer is higher than the concentration of carbon under the gate of the amplifying transistor 22" is treated as a case where "the concentration of carbon in the first specific layer is higher than the concentration of carbon under the gate of the amplifying transistor 22".

In one example, the amplifying transistor 22 does not have an extension diffusion layer.

Incidentally, the gate electrode 302 of the first peripheral transistor 27 may be made, for example, of phosphorus-doped polysilicon. In that case, however, phosphorus may exude to the first substrate portion when the first peripheral region R2 is heated by heat treatment for heating the pixel region R1. In this respect, an imaging device according to one example has a high-κ metal gate constructed in the first peripheral transistor 27. This makes it possible to reduce or avoid the exudation of the impurity from the gate electrode 302 to the first substrate portion. This may contribute to the suppression of the short channel effect in the first peripheral transistor 27. Specifically, the high-κ metal gate can be constructed by the gate electrode 302, which is made of metal, and the gate insulator film 301, which is made of a high-κ material. The term "high-κ material" refers to a material having a higher dielectric constant than silicon dioxide. Examples of high-κ materials include hafnium (Hf), zirconium (Zr), and aluminum (Al). High-κ materials are also referred to as "high-dielectric-constant materials".

The first peripheral region R2 may include one or more first peripheral transistors 27.

Figure 16:
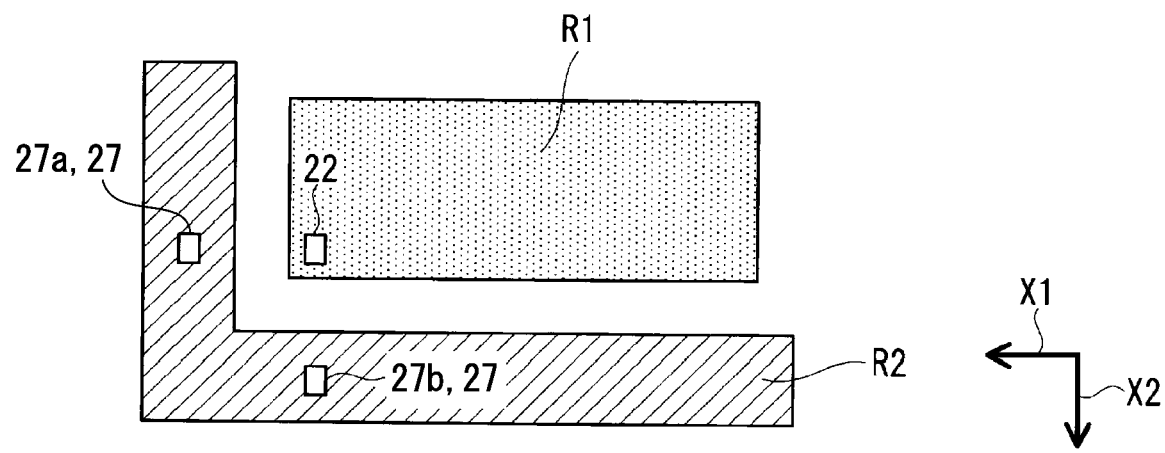
FIG. 16 is a schematic plan view showing a transistor of a pixel region and transistors of a peripheral region.
Figure 17:
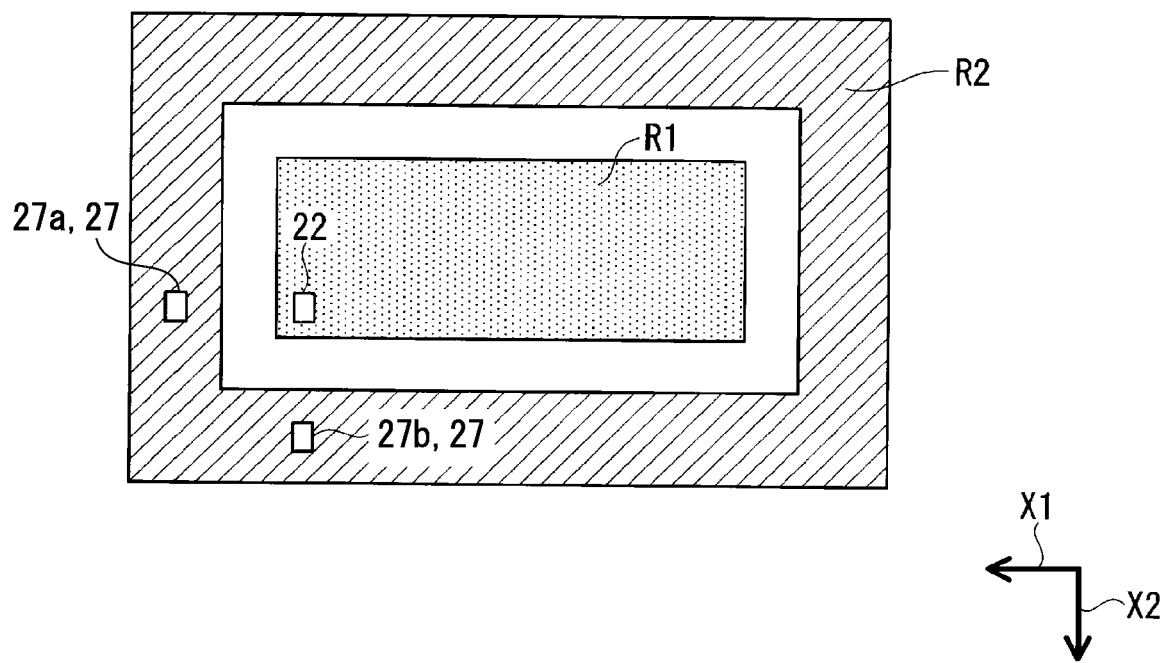
FIG. 17 is a schematic plan view showing a transistor of a pixel region and transistors of a peripheral region.

FIG. 16 schematically shows an amplifying transistor 22 in the pixel region R1 and a plurality of the first peripheral transistors 27 in the first peripheral region R2 in a case where the configuration of FIG. 1 is adopted. FIG. 17 schematically shows an amplifying transistor 22 in the pixel region R1 and a plurality of the first peripheral transistors 27 in the first peripheral region R2 in a case where the configuration of FIG. 4 is adopted.

In each of the examples shown in FIGS. 16 and 17, a plurality of the first peripheral transistors 27 are present in the first peripheral region R2. The plurality of first peripheral transistors 27 include a first direction transistor 27a and a second direction transistor 27b. The first direction transistor 27a is located in a first direction X1 from the pixel region R1 in plan view. The second direction transistor 27b is located in a second direction X2 from the pixel region R1 in plan view. It should be noted that the expression "a plurality of the first peripheral transistors 27 are present" is not intended to mean that those transistors are completely identical. The same applies to the after-mentioned "two first peripheral transistors".

The first direction X1 and the second direction X2 are different from each other. In each of the examples shown in FIGS. 16 and 17, the first direction X1 and the second direction X2 are orthogonal to each other.

As shown in each of FIGS. 18 and 19, the imaging device may include a second peripheral region R3 located between the pixel region R1 and the first peripheral region R2 in plan view. In each of the examples shown in FIGS. 18 and 19, the second peripheral region R3 has a second peripheral transistor 427. In one example, the second peripheral transistor 427 is a logic transistor. The second peripheral transistor 427 may be a planar transistor, or may be a three-dimensional structural transistor such as a FinFET (fin field-effect transistor).

In each of the examples shown in FIGS. 18 and 19, the first peripheral region R2 is located outside the pixel region R1. Specifically, the first peripheral region R2 is located outside the pixel region R1 in plan view.

In the example shown in FIG. 18, the first peripheral region R2 and the second peripheral region R3 are L-shaped in plan view. In the example shown in FIG. 19, the first peripheral region R2 surrounds the second peripheral region R3 in plan view, and the second peripheral region R3 surrounds the pixel region R1 in plan view.

Figure 20:
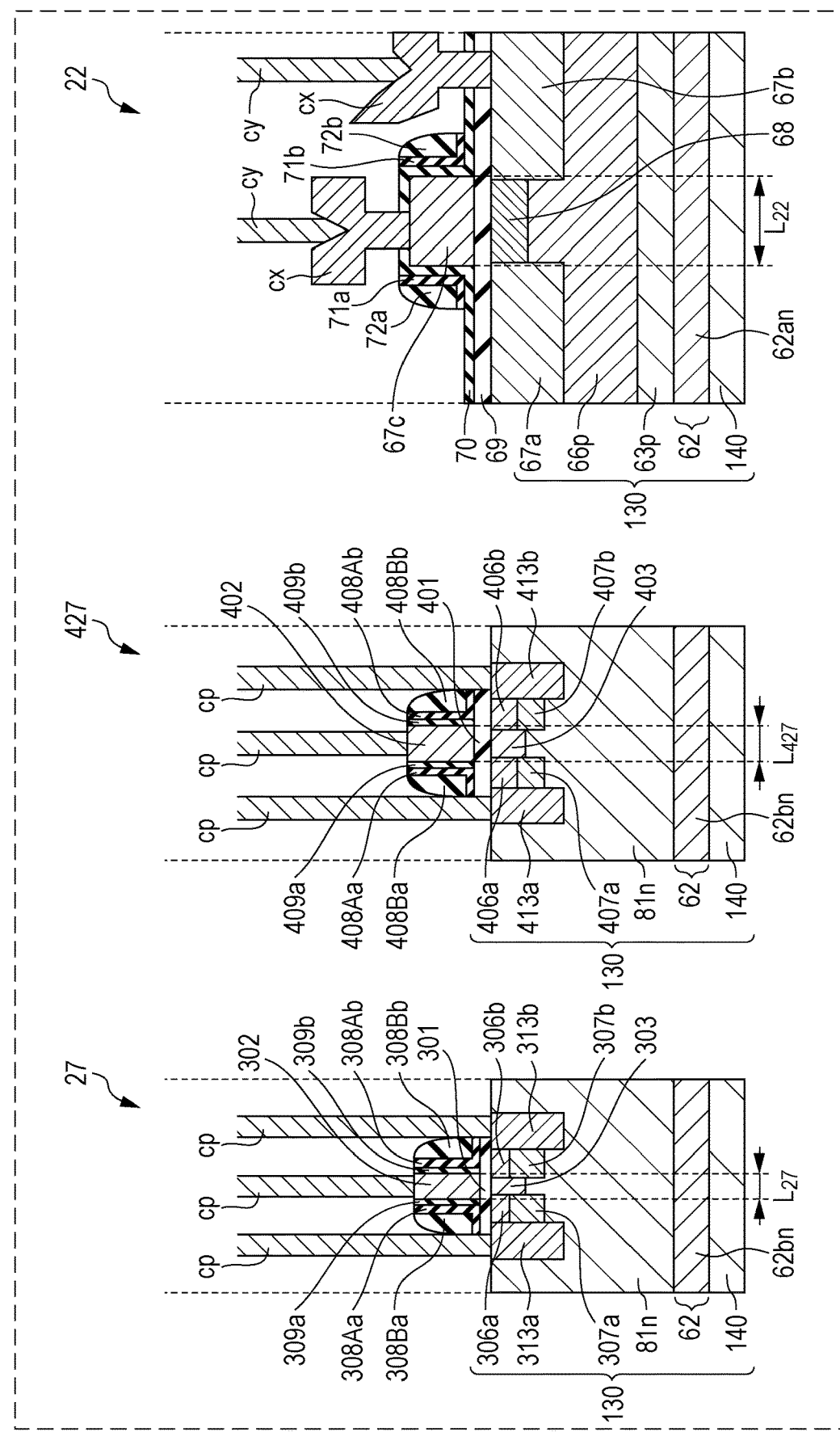
FIG. 20 illustrates schematic cross-sectional views showing a transistor of a pixel region and transistors of peripheral regions.
Figure 21:
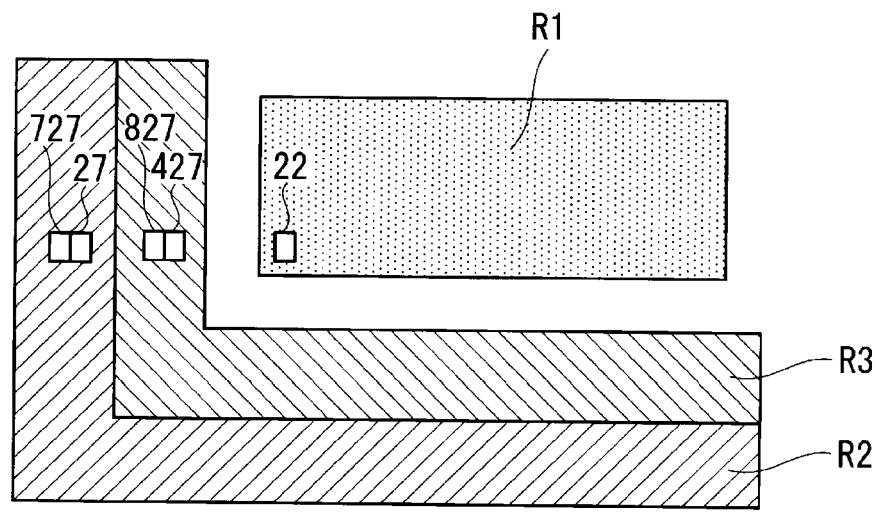
FIG. 21 is a schematic plan view showing a transistor of a pixel region and transistors of peripheral regions.
Figure 22:
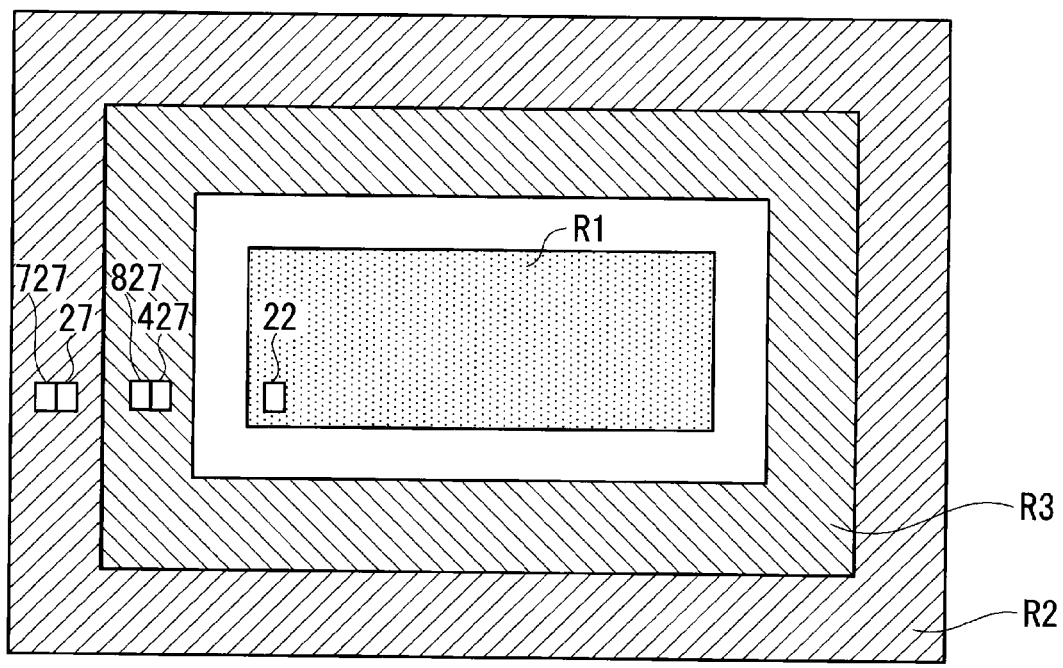
FIG. 22 is a schematic plan view showing a transistor of a pixel region and transistors of peripheral regions.

FIG. 20 shows a configuration that the second peripheral transistor 427 in the second peripheral region R3 may have in each of the examples shown in FIGS. 18 and 19.

In the example shown in FIG. 20, the second peripheral transistor 427 is a P-channel MOSFET.

In the example shown in FIG. 20, the second peripheral transistor 427 of the second peripheral region R3 have similarities to the first peripheral transistor 27 of the first peripheral region R2. Specifically, as is the case with the first peripheral transistor 27, the second peripheral transistor 427 is a MIS transistor. As is the case with the first peripheral transistor 27, the second peripheral transistor 427 includes a gate electrode 402, a second source 413a, a second drain 413b, second extension diffusion layers 406a and 406b, second pocket diffusion layers 407a and 407b, a channel diffusion layer 403, a gate insulator film 401, offset spacers 409a and 409b, first side walls 408Aa and 408Ab, and second side walls 408Ba and 408Bb. As for these constituent elements, the description of the first peripheral transistor 27 can be invoked in the description of the second peripheral transistor 427, provided no contradiction arises.

In one example, the second peripheral transistor 427 has a second specific layer. The second specific layer is located within the second substrate portion. The second specific layer contains a conductive impurity.

The conductive impurity of the second specific layer and the conductive impurity of the first specific layer may be identical or different in composition to or from each other.

The second specific layer may contain a specific species. The specific species that the second specific layer has may be the same as or different from the specific species that the first specific layer has. For example, the specific species of the first specific layer may be carbon, and the specific species of the second specific layer may be nitrogen and fluorine.

In one example, the second peripheral transistor 427 has the second source 413a and the second drain 413b. At least one of the second source 413a and the second drain 413b includes the second specific layer.

In one example, the second peripheral transistor 427 has a second extension diffusion layer EX2. The second extension diffusion layer EX2 is adjacent to the second source 413a or the second drain 413b. The second extension diffusion layer EX2 is shallower than the second source 413a and the second drain 413b. The second extension diffusion layer EX2 includes the second specific layer. The second extension diffusion layer EX2 is the second extension diffusion layer 406a or the second extension diffusion layer 406b.

The sentence "the second extension diffusion layer EX2 is shallower than the second source 413a and the second drain 413b" means that the deepest portion of the second extension diffusion layer EX2 is at a shallower depth than the deepest portions of the second source 413a and the second drain 413b in a direction parallel with the depth of the second substrate portion. In this context, the word "shallow" can also be referred to as "shallow in junction depth".

In the illustrated example, the second peripheral transistor 427 has the second extension diffusion layer 406a and the second extension diffusion layer 406b. The second extension diffusion layer 406a is adjacent to the second source 413a. The second extension diffusion layer 406a is shallower than the second source 413a and the second drain 413b. The second extension diffusion layer 406b is adjacent to the second drain 413b. The second extension diffusion layer 406b is shallower than the second source 413a and the second drain 413b. The second extension diffusion layer 406a and the second extension diffusion layer 406b include the second specific layer.

In one example, the second peripheral transistor 427 has a second pocket diffusion layer P2. The second pocket diffusion layer P2 is adjacent to the second source 413a or the second drain 413b. The second pocket diffusion layer P2 includes the second specific layer. The second pocket diffusion layer P2 is the second pocket diffusion layer 407a or the second pocket diffusion layer 407b.

In the illustrated example, the second peripheral transistor 427 has the second pocket diffusion layer 407a and the second pocket diffusion layer 407b. The second pocket diffusion layer 407a is adjacent to the second source 413a. The second pocket diffusion layer 407b is adjacent to the second drain 413b. The second pocket diffusion layer 407a and the second pocket diffusion layer 407b include the second specific layer.

Only one selected from among the second source 413a, the second drain 413b, the second extension diffusion layer EX2, and the second pocket diffusion layer P2 may include the second specific layer. Specifically, only one selected from among the second source 413a, the second drain 413b, the second extension diffusion layer 406a, the second extension diffusion layer 406b, the second pocket diffusion layer 407a, and the second pocket diffusion layer 407b may include the second specific layer.

Two or more selected from among the second source 413a, the second drain 413b, the second extension diffusion layer EX2, and the second pocket diffusion layer P2 may include the second specific layer. Specifically, two or more selected from among the second source 413a, the second drain 413b, the second extension diffusion layer 406a, the second extension diffusion layer 406b, the second pocket diffusion layer 407a, and the second pocket diffusion layer 407b may include the second specific layer. In a case where these selected two or more include the second specific layer, these may include the same or different types of specific species. For example, the specific species of the second source 413a may be carbon, and the specific species of the second extension diffusion layer EX2 may be nitrogen and fluorine. Further, in this case, these may include the same or different conductivity types of conductive impurity. For example, one of the second source 413a and the second pocket diffusion layer P2 may contain boron whose conductivity type is a p type, and the other may contain phosphorus whose conductivity type is an n type.

As can be understood from the foregoing description, the imaging device may have one or more second specific layers.

In one example, the concentration of the conductive impurity in the second extension diffusion layer EX2 is lower than the concentration of the conductive impurity in the first extension diffusion layer EX1. The second extension diffusion layer EX2 is deeper than the first extension diffusion layer EX1. As mentioned above, the first extension diffusion layer EX1 is the first extension diffusion layer 306a or the first extension diffusion layer 306b. Further, the second extension diffusion layer EX2 is the second extension diffusion layer 406a or the second extension diffusion layer 406b.

The sentence "the second extension diffusion layer EX2 is deeper than the first extension diffusion layer EX1" means that the deepest portion of the second extension diffusion layer is at a greater depth than the deepest portion of the first extension diffusion layer in a direction parallel with the depth of the pixel substrate portion or the second substrate portion. In this context, the word "deep" can also be referred to as "great in junction depth".

According to a first definition, the phrase "concentration of the conductive impurity" in the expression "the concentration of the conductive impurity in the second extension diffusion layer is lower than the concentration of the conductive impurity in the first extension diffusion layer" is a maximum value of concentration. According to a second definition, the phrase "concentration of the conductive impurity" in this expression is an average concentration. In the aforementioned example, a case where it can be said on the basis of at least one of the first definition and the second definition that "the concentration of the conductive impurity in the second extension diffusion layer is lower than the concentration of the conductive impurity in the first extension diffusion layer" is treated as a case where "the concentration of the conductive impurity in the second extension diffusion layer is lower than the concentration of the conductive impurity in the first extension diffusion layer". Further, in this expression, the type of the conductive impurity in the first extension diffusion layer and the type of the conductive impurity in the second extension diffusion layer may be the same as or different from each other. For example, the conductive impurity in the first extension diffusion layer may be boron, and the conductive impurity in the second extension diffusion layer may be indium.

In the illustrated example, the second peripheral transistor 427 has the second extension diffusion layer 406a and the second extension diffusion layer 406b. The second extension diffusion layer 406a is adjacent to the second source 413a. The second extension diffusion layer 406a is shallower than the second source 413a and the second drain 413b. The second extension diffusion layer 406a has a conductive impurity. The second extension diffusion layer 406b is adjacent to the second drain 413b. The second extension diffusion layer 406b is shallower than the second source 413a and the second drain 413b. The second extension diffusion layer 406b has a conductive impurity. The concentration of the conductive impurity in the second extension diffusion layer 406a is lower than the concentration of the conductive impurity in the first extension diffusion layer 306a. The second extension diffusion layer 406a is deeper than the first extension diffusion layer 306a. The concentration of the conductive impurity in the second extension diffusion layer 406b is lower than the concentration of the conductive impurity in the first extension diffusion layer 306b. The second extension diffusion layer 406b is deeper than the first extension diffusion layer 306b.

In one example, the gate length $L_{27}$ of the first peripheral transistor 27 is shorter than the gate length $L_{427}$ of the second peripheral transistor 427. In terms of miniaturization of the first peripheral transistor 27 and from the point of view of causing the first peripheral transistor 27 to operate at high speed, it is advantageous for the gate length $L_{27}$ of the first peripheral transistor 27 to be short. In one example, the second peripheral transistor 427 is included in an analog processor, and the first peripheral transistor 27 is included in a digital processor. In this specific example, employing the first peripheral transistor 27 and the second peripheral transistor 427 with different gate lengths allows the digital processor to achieve digital processing making use of the high-speed operation of the first peripheral transistor 27, whose gate length $L_{27}$ is short. Since the first peripheral transistor 27 is finer, the speeding up of digital processing in the digital processing becomes possible. Meanwhile, since the gate length $L_{427}$ is relatively long, variations in the threshold voltage of the second peripheral transistor 427 may be reduced. This makes it also possible to improve the analog characteristics of the second peripheral transistor 427 in the analog processor.

The ratio $L_{27}/L_{427}$ of the gate length $L_{27}$ of the first peripheral transistor 27 to the gate length $L_{427}$ of the second peripheral transistor 427 is for example lower than or equal to 0.8, or may be lower than or equal to 0.34. This ratio is for example higher than or equal to 0.01, or may be higher than or equal to 0.05.

In one example, the gate length $L_{22}$ of the amplifying transistor 22 is longer than the gate length $L_{427}$ of the second peripheral transistor 427. In terms of improvement in characteristic of the amplifying transistor 22, it is advantageous for the gate length $L_{22}$ of the amplifying transistor 22 to be long. In one specific example, the amplifying transistor 22 is included in the analog processor. In this specific example, the gate length $L_{22}$ is increased, and variations in the threshold voltage of the amplifying transistor 22 are reduced, so that it is easy to improve a Pelgrom coefficient. This allows the analog processor to achieve analog processing making use of the favorable analog characteristics of the amplifying transistor 22 based on this ease of improvement.

The ratio $L_{427}/L_{22}$ of the gate length $L_{427}$ of the second peripheral transistor 427 to the gate length $L_{22}$ of the amplifying transistor 22 is for example lower than or equal to 0.95, or may be lower than or equal to 0.9. This ratio is for example higher than or equal to 0.1, or may be higher than or equal to 0.36.

In one example, the gate insulator film 301 of the first peripheral transistor 27 is thinner than the gate insulator film 401 of the second peripheral transistor 427. In terms of miniaturization of the first peripheral transistor 27 and from the point of view of causing the first peripheral transistor 27 to operate at high speed, it is advantageous for the gate insulator film 301 of the first peripheral transistor 27 to be thin. In one example, the second peripheral transistor 427 is included in the analog processor, and the first peripheral transistor 27 is included in the digital processor. In this specific example, employing the first peripheral transistor 27 and the second peripheral transistor 427 with different insulator film thicknesses allows the digital processor to achieve digital processing making use of the high-speed operation of the first peripheral transistor 27, whose gate insulator film 301 is thin. Since the first peripheral transistor 27 is finer, the speeding up of digital processing in the digital processing becomes possible. Meanwhile, since the gate insulator film 401 is relatively thick, variations in the threshold voltage of the second peripheral transistor 427 may be reduced. This makes it also possible to improve the analog characteristics of the second peripheral transistor 427 in the analog processor.

The ratio $T_{301}/T_{401}$ of the thickness $T_{301}$ of the gate insulator film 301 of the first peripheral transistor 27 to the thickness $T_{401}$ of the gate insulator film 401 of the second peripheral transistor 427 is for example lower than or equal to 0.7, or may be lower than or equal to 0.36. This ratio is for example higher than or equal to 0.1, or may be higher than or equal to 0.22.

In one example, the gate insulator film 69 of the amplifying transistor 22 is thicker than the gate insulator film 401 of the second peripheral transistor 427. In terms of improvement in characteristic of the amplifying transistor 22, it is advantageous for the gate insulator film 69 of the amplifying transistor 22 to be thick. In one specific example, the amplifying transistor 22 is included in the analog processor. In this specific example, the gate insulator film 69 is thickened, and variations in the threshold voltage of the amplifying transistor 22 are reduced, so that it is easy to improve a Pelgrom coefficient. This allows the analog processor to achieve analog processing making use of the favorable analog characteristics of the amplifying transistor 22 based on this ease of improvement.

The ratio $T_{401}/T_{69}$ of the thickness $T_{401}$ of the gate insulator film 401 of the second peripheral transistor 427 to the thickness $T_{69}$ of the gate insulator film 69 of the amplifying transistor 22 is for example lower than 1. This ratio is for example higher than or equal to 0.68.

In one specific example, the second peripheral transistor 427 is a logic transistor. The second peripheral transistor 427 can perform an analog operation in a state of being incorporated in a pixel driver, a load cell, a column amplifier, a comparator, or other devices. In the analog operation, it may be advantageous for a dynamic range to be wide. In order to secure a wide dynamic range, it is advantageous for a transistor to have a high operating voltage and a wide voltage range. For example, in the case of a pixel voltage of approximately 3 V to 3.5 V, it may be advantageous for the operating voltage to be 3.3 V. In this respect, in this specific example, the gate length $L_{427}$ of the second peripheral transistor 427 is longer than the gate length $L_{27}$ of the first peripheral transistor 27. The gate insulator film 401 of the second peripheral transistor 427 is thicker than the gate insulator film 301 of the first peripheral transistor 27. From the point of view of raising the operating voltage of the second peripheral transistor 427, it is advantageous from the gate length $L_{427}$ to be long and for the gate insulator film 401 to be thick. In the aforementioned context, the operating voltage is the drain voltage of a transistor when the transistor is on. The pixel voltage is the voltage of a charge accumulation node in a pixel.

In this specific example, the operating voltage of the second peripheral transistor 427 is higher than the operating voltage of the first peripheral transistor 27. The operating voltage of the second peripheral transistor 427 is for example 3.3 V. The operating voltage of the first peripheral transistor 27 is for example 1.2 V.

In this specific example, variations in the threshold voltage of the second peripheral transistor 427 are small, as the second peripheral transistor 427 is longer in gate length and greater in gate insulator film thickness than the first peripheral transistor 27. Small variations in threshold voltage are a favorable feature. Further, in this specific example, the threshold voltage of the second peripheral transistor 427 is higher than the threshold voltage of the first peripheral transistor 27. The threshold voltage of the second peripheral transistor 427 is for example approximately 0.5 V. The threshold voltage of the first peripheral transistor 27 is for example approximately 0.3 V.

In one example, the concentration of the specific species in the first specific layer is higher than the concentration of the specific species in the second specific layer. In the expression "the concentration of the specific species in the first specific layer is higher than the concentration of the specific species in the second specific layer", the concentration of the specific species in the second specific layer may be zero, or may be higher than zero.

According to a first definition, the phrase "concentration of the specific layer" in the expression "the concentration of the specific species in the first specific layer is higher than the concentration of the specific species in the second specific layer" is a maximum value of concentration. According to a second definition, the phrase "concentration of the specific species" in this expression is an average concentration. In the aforementioned example, a case where it can be said on the basis of at least one of the first definition and the second definition that "the concentration of the specific species in the first specific layer is higher than the concentration of the specific species in the second specific layer" is treated as a case where "the concentration of the specific species in the first specific layer is higher than the concentration of the specific species in the second specific layer". Further, in this example, the type of the specific species in the first specific layer and the type of the specific species in the second specific layer may be the same as or different from each other. For example, the specific species in the first specific layer may be carbon, and the specific species in the second specific layer may be nitrogen and fluorine.

In a case where the specific species is constituted by plural types of impurity, the concentration of the specific species refers to the total concentration of those plural types of impurity.

The concentration of carbon in the first specific layer may be higher than the concentration of carbon in the second specific layer. The concentration of nitrogen in the first specific layer may be higher than the concentration of nitrogen in the second specific layer. The concentration of fluorine in the first specific layer may be higher than the concentration of fluorine in the second specific layer. The concentration of germanium in the first specific layer may be higher than the concentration of germanium in the second specific layer. The concentration of silicon in the first specific layer may be higher than the concentration of silicon in the second specific layer. The concentration of argon in the first specific layer may be higher than the concentration of argon in the second specific layer.

In one example, the concentration of carbon in the second specific layer is higher than the concentration of carbon under the gate of the amplifying transistor 22. As mentioned above, the phrase "under the gate of the amplifying transistor 22" refers to that portion of the surface of the pixel substrate portion facing the gate 67*c* which overlaps the gate 67*c* of the amplifying transistor 22 in plan view. In the expression "the concentration of carbon in the second specific layer is higher than the concentration of carbon under the gate of the amplifying transistor 22", the concentration of carbon under the gate of the amplifying transistor 22 may be zero, or may be higher than zero.

According to a first definition, the phrase "concentration of carbon" in the expression "the concentration of carbon in the second specific layer is higher than the concentration of carbon under the gate of the amplifying transistor 22" is a maximum value of concentration. According to a second definition, the phrase "concentration of carbon" in this expression is an average concentration. In the aforementioned example, a case where it can be said on the basis of at least one of the first definition and the second definition that "the concentration of carbon in the second specific layer is higher than the concentration of carbon under the gate of the amplifying transistor 22" is treated as a case where "the concentration of carbon in the second specific layer is higher than the concentration of carbon under the gate of the amplifying transistor 22".

In one example, the second extension diffusion layer EX2 contains nitrogen.

In the illustrated example, the second extension diffusion layer 406*a* contains nitrogen. The second extension diffusion layer 406*b* contains nitrogen.

The nitrogen of the second extension diffusion layer EX2 may be derived from ion implantation of nitrogen (N) ions, or may be derived from implantation of nitrogen molecules $N_2$. In the illustrated example, the nitrogen of the second extension diffusion layer 406*a* may be derived from ion implantation of nitrogen (N) ions, or may be derived from implantation of nitrogen molecules $N_2$. The nitrogen of the second extension diffusion layer 406*b* may be derived from ion implantation of nitrogen (N) ions, or may be derived from implantation of nitrogen molecules $N_2$. The same applies to the carbon in the first extension diffusion layer EX1 and the first extension diffusion layers 306*a* and 306*b* in that the carbon may be derived from ion implantation.

Of course, a transistor other than the transistors shown in FIGS. 18 to 20 may be provided. In each of the examples shown in FIGS. 21 to 24, the first peripheral region R2 has a first peripheral transistor 27 and a first peripheral transistor 727. A device isolation 222 is disposed between the first peripheral transistor 27 and the first peripheral transistor 727. The second peripheral region R3 has a second peripheral transistor 427 and a second peripheral transistor 827. The device isolation 222 is disposed between the second peripheral transistor 427 and the second peripheral transistor 827. It should be noted that FIG. 24 simplistically illustrates the first peripheral transistor 27, the second peripheral transistor 427, and the amplifying transistor 22 and omits to illustrate the device isolation 222.

In each of the examples shown in FIGS. 21 to 24, the first peripheral transistor 727 has similarities to the first peripheral transistor 27. Specifically, as is the case with the first peripheral transistor 27, the first peripheral transistor 727 is a MIS transistor. As is the case with the first peripheral transistor 27, the first peripheral transistor 727 includes a gate electrode 702, a second source 713*a*, a second drain 713*b*, extension diffusion layers 706*a* and 706*b*, pocket diffusion layers 707*a* and 707*b*, a channel diffusion layer 703, a gate insulator film 701, offset spacers 709*a* and 709*b*, first side walls 708Aa and 708Ab, and second side walls 708Ba and 708Bb.

Note, however, that the first peripheral transistor 27 and the first peripheral transistor 727 are opposite in polarity to each other. Specifically, the first peripheral transistor 27 is a P-channel transistor, and the first peripheral transistor 727 is an N-channel transistor. The P-type source-drain diffusion layer 313*a*, which serves as a source, is of a P type, and the source 713*a* is of an N type. The P-type source-drain diffusion layer 313*b*, which serves as a drain, is of a P type, and the source 713*b* is of an N type. The first extension diffusion layer 306*a* is of a P type, and the extension diffusion layer 706*a* is of an N type. The first extension diffusion layer 306*b* is of a P type, and the extension diffusion layer 706*b* is of an N type. The first pocket diffusion layer 307*a* is of an N type, and the pocket diffusion layer 707*a* is of a P type. The first pocket diffusion layer 307*b* is of an N type, and the pocket diffusion layer 707*b* is of a P type. The channel diffusion layer 303 is of an N type, and the channel diffusion layer 703 is of a P type.

In the following, the ordinal numeral "first" may be added to the constituent elements of the first peripheral transistor 727. For example, the source 713*a* may be referred to as "first source". Further, the drain 713*b* may be referred to as "first drain".

In the illustrated example, the device isolation 222 is an STI (shallow trench isolation) structure. The STI structure has a trench (groove) and a filler filling the trench. The filler is for example an oxide. The depth of the trench is for example approximately 500 nm. The STI structure may be formed in the semiconductor substrate 130 by an STI process.

In the illustrated example, the first peripheral region R2 has two first peripheral transistors 27 and 727 and a device isolation 222 that is an STI structure. The device isolation 222, which is the STI structure, provides device isolation of the two first peripheral transistors 27 and 727 from each other. The device isolation 222, which is the STI structure, has a trench. A range of distribution of the specific species in the first specific layer of at least one of the two first peripheral transistors 27 and 727 is shallower than the bottom of the trench. In this context, the phrase "range of distribution of the specific species" refers to a region in which the concentration of the specific species is higher than or equal to $5 \times 10^{16}$ atoms/cm$^3$. The same applies to a range of distribution of carbon or other substances. The term "bottom of the trench" means the deepest portion of the trench in a direction parallel with the depth of the first substrate portion. As mentioned above, in a case where the specific species is constituted by plural types of impurity, the concentration of the specific species refers to the total concentration of those plural types of impurity.

A range of distribution of carbon in the first specific layer of at least one of the two first peripheral transistors 27 and 727 may be shallower than the bottom of the trench. A range of distribution of nitrogen in the first specific layer of at least one of the two first peripheral transistors 27 and 727 may be shallower than the bottom of the trench. A range of distribution of fluorine in the first specific layer of at least one of the two first peripheral transistors 27 and 727 may be shallower than the bottom of the trench. A range of distribution of germanium in the first specific layer of at least one of the two first peripheral transistors 27 and 727 may be shallower than the bottom of the trench. A range of distribution of silicon in the first specific layer of at least one of the two first peripheral transistors 27 and 727 may be shallower than the bottom of the trench. A range of distribution of argon in the first specific layer of at least one of the two first peripheral transistors 27 and 727 may be shallower than the bottom of the trench.

Figure 23:
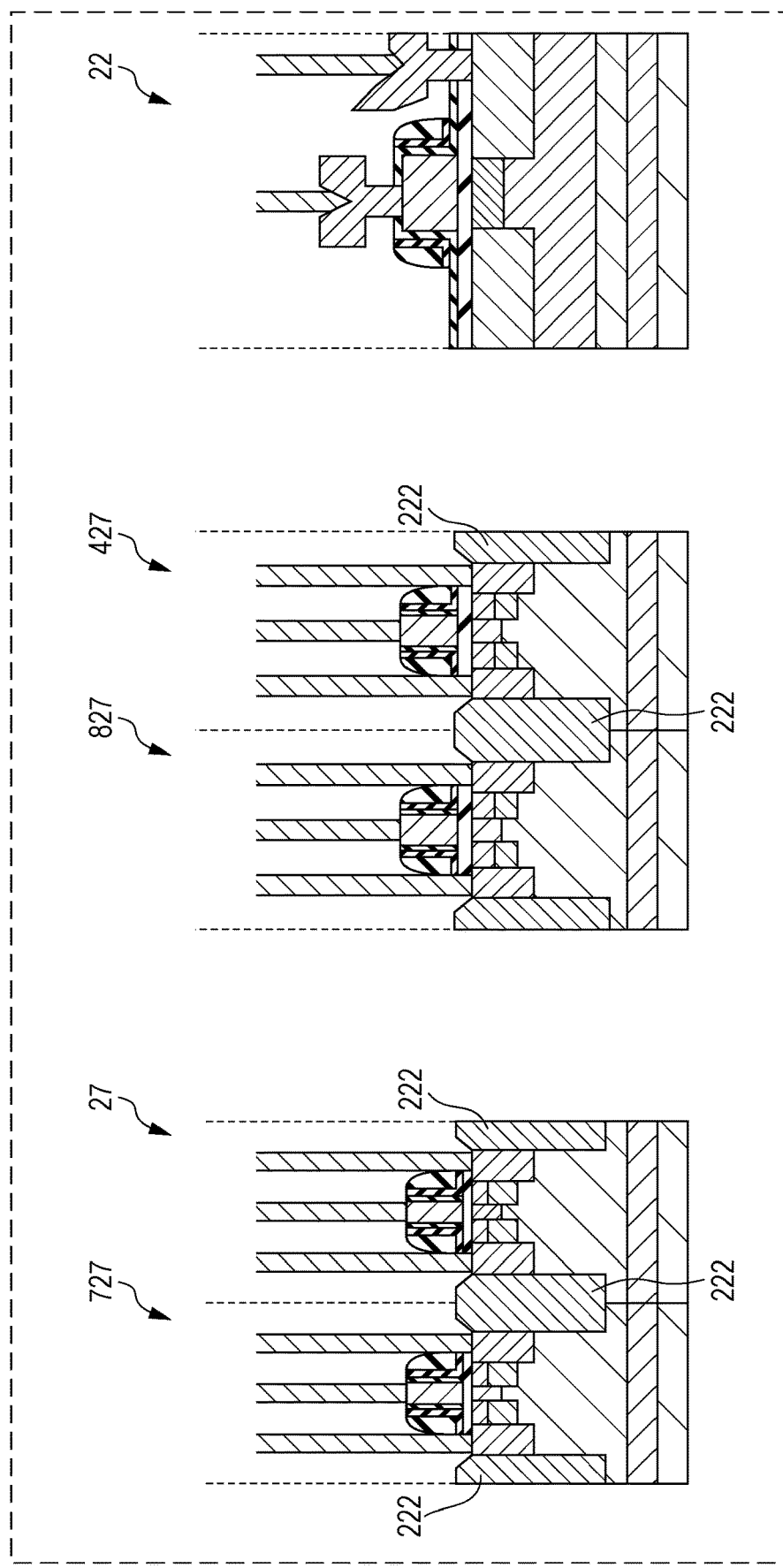
FIG. 23 illustrates schematic cross-sectional views showing a transistor of a pixel region and transistors of peripheral regions.
Figure 24:
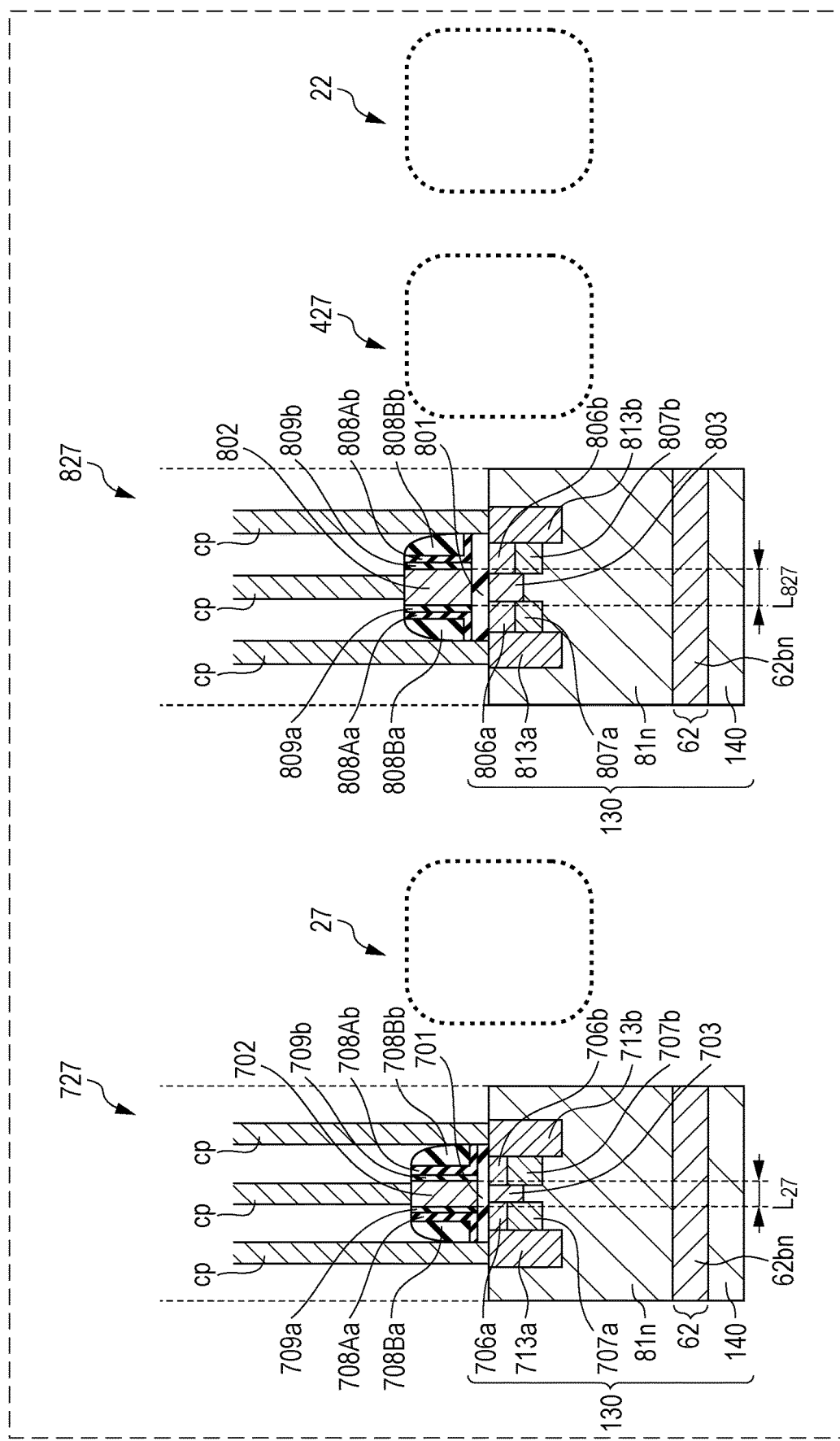
FIG. 24 is a schematic cross-sectional view showing a transistor of a pixel region and transistors of peripheral regions.

Specifically, the two first peripheral transistors 27 and 727 are opposite in polarity to each other. In plan view, the device isolation 222, which is the STI structure, is disposed between the two first peripheral transistors 27 and 727 and, more specifically, on a segment connecting the two first peripheral transistors 27 and 727 with each other. The specific species contributes to impurity diffusion suppression. As illustrated in FIG. 23, the STI structure may project upward from a portion of the first substrate portion that is present around the STI structure.

It should be noted that the device isolation 222 may be an implantation isolation region.

In each of the examples shown in FIGS. 21 to 24, the second peripheral transistor 827 has similarities to the second peripheral transistor 427. Specifically, as is the case with the second peripheral transistor 427, the second peripheral transistor 827 is a MIS transistor. As is the case with the second peripheral transistor 427, the second peripheral transistor 827 includes a gate electrode 802, a second source 813a, a second drain 813b, extension diffusion layers 806a and 806b, pocket diffusion layers 807a and 807b, a channel diffusion layer 803, a gate insulator film 801, offset spacers 809a and 809b, first side walls 808Aa and 808Ab, and second side walls 808Ba and 808Bb.

Note, however, that the second peripheral transistor 427 and the second peripheral transistor 827 are opposite in polarity to each other. Specifically, the second peripheral transistor 427 is a P-channel transistor, and the second peripheral transistor 827 is an N-channel transistor. The second source 413a is of a P type, and the source 813a is of an N type. The second drain 413b is of a P type, and the source 813b is of an N type. The second extension diffusion layer 406a is of a P type, and the extension diffusion layer 806a is of an N type. The second extension diffusion layer 406b is of a P type, and the extension diffusion layer 806b is of an N type. The second pocket diffusion layer 407a is of an N type, and the pocket diffusion layer 807a is of a P type. The first pocket diffusion layer 407b is of an N type, and the pocket diffusion layer 807b is of a P type. The channel diffusion layer 403 is of an N type, and the channel diffusion layer 803 is of a P type.

The ordinal numeral "second" may be added to the constituent elements of the second peripheral transistor 827. For example, the source 813a may be referred to as "second source". Further, the drain 813b may be referred to as "second drain".

Let it be emphatically said that the second peripheral region R3 is not essential. Of course, the second peripheral transistors 427 and 827 are not essential. Further, in the first peripheral region R2, at least one of the first peripheral transistors 27 and 727 may be used in analog processing. In one specific example, in the first peripheral region R2, one first peripheral transistor is used in digital processing, and another first peripheral transistor is used in analog processing.

The description of the first peripheral transistor 27 and elements thereof can be invoked in the description of the first peripheral transistor 727 and elements thereof, provided no contradiction arises. The description of the second peripheral transistor 427 and elements thereof can be invoked in the description of the second peripheral transistor 827 and elements thereof, provided no contradiction arises. The description of a relationship among the first peripheral transistor 27, the second peripheral transistor 427, and the amplifying transistor 22 can be invoked in the description of a relationship among the first peripheral transistor 727, the second peripheral transistor 827, and the amplifying transistor 22, provided no contradiction arises.

For example, the gate length $L_{727}$ of the first peripheral transistor 727 may be shorter than the gate length $L_{22}$ of the amplifying transistor 22. The gate length $L_{727}$ of the first peripheral transistor 727 may be shorter than the gate length $L_{827}$ of the second peripheral transistor 827. The gate length $L_{827}$ of the second peripheral transistor 827 may be shorter than the gate length $L_{22}$ of the amplifying transistor 22. The extension diffusion layer 706a may be shallower than the source 713a and the drain 713b. The extension diffusion layer 706b may be shallower than the source 713a and the drain 713b. The extension diffusion layer 806a may be shallower than the source 813a and the drain 813b. The extension diffusion layer 806b may be shallower than the source 813a and the drain 813b. The extension diffusion layer 706a may contain a conductive impurity and a specific species. The extension diffusion layer 706b may contain a conductive impurity and a specific species. The extension diffusion layer 806a may contain nitrogen. The nitrogen of the extension diffusion layer 806a may be derived from ion implantation of nitrogen (N) ions, or may be derived from implantation of nitrogen molecules $N_2$. The extension diffusion layer 806b may contain nitrogen. The nitrogen of the extension diffusion layer 806b may be derived from ion implantation of nitrogen (N) ions, or may be derived from implantation of nitrogen molecules $N_2$.

As can be understood from the foregoing description, in the imaging device, at least one of the extension diffusion layer 806a and the extension diffusion layer 806b of the second peripheral transistor 827, which is an N-channel transistor, may contain nitrogen. This nitrogen affects not only the distribution of impurities in the second substrate portion but also the interface characteristics of the gate insulator film of the second peripheral transistor 827, thereby bringing about improvement in reliability of the imaging device. At least one of the extension diffusion layer 806a and the extension diffusion layer 806b that contains the aforementioned nitrogen may be a so-called LDD diffusion layer.

In an example in which at least one of the extension diffusion layer 806a and the extension diffusion layer 806b of the second peripheral transistor 827, which is an N-channel transistor, contains nitrogen, the extension diffusion layer 706a of the second peripheral transistor 727, which is a P-channel transistor, may or may not contain nitrogen. In this example, the extension diffusion layer 706b of the second peripheral transistor 727, which is a P-channel transistor, may or may not contain nitrogen.

In plan view, the amplifying transistor 22, the second peripheral transistor 427, the second peripheral transistor 827, the first peripheral transistor 27, and the first peripheral transistor 727 are arranged in this order.

The matters described with reference to FIGS. 21 to 24 can be applied to the examples shown in FIGS. 13 to 17, provided no contradiction arises.

The foregoing description has taken a front-side illumination (FSI) imaging device as an example. Note, however, that the foregoing description is also applicable to a back-side illumination (BSI) imaging device.

Figure 25:
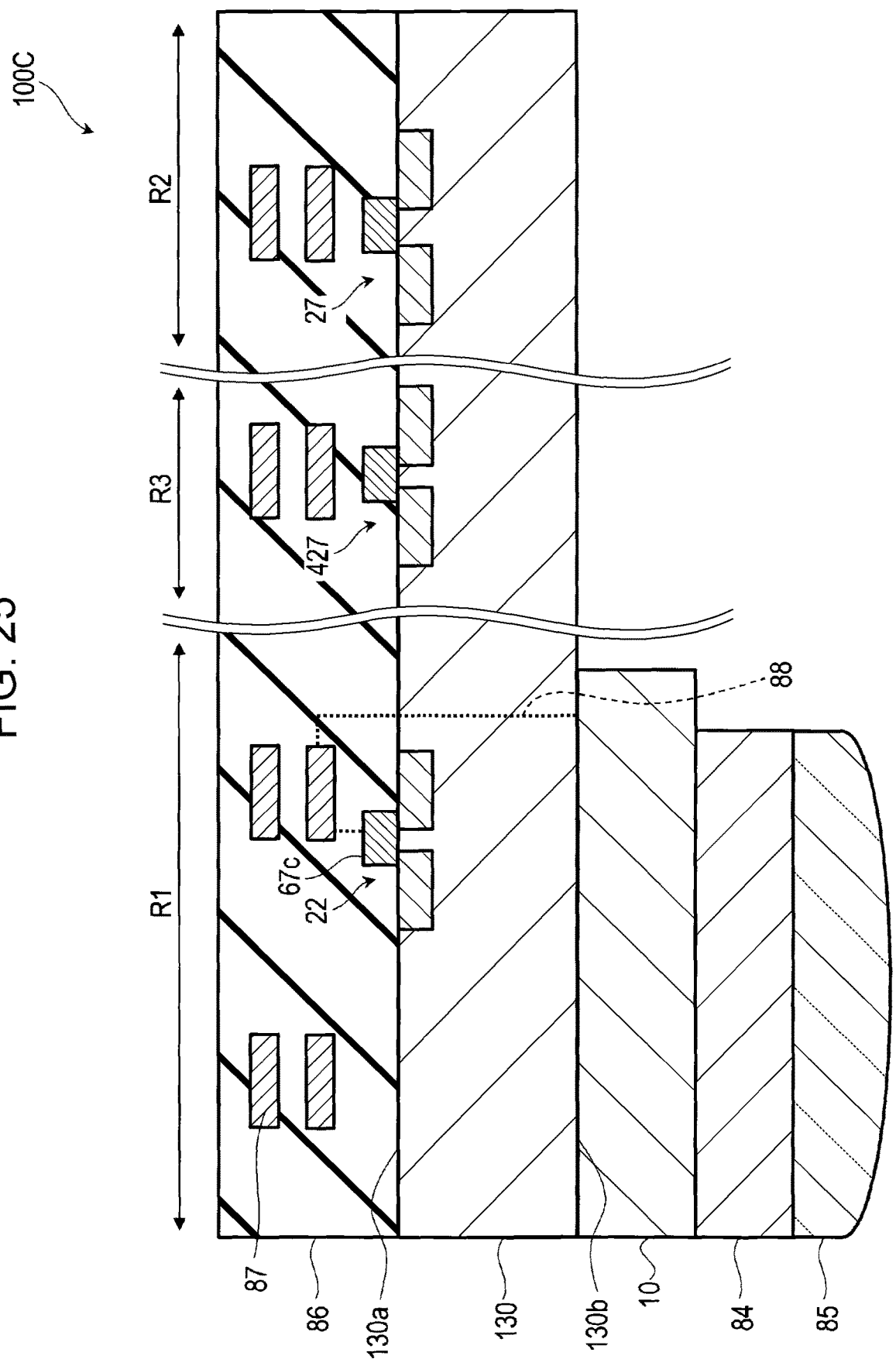
FIG. 25 is a schematic view of a back-side illumination imaging device.

FIG. 25 is a schematic view of a back-side illumination imaging device 100C according to one example.

In the imaging device 100C shown in FIG. 25, the semiconductor substrate 130 has a front surface 130a and a back surface 130b. The back surface 130b is a surface on which light falls. The front surface 130a is a surface opposite to the surface on which light falls.

On the back surface 130b, a photoelectric converter 10 is stacked. On the photoelectric converter 10, a color filter 84 is stacked. On the color filter 84, an on-chip lens 85 is stacked. In a typical example, the semiconductor substrate 130 and the photoelectric converter 10 are joined to each other by joining the photoelectric converter 10 to the back surface 130b with the back surface 130b polished. The color filter 84 and the on-chip lens 85 may be omitted. At least either between the photoelectric converter 10 and the color filter 84 or between the color filter 84 and the on-chip lens 85, an interlayer insulating film intended for planarization, protection, or other purposes may be provided.

On the front surface 130a, a wiring portion 86 is stacked. The wiring portion 86 has a plurality of wires 87 provided inside an insulator. The plurality of wires 87 are used for electrical connections to the amplifying transistor 22, the first peripheral transistor 27, and the second peripheral transistor 427. For example, a wire 87 constitutes part of an electrical pathway 88 electrically connecting the pixel electrode 11 of the photoelectric converter 10 to the gate electrode 67c of the amplifying transistor 22. Specifically, in this example, the electrical pathway 88 includes a through-silicon via (TSV) provided in the semiconductor substrate 130. FIG. 25 omits to illustrate the through-silicon via. In FIG. 25, the dotted line representing the electrical pathway 88 is schematic, and is not intended to limit the position or other features of the electrical pathway 88. Instead of the TSV connection, a Cu—Cu connection may be employed.

Although not illustrated in detail in FIG. 25, the transistor 22, the first peripheral transistor 27, and the second peripheral transistor 427 may have the features described with reference to FIGS. 1 to 24. The same applies to other elements such as the photoelectric converter 10. Specifically, in this example, the first peripheral transistor 27 and the second peripheral transistor 427 include sources, drains, extension diffusion layers, pocket diffusion layers, or other elements. The semiconductor substrate 130 includes a supporting substrate 140.

Figure 26:
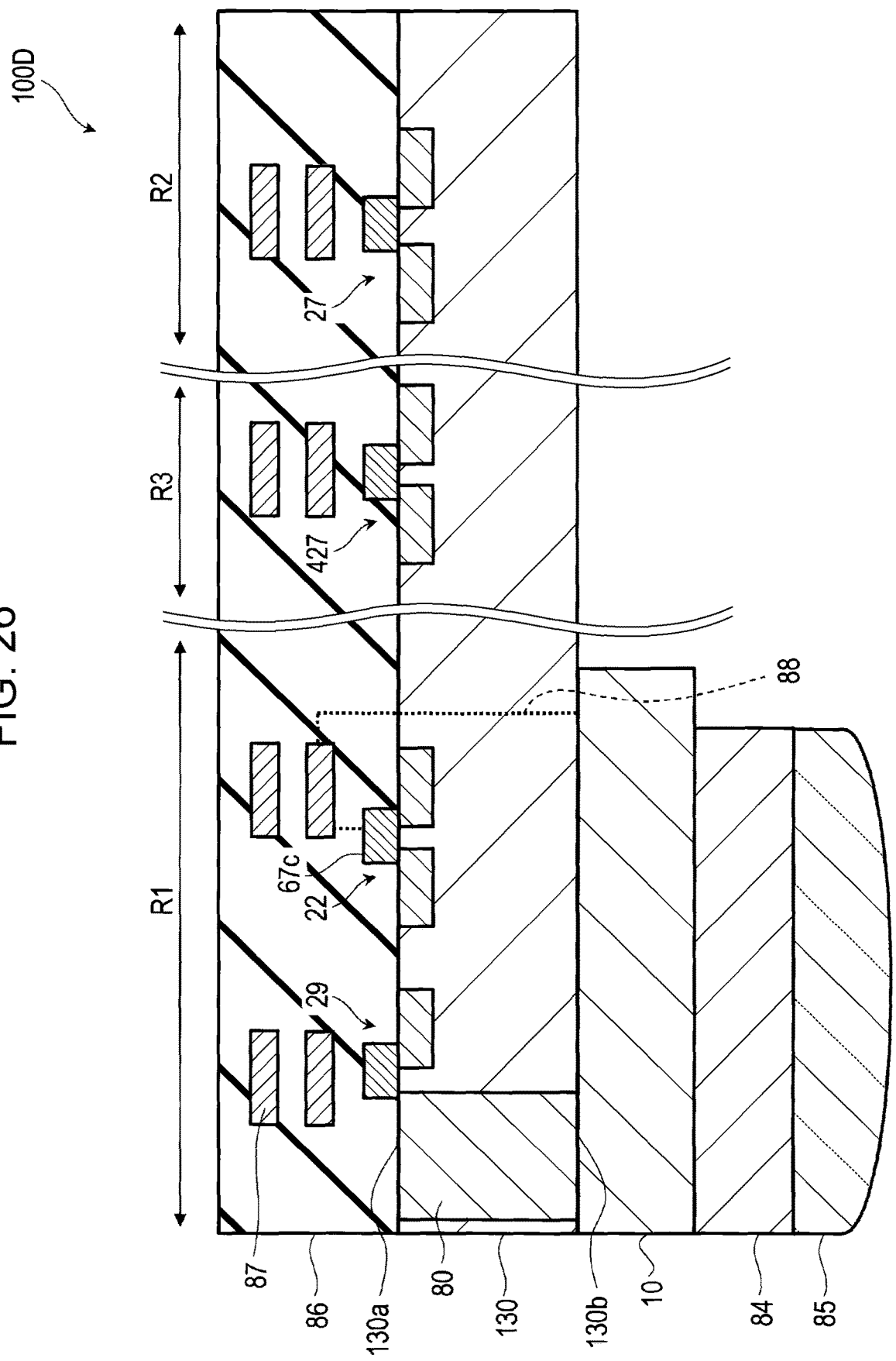
FIG. 26 is a schematic view of a back-side illumination imaging device.

FIG. 26 is a schematic view of a back-side illumination imaging device 100D according to another example.

The imaging device 100D shown in FIG. 26 includes the elements of the imaging device 100C shown in FIG. 25. The imaging device 100D further includes a photodiode 80 and a transfer transistor 29. The photodiode 80 and the transfer transistor 29 are provided in the semiconductor substrate 130. Specifically, the pixel region R1 has the photodiode 80 provided in the pixel substrate portion. As mentioned above, the term "pixel substrate portion" refers to a portion of at least one semiconductor substrate 130 located in the pixel region R1.

As is the case with the photoelectric converter 10, the photodiode 80 falls under the category of photoelectric converters. The photodiode 80 generates signal charge through photoelectric conversion. The transfer transistor 29 transfers this signal charge to a charge accumulation region (not illustrated).

According to the back-side illumination configuration shown in FIG. 26, the irradiation of the photodiode 80 with light from the on-chip lens 85 and the color filter 84 is not prevented by a wire 87 of the wiring portion 86. This enables the photodiode 80 to carry out efficient photoelectric conversion.

Figure 27:
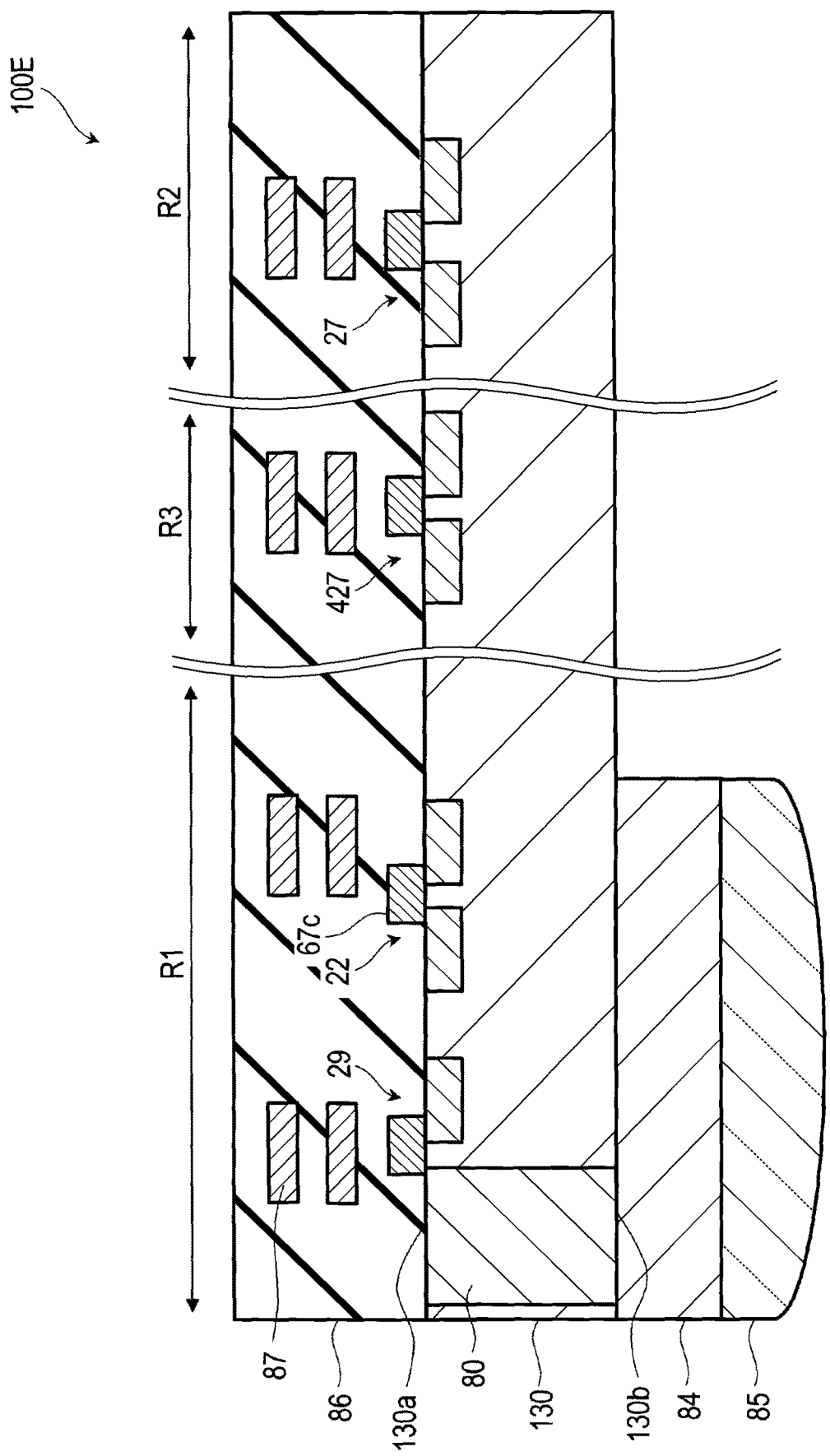
FIG. 27 is a schematic view of a back-side illumination imaging device.

FIG. 27 is a schematic view of a back-side illumination imaging device 100E according to another example.

The imaging device 100E shown in FIG. 27 includes some of the elements of the imaging device 100D shown in FIG. 26. Note, however, that the imaging device 100E shown in FIG. 27 does not have a photoelectric converter 10.

FIGS. 28 to 31 are schematic views showing shapes that the pixel region R1, first peripheral region R2, and second peripheral region R3 of the imaging device 100E shown in FIG. 27 may take.

Figure 28:
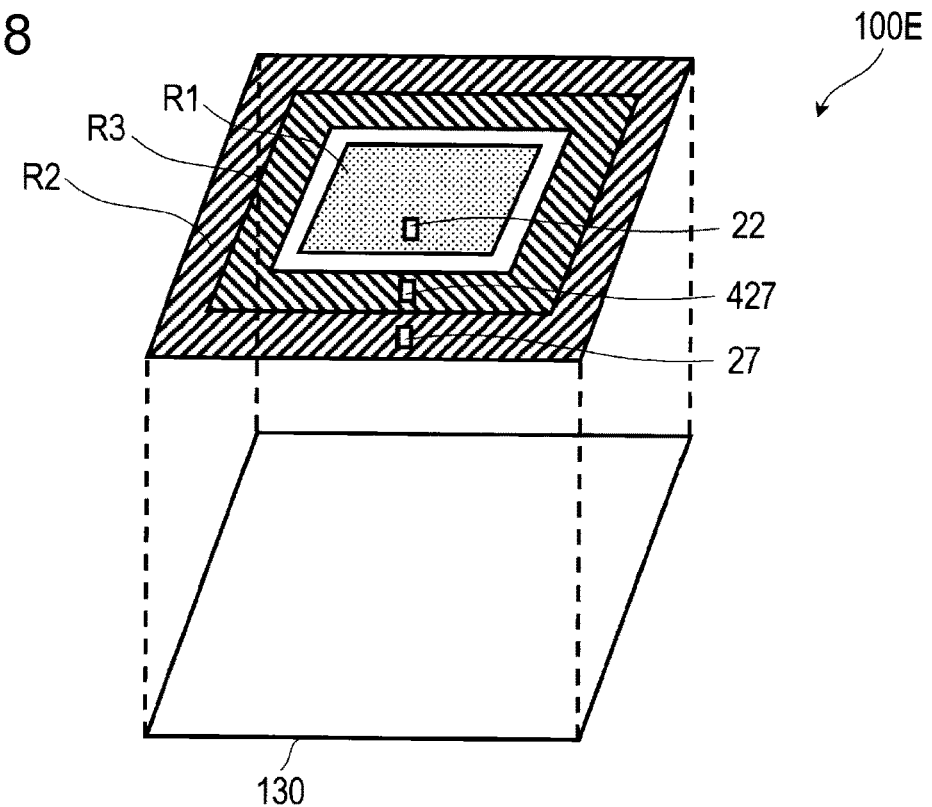
FIG. 28 is a schematic view showing shapes that a pixel region and peripheral regions of an imaging device may take.

In the example shown in FIG. 28, the second peripheral region R3 surrounds the pixel region R1 in plan view. The first peripheral region R2 surrounds the second peripheral region R3 in plan view. Specifically, in the example shown in FIG. 28, the second peripheral region R3 exhibits a square shape outside the pixel region R1 in plan view. The first peripheral region R2 exhibits a square shape outside the second peripheral region R3 in plan view.

Figure 29:
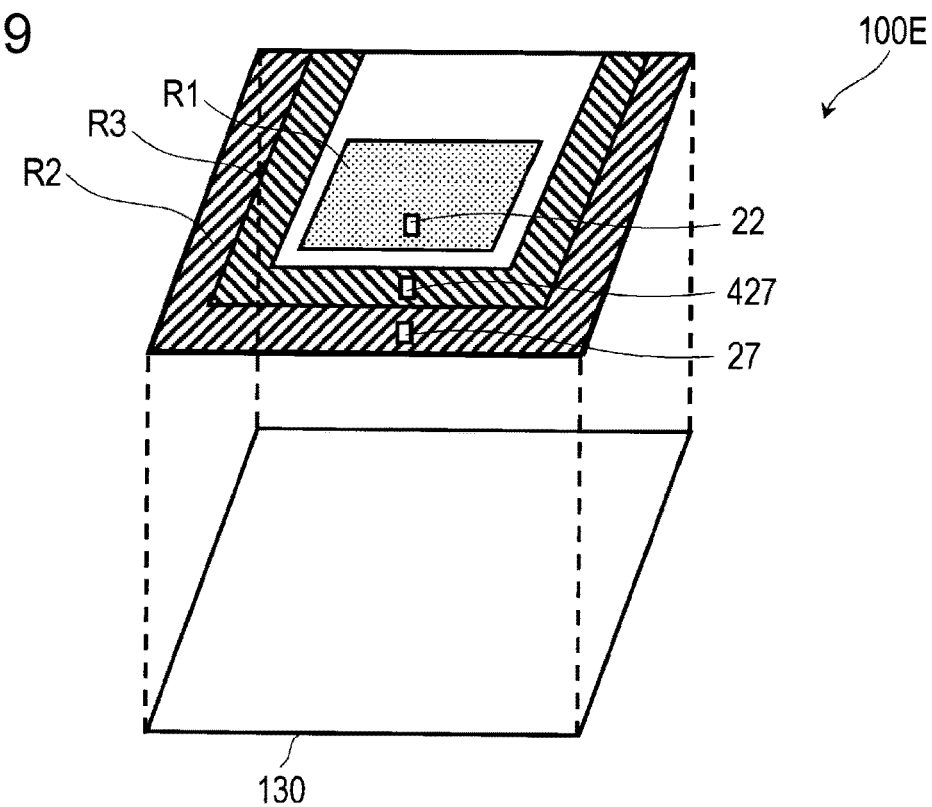
FIG. 29 is a schematic view showing shapes that a pixel region and peripheral regions of an imaging device may take.

In the example shown in FIG. 29, the second peripheral region R3 exhibits a U-shape outside the pixel region R1 in plan view. The first peripheral region R2 exhibits a U-shape outside the second peripheral region R3 in plan view.

Figure 30:
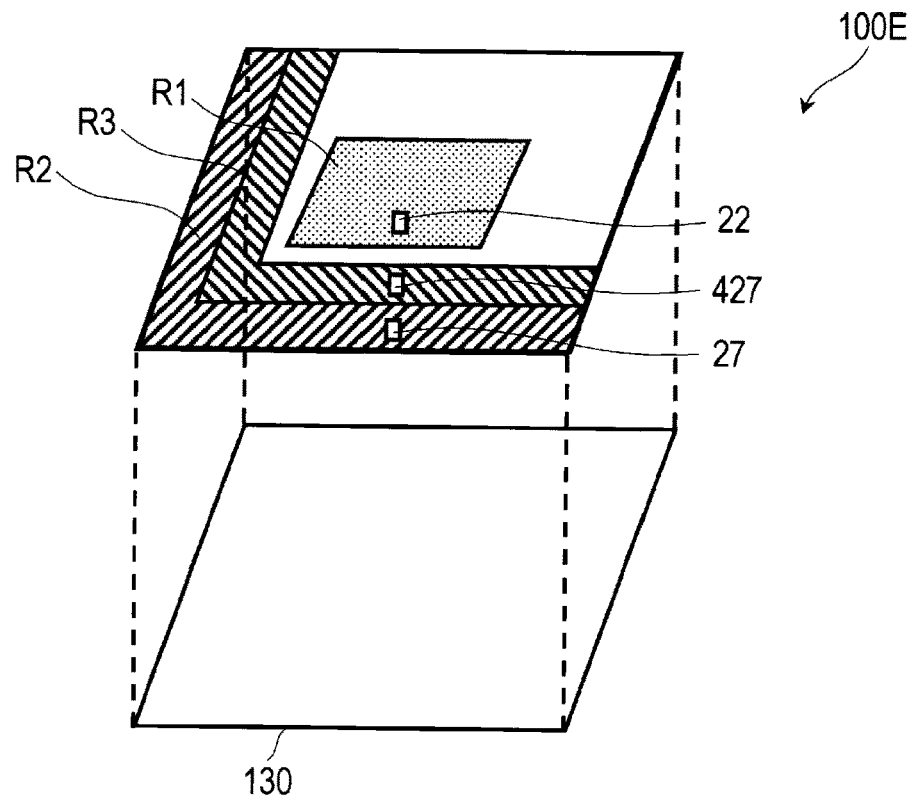
FIG. 30 is a schematic view showing shapes that a pixel region and peripheral regions of an imaging device may take.

In the example shown in FIG. 30, the second peripheral region R3 exhibits an L-shape outside the pixel region R1 in plan view. The first peripheral region R2 exhibits an L-shape outside the second peripheral region R3 in plan view.

Figure 31:
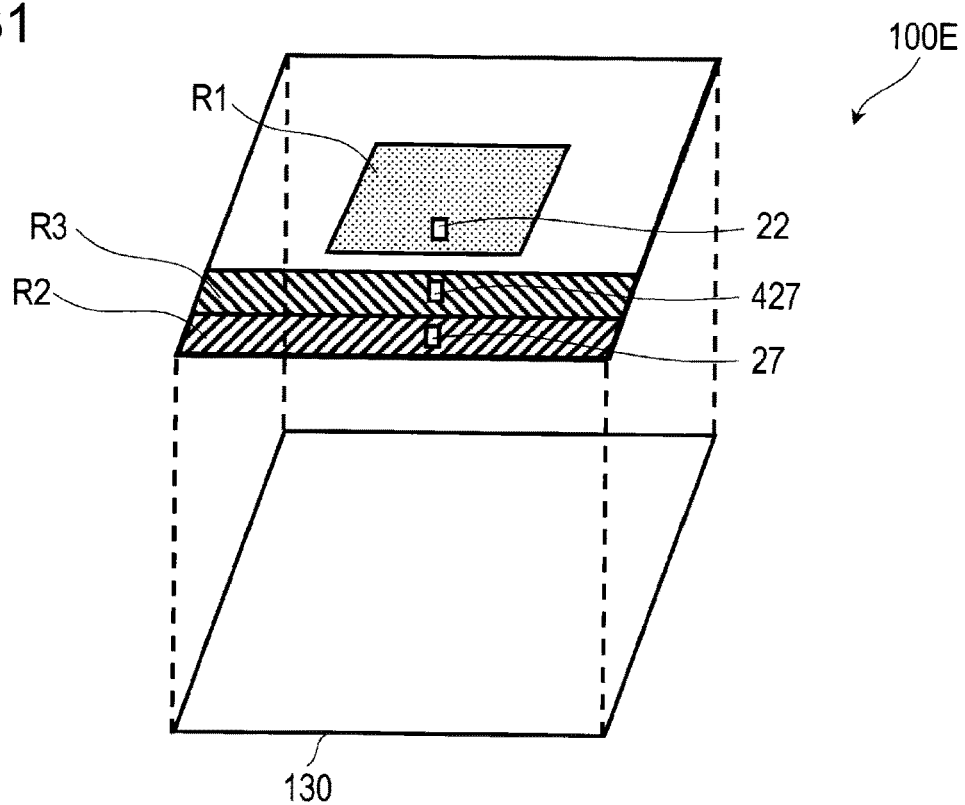
FIG. 31 is a schematic view showing shapes that a pixel region and peripheral regions of an imaging device may take.

In the example shown in FIG. 31, the second peripheral region R3 extends straight outside the pixel region R1 in plan view. The first peripheral region R2 extends straight outside the second peripheral region R3 in plan view.

The shapes of the pixel region R1, the first peripheral region R2, and the second peripheral region R3 shown in FIGS. 28 to 31 are also applicable to the imaging devices 100C and 100D shown in FIGS. 25 and 26. Further, these shapes are also applicable to the imaging devices 100A and 100B shown in FIGS. 1 to 24.

The foregoing description has taken, as an example, an imaging device including a single semiconductor substrate. Note, however, that the foregoing description is also applicable to a so-called chip stack imaging device. The chip stack imaging device may also be referred to as "stacked chip imaging device".

Figure 32:
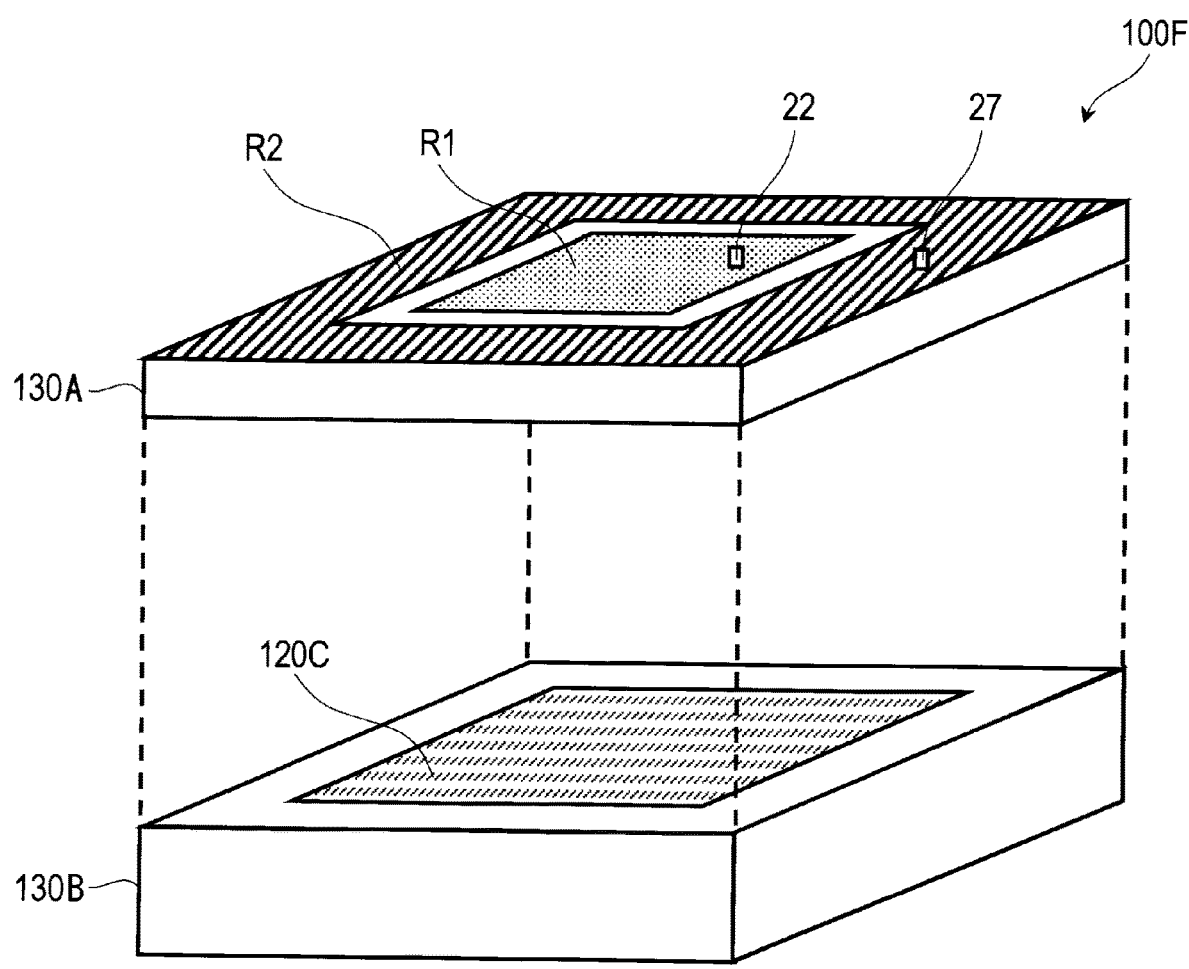
FIG. 32 is a schematic view of a chip stack imaging device.

FIG. 32 is a schematic view of a chip stack imaging device 100F according to one example.

In the imaging device 100F shown in FIG. 32, a first semiconductor substrate 130A and a second semiconductor substrate 130B are stacked on top of each other. The first semiconductor substrate 130A is provided with a pixel region R1 and a first peripheral region R2. The second semiconductor substrate 130B is provided with a peripheral circuit 120C. The peripheral circuit 120C may include some or all of circuits that are equivalent to the peripheral circuit 120A or the peripheral circuit 120B.

Although not illustrated, at least one of a TSV connection and a Cu—Cu connection may be utilized as an electrical connection between a device provided in the first semiconductor substrate 130A and a device provided in the second semiconductor substrate 130B.

The pixel region R1 has an amplifying transistor 22. The first peripheral region R2 has a first peripheral transistor 27.

In one example, in the imaging device 100F, the first peripheral transistor 27 is a load transistor. The pixel region R1 is connected to the load transistor via a vertical signal line 35. Specifically, the amplifying transistor 22 is connected to the load transistor via the vertical signal line 35.

In one specific example, the aforementioned load transistor functions as a constant current source. A constant current determined by the load transistor flows through the amplifying transistor 22, the vertical signal line 35, and the load transistor in this order. The amplifying transistor 22 and the load transistor form a source follower. For this reason, a voltage corresponding to the gate voltage of the amplifying transistor 22, i.e. the voltage of a charge accumulation region Z, appears in the vertical signal line 35. This state continues as long as the address transistor 24 is on. The load transistor may be included in the load circuit 45 shown in FIG. 2.

In the imaging device 100F, the first peripheral transistor 27 may be included in at least one of a comparator and a driver.

In the example shown in FIG. 32, the first peripheral transistor 27 may or may not be included in the peripheral circuit 120C. In the example shown in FIG. 32, a second peripheral region R3 may be provided outside the first peripheral region R2.

In each of the examples shown in FIGS. 25 to 32 too, the contribution of the specific species of the first specific layer to diffusion suppression makes it possible to reduce dark current in the pixel region R1 while reducing deterioration in performance of the first peripheral transistor 27 attributed to thermal processing.

In each of the examples shown in FIGS. 25 to 32, the pixel region R1, the first peripheral region R2, and the second peripheral region R3 may have the features described with reference to FIGS. 1 to 24. For example, the pixel region R1 may include an address transistor 24, a reset transistor 26, or other devices in addition to the amplifying transistor 22. The first peripheral region R2 may include a first peripheral transistor 727 in addition to the first peripheral transistor 27. The second peripheral region R3 may include a second peripheral transistor 827 in addition to the second peripheral transistor 427.

Various changes are applicable to the techniques disclosed here. For example, the pocket diffusion layer 707a and pocket diffusion layer 707b of the first peripheral transistor 727 and the pocket diffusion layer 807a and pocket diffusion layer 807b of the second peripheral transistor 827 may be omitted. Further, the blocking regions 200A and 200B may be omitted. Further, a silicide layer may be formed over the drain, source, and gate electrode of the first peripheral transistor 27.

In a first peripheral transistor, a specific species may be contained only in a pocket diffusion layer. In a case where an N-channel MIS transistor is fabricated as such a first peripheral transistor, a specific species is implanted only into a P-type pocket diffusion layer of the transistor. In that case, the concentration of the specific species that is implanted into the P-type pocket diffusion layer may be lower than the concentration of a specific species that is implanted into an extension diffusion layer in a case where the first peripheral transistor of FIG. 5 is fabricated.

Features connected with the second peripheral region R3 may be applied to the first peripheral region R2. For example, the features of the second peripheral transistors 427 and 827 may be applied to the first peripheral transistors 27 and 727.

Features connected with the first peripheral region R2 may be applied to the second peripheral region R3. For example, the features of the first peripheral transistors 27 and 727 may be applied to the second peripheral transistors 427 and 827.

An imaging device disclosed here is useful, for example, in an image sensor, a digital camera, or other devices. The imaging device disclosed here can be used, for example, in a camera for medical use, a camera for use in a robot, a security camera, a car-mounted camera, or other cameras.

What is claimed is:

1. An imaging device comprising:
   a pixel region including an amplifying transistor that includes a first gate and that outputs a signal voltage corresponding to an amount of signal charge;
   a first peripheral region including at least one first peripheral transistor including a second gate, the first peripheral region being located outside the pixel region; and
   a semiconductor substrate provided with the amplifying transistor and the at least one first peripheral transistor, wherein
   a gate length of the second gate of the at least one first peripheral transistor is shorter than a gate length of the first gate of the amplifying transistor, and
   when at least one type of impurity that contributes to suppression of transient enhanced diffusion of a conductive impurity is defined as a first specific species, the at least one first peripheral transistor includes a first specific layer located in the semiconductor substrate, the first specific layer containing a conductive impurity and the first specific species.

2. The imaging device according to claim 1, wherein
   the amplifying transistor includes a first gate insulator film located between the semiconductor substrate and the first gate,
   the at least one first peripheral transistor includes a second gate insulator film located between the semiconductor substrate and the second gate, and
   the second gate insulator film is thinner than the first gate insulator film.

3. The imaging device according to claim 1, wherein the first specific species contains at least one selected from the group consisting of carbon, nitrogen, and fluorine.

4. The imaging device according to claim 1, wherein the first specific species contains at least one selected from the group consisting of germanium, silicon, and argon.

5. The imaging device according to claim 1, wherein
   the at least one first peripheral transistor includes a first source, a first drain, and a first extension diffusion layer,
   the first extension diffusion layer is adjacent to the first source or the first drain and shallower than the first source and the first drain, and
   the first extension diffusion layer includes the first specific layer.

6. The imaging device according to claim 1, wherein
   the at least one first peripheral transistor includes a first source, a first drain, and a first pocket diffusion layer that is adjacent to the first source or the first drain, and
   the first pocket diffusion layer includes the first specific layer.

7. The imaging device according to claim 1, wherein
   the pixel region includes a charge accumulation region in which charge generated by photoelectric conversion is accumulated, and a ratio of a concentration of the first specific species in the first specific layer to a concentration of the first specific species in the charge accumulation region is higher than or equal to $1\times10^5$.

8. The imaging device according to claim 1, wherein a ratio of a concentration of the first specific species in the first specific layer to a concentration of the first specific species under the first gate of the amplifying transistor is higher than or equal to $1\times10^5$.

9. The imaging device according to claim 1, wherein
the at least one first peripheral transistor includes an end-of-range defect,
at least part of the first specific layer is located above the end-of-range defect and overlaps the end-of-range defect in plan view.

10. The imaging device according to claim 1, wherein
the at least one first peripheral transistor includes a segregated portion in which the first specific species is segregated in a direction parallel with a depth of the semiconductor substrate, and
at least part of the first specific layer is located above the segregated portion and overlaps the segregated portion in plan view.

11. The imaging device according to claim 10, wherein
the pixel region includes a charge accumulation region in which charge generated by photoelectric conversion is accumulated, and
the segregated portion is shallower than the charge accumulation region.

12. The imaging device according to claim 1, wherein
the at least one first peripheral transistor comprises two first peripheral transistors,
the first peripheral region includes a shallow trench isolation structure,
the shallow trench isolation structure provides device isolation of the two first peripheral transistors from each other,
the shallow trench isolation structure has a trench, and
a range of distribution of the first specific species in the first specific layer of at least one of the two first peripheral transistors is shallower than a bottom of the trench.

13. The imaging device according to claim 1, further comprising:
an analog processing circuit;
a digital processing circuit; and
a second peripheral region located between the pixel region and the first peripheral region in plan view, wherein
the second peripheral region includes a second peripheral transistor including a third gate, the second peripheral transistor being included in the analog processing circuit,
the at least one first peripheral transistor is included in the digital processing circuit, and
a gate length of the third gate of the second peripheral transistor is longer than the gate length of the second gate of the at least one first peripheral transistor and shorter than the gate length of the first gate of the amplifying transistor.

14. The imaging device according to claim 13, wherein
the at least one first peripheral transistor includes a first source, a first drain, and a first extension diffusion layer,
the first extension diffusion layer is adjacent to the first source or the first drain and shallower than the first source and the first drain,
the second peripheral transistor includes a second source, a second drain, and a second extension diffusion layer,
the second extension diffusion layer is adjacent to the second source or the second drain and shallower than the second source and the second drain,
a concentration of a conductive impurity in the second extension diffusion layer is lower than a concentration of a conductive impurity in the first extension diffusion layer, and
the second extension diffusion layer is deeper than the first extension diffusion layer.

15. The imaging device according to claim 13, wherein
the second peripheral transistor includes a second specific layer located in the semiconductor substrate, the second specific layer containing a conductive impurity, and
a concentration of the first specific species in the first specific layer is higher than a concentration of the first specific species in the second specific layer.

16. The imaging device according to claim 13, wherein
the second peripheral transistor includes a second specific layer located in the semiconductor substrate, the second specific layer containing a conductive impurity, and
a concentration of carbon in the second specific layer is higher than a concentration of carbon under the first gate of the amplifying transistor.

17. The imaging device according to claim 13, wherein
the second peripheral transistor includes a third gate insulator film located between the semiconductor substrate and the third gate, and
the third gate insulator film is thicker than the second gate insulator film and thinner than the first gate insulator film.

18. The imaging device according to claim 13, wherein
an operating voltage of the at least one first peripheral transistor is lower than an operating voltage of the second peripheral transistor, and
a threshold voltage of the at least one first peripheral transistor is lower than a threshold voltage of the second peripheral transistor.

19. The imaging device according to claim 13, wherein
the second peripheral transistor includes a second specific layer located in the semiconductor substrate, the second specific layer containing a conductive impurity,
the second specific layer contains a second specific species that is at least one type of impurity that contributes suppression of transient enhanced diffusion of the conductive impurity, and
the second specific species is different from the first specific species.

20. The imaging device according to claim 1, wherein
the at least one first peripheral transistor includes a second specific layer located in the semiconductor substrate,
the second specific layer contains a second specific species that is at least one type of impurity that contributes suppression of transient enhanced diffusion of the conductive impurity,
the second specific species is different from the first specific species, and
a peak depth of the first specific species contained in the first specific layer is different from a peak depth of the second specific species contained in the second specific layer.

* * * * *